(12) United States Patent
Bok et al.

(10) Patent No.: US 11,594,581 B2
(45) Date of Patent: Feb. 28, 2023

(54) ORGANIC LIGHT EMITTING DISPLAY DEVICE

(71) Applicant: Samsung Display Co., Ltd., Yongin-Si (KR)

(72) Inventors: Seung-Lyong Bok, Hwaseong-si (KR); Yong-Han Park, Hwaseong-si (KR); Cheol-Yun Jeong, Seongnam-si (KR)

(73) Assignee: Samsung Display Co., Ltd.

( * ) Notice: Subject to any disclaimer, the term of this patent is extended or adjusted under 35 U.S.C. 154(b) by 71 days.

(21) Appl. No.: 17/203,841

(22) Filed: Mar. 17, 2021

(65) Prior Publication Data

US 2021/0202593 A1  Jul. 1, 2021

Related U.S. Application Data

(63) Continuation of application No. 16/577,891, filed on Sep. 20, 2019, now Pat. No. 10,985,223, which is a continuation of application No. 15/392,305, filed on Dec. 28, 2016, now Pat. No. 10,439,009.

(30) Foreign Application Priority Data

Jan. 26, 2016 (KR) .................. 10-2016-0009442

(51) Int. Cl.
| | |
|---|---|
| *H01L 27/32* | (2006.01) |
| *G06F 3/044* | (2006.01) |
| *G06F 3/041* | (2006.01) |
| *H01L 51/52* | (2006.01) |

(52) U.S. Cl.
CPC .......... *H01L 27/323* (2013.01); *G06F 3/0412* (2013.01); *G06F 3/0443* (2019.05); *G06F 3/04164* (2019.05); *H01L 27/3246* (2013.01); *H01L 27/3262* (2013.01); *H01L 27/3276* (2013.01); *H01L 51/5206* (2013.01); *H01L 51/5221* (2013.01); *G06F 2203/04111* (2013.01)

(58) Field of Classification Search
None
See application file for complete search history.

(56) References Cited

U.S. PATENT DOCUMENTS

| | | | |
|---|---|---|---|
| 8,530,910 B2 | 9/2013 | Song et al. | |
| 8,558,222 B2 | 10/2013 | Hwang et al. | |
| 8,598,582 B2 | 12/2013 | Choi et al. | |
| 8,659,218 B2 | 2/2014 | Hwang et al. | |
| 8,952,998 B2 | 2/2015 | Gu et al. | |
| 9,046,952 B2 | 6/2015 | Kim et al. | |
| 9,093,669 B2 | 7/2015 | Park et al. | |
| 9,095,017 B2 | 7/2015 | Yi et al. | |
| 9,231,030 B2 | 1/2016 | Choi et al. | |
| 9,276,047 B2 | 3/2016 | Ko et al. | |
| 9,400,576 B2 | 7/2016 | Chen et al. | |

(Continued)

FOREIGN PATENT DOCUMENTS

| | | |
|---|---|---|
| EP | 2704196 A1 | 3/2014 |
| JP | 2014-197537 A | 10/2014 |

(Continued)

*Primary Examiner* — Telly D Green
(74) *Attorney, Agent, or Firm* — Innovation Counsel LLP

(57) ABSTRACT

An organic light emitting display device includes a substrate, a pixel structure, and a touch sensor electrode. The substrate includes a sub-pixel region and a transparent region. The pixel structure is disposed in the sub-pixel region on the substrate. The touch sensor electrode is disposed in the transparent region on the substrate.

30 Claims, 36 Drawing Sheets

(56) References Cited

U.S. PATENT DOCUMENTS

| | | |
|---|---|---|
| 9,419,243 B2 | 8/2016 | Park et al. |
| 9,466,658 B2 | 10/2016 | Chung et al. |
| 9,553,280 B2 | 1/2017 | Seo et al. |
| 9,582,124 B2 | 2/2017 | Han |
| 9,661,114 B2 | 5/2017 | Jeong et al. |
| 9,966,424 B2 | 5/2018 | Kang et al. |
| 2014/0061597 A1 | 3/2014 | Choi et al. |
| 2014/0152912 A1 | 6/2014 | Lee et al. |
| 2014/0210784 A1 | 7/2014 | Gourevitch et al. |
| 2015/0185960 A1 | 7/2015 | Kim |
| 2015/0205440 A1 | 7/2015 | Yang et al. |
| 2015/0325810 A1 | 11/2015 | Iwase |
| 2015/0357383 A1 | 12/2015 | Chung et al. |
| 2016/0306468 A1 | 10/2016 | Chen et al. |
| 2017/0062535 A1 | 3/2017 | Kim et al. |
| 2017/0147850 A1 | 5/2017 | Liu et al. |
| 2017/0207288 A1 | 7/2017 | Kang et al. |
| 2017/0300153 A1 | 10/2017 | Li et al. |

FOREIGN PATENT DOCUMENTS

| | | |
|---|---|---|
| KR | 10-2011-0071446 A | 6/2011 |
| KR | 10-2013-0016546 A | 2/2013 |
| KR | 10-2013-0072635 A | 7/2013 |
| KR | 10-2013-0093328 A | 8/2013 |
| KR | 10-2014-0025251 A | 3/2014 |
| KR | 10-2014-0069711 A | 6/2014 |
| KR | 10-2014-0085979 A | 7/2014 |
| KR | 10-2014-0098438 A | 8/2014 |
| KR | 10-2014-0135565 A | 11/2014 |
| KR | 10-2015-0012513 A | 2/2015 |
| KR | 10-2015-0020446 A | 2/2015 |
| KR | 10-2015-0023728 A | 3/2015 |
| KR | 10-2015-0088101 A | 7/2015 |
| KR | 10-2015-0140498 A | 12/2015 |
| KR | 10-2015-0145417 A | 12/2015 |
| KR | 10-2016-0059064 A | 5/2016 |
| KR | 1020160099979 A | 8/2016 |
| WO | 2013-012667 A1 | 1/2013 |
| WO | 2014-153829 A1 | 10/2014 |

FIG. 14
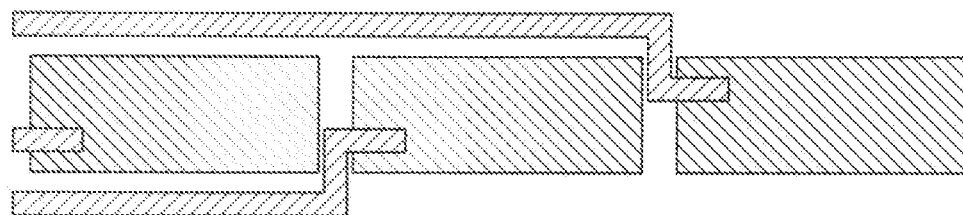
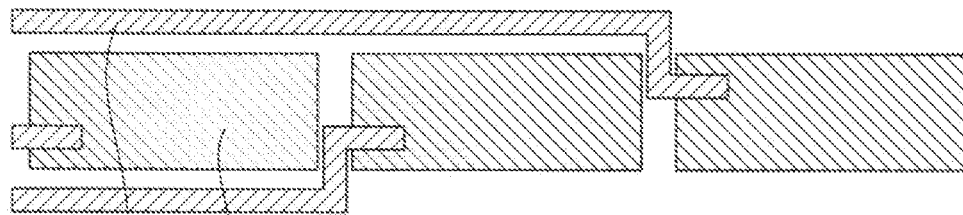
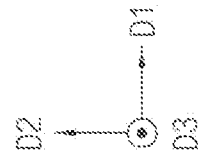

FIG. 22
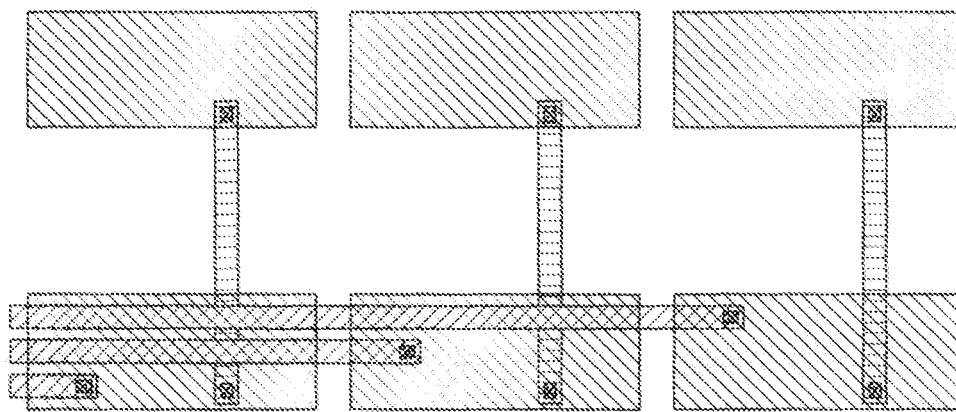
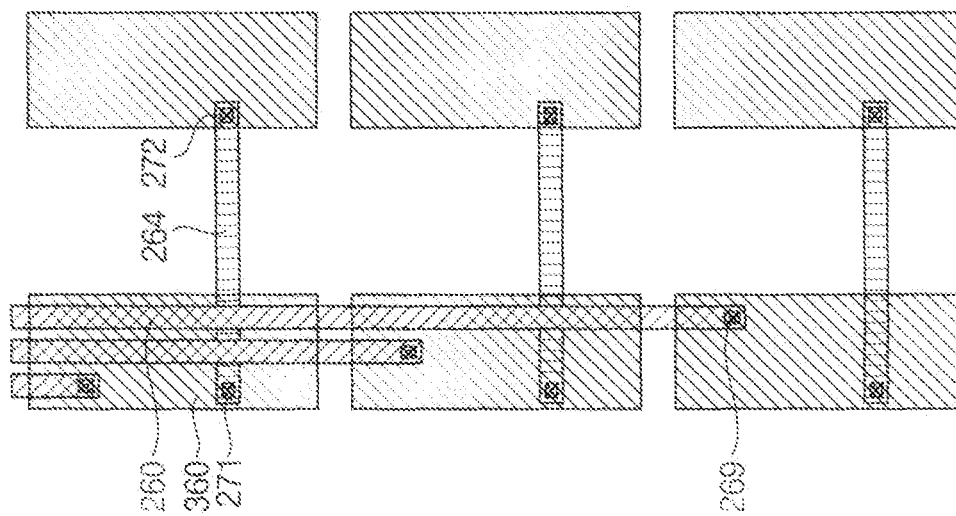
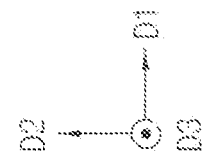

FIG. 32
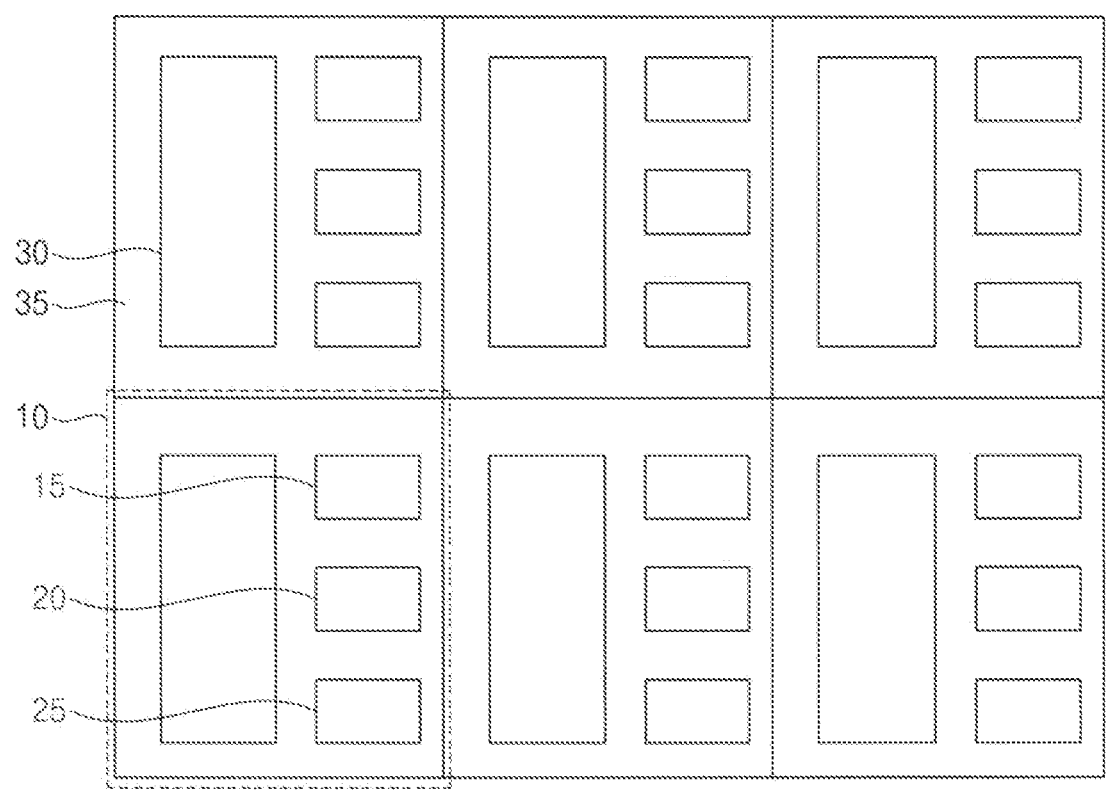
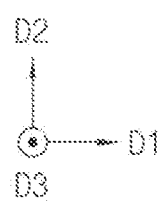

ORGANIC LIGHT EMITTING DISPLAY DEVICE

CROSS-REFERENCE TO RELATED APPLICATION(S)

This application is a continuation application of U.S. patent application Ser. No. 16/577,891 filed on Sep. 20, 2019, which is a continuation application of U.S. patent application Ser. No. 15/392,305 filed on Dec. 28, 2016 (now U.S. Pat. No. 10,439,009), which claims priority under 35 USC § 119 to Korean Patent Applications No. 10-2016-0009442, filed on Jan. 26, 2016 in the Korean Intellectual Property Office (KIPO), the disclosures of which are incorporated herein in their entirety by reference.

BACKGROUND

1. Field

Example embodiments relate generally to organic light emitting display devices. More particularly, embodiments of the present inventive concept relate to organic light emitting display devices including a transparent region.

2. Description of the Related Art

A flat panel display (FPD) device is widely used as a display device of an electronic device because the FPD device is lightweight and thin compared to a cathode-ray tube (CRT) display device. Typical examples of the FPD device are a liquid crystal display (LCD) device and an organic light emitting (OLED) display device. Compared to the LCD device, the OLED device has many advantages such as a higher luminance and a wider viewing angle. In addition, the OLED device can be made thinner because the OLED device does not require a backlight. In the OLED device, electrons and holes are injected into an organic thin layer through a cathode and an anode, and then recombined in the organic thin layer to generate excitons, thereby a light of a certain wavelength can be emitted.

Recently, a transparent OLED device capable of transmitting an image of an object (or a target) that is located in the rear (e.g., the back) of the OLED device by including a transparent region and a pixel region has been developed. Here, opaque metal wirings which reduce a transmissivity of the transparent OLED device may not be disposed in the transparent region of the transparent OLED device. In addition, a touch screen panel may be disposed on the transparent OLED device, and may be electrically connected to the transparent OLED device. The touch screen panel may include sensing electrodes to sense (or detect) a contact (e.g., a finger, a touch pen, etc.) of a user of the transparent OLED device. For example, the touch screen panel may sense a contact (or an input) of the user, and the method may use a self-capacitance, a mutual-capacitance, etc. for sensing the contact of the user. Here, the touch screen panel of the self-capacitance method may include a plurality of touch sensor electrodes and touch sensor wirings connected to the touch sensor electrodes respectively, and the touch screen panel may sense a change in capacitance which is generated in the touch sensor electrodes. Accordingly, when the user contacts the front of the touch screen panel, the transparent OLED device may sense the contact of the user. However, as the transparent OLED device includes the touch screen panel for sensing touch events, a thickness of the transparent OLED device may be increased.

SUMMARY

Some example embodiments provide an organic light emitting display device capable of sensing a contact of a user.

According to some aspect of example embodiments, an organic light emitting display (OLED) device includes a substrate, a pixel structure, and a touch sensor electrode. The substrate includes a sub-pixel region and a transparent region. The pixel structure is disposed in the sub-pixel region on the substrate. The touch sensor electrode is disposed in the transparent region on the substrate.

In example embodiments, the sub-pixel region and the transparent region do not overlap in a plan view.

In example embodiments, the OLED device may further include a touch sensor wiring on the touch sensor electrode, the touch sensor wiring electrically connecting the touch sensor electrode and an external device, transferring a changed capacitance of the touch sensor electrode to the external device and providing a sensing voltage generated from the external device to the touch sensor electrode.

In example embodiments, the substrate may include a plurality of pixel regions each having the sub-pixel regions and the transparent region. The external device senses a change in capacitance which is generated in the touch sensor electrodes that are disposed in the transparent regions.

In example embodiments, the pixel structure may include a lower electrode on the substrate, a light emitting layer on the lower electrode, and an upper electrode on the light emitting layer.

In example embodiments, the touch sensor electrode and the lower electrode may be simultaneously formed using the same materials, and may be located at the same level.

In example embodiments, the touch sensor electrode and the lower electrode may be simultaneously formed, and may be located at different levels from each other.

In example embodiments, when the lower electrode includes a plurality of electrode layers, the touch sensor electrode and at least one electrode layer among the plurality of electrode layers may have the same materials.

In example embodiments, a thickness of the touch sensor electrode may be less than a thickness of the lower electrode, and the touch sensor electrode may be substantially transparent.

In example embodiments, the touch sensor electrode and the upper electrode may be simultaneously formed using the same materials.

In example embodiments, the touch sensor electrode and the upper electrode may be spaced apart from each other in a boundary of the sub-pixel region and the transparent region.

In example embodiments, the touch sensor electrode and the upper electrode may be simultaneously formed using the same materials, and may be located at different levels from each other.

In example embodiments, the OLED device may further include a pixel defining layer. The pixel defining layer may be disposed on the substrate. The pixel defining layer may partially expose the lower electrode disposed in the sub-pixel region, and may partially exposing the touch sensor electrode disposed in the transparent region.

In example embodiments, the OLED device may further include a planarization layer. The planarization layer may be disposed between the pixel defining layer and the substrate. The planarization layer may have a contact hole disposed in the transparent region.

In example embodiments, the OLED device may further include a touch sensor wiring disposed on the touch sensor electrode. The touch sensor wiring may electrically connecting the touch sensor electrode and an external device via the contact hole of the planarization layer, transferring a changed capacitance of the touch sensor electrode to the external device and providing a sensing voltage generated from the external device to the touch sensor electrode.

In example embodiments, the OLED device may further include a semiconductor element. The semiconductor element may be disposed in the sub-pixel region on the substrate. The semiconductor element may include an active layer on the substrate, a gate electrode on the active layer, and source and drain electrodes on the gate electrode.

In example embodiments, the touch sensor wiring and the source and drain electrodes may be simultaneously formed using the same materials, and a thickness of the touch sensor wiring may be less than a thickness of the source and drain electrodes. The touch sensor wiring may be substantially transparent.

In example embodiments, the substrate may further include an opaque region between the sub-pixel region and the transparent region, and the pixel defining layer may be disposed in the opaque region.

In example embodiments, the OLED device may further include a planarization layer. The planarization layer may have a contact hole disposed in the opaque region.

In example embodiments, the touch sensor electrode may extend in the first direction on the planarization layer, and may overlap at least a portion of the opaque region.

In example embodiments, the OLED device may further include a touch sensor wiring. The touch sensor wiring may be disposed on the touch sensor electrode. The touch sensor wiring may electrically connect the touch sensor electrode and an external device via the contact hole of the planarization layer, and may transfer a changed capacitance of the touch sensor electrode to the external device. The touch sensor wiring may provide a sensing voltage generated from the external device to the touch sensor electrode.

In example embodiments, the OLED device may further include a semiconductor element in the sub-pixel region on the substrate. The semiconductor element may include an active layer on the substrate, a gate electrode on the active layer, and source and drain electrodes on the gate electrode.

In example embodiments, the touch sensor wiring and the source and drain electrodes may be simultaneously formed using the same materials.

In example embodiments, a thickness of the touch sensor wiring may be the same as a thickness of the source and drain electrodes.

In example embodiments, the pixel defining layer may be opaque.

In example embodiments, the OLED device may further include a light blocking member. The light blocking member may be disposed on the pixel defining layer, and may overlap the touch sensor wiring.

In example embodiments, the OLED device may further include a planarization layer and a pixel defining layer. The pixel defining layer may be disposed on the planarization layer, and may partially expose the lower electrode disposed in the sub-pixel region. The pixel defining layer may expose at least a portion of the planarization layer in the transparent region.

In example embodiments, the touch sensor electrode may be disposed on the planarization layer that is exposed in the transparent region, and the upper electrode may be disposed on the lower electrode. The touch sensor electrode and the upper electrode may be spaced apart from each other on the pixel defining layer.

In example embodiments, the OLED device may further include a touch sensor wiring and a light blocking member. The touch sensor wiring may be disposed on the pixel defining layer. The touch sensor wiring may electrically connect the touch sensor electrode and an external device, and may transfer a changed capacitance of the touch sensor electrode to the external device. The touch sensor wiring may provide a sensing voltage generated from the external device to the touch sensor electrode. The light blocking member may be disposed on the pixel defining layer, and may overlap the touch sensor wiring.

In example embodiments, the OLED device may further include a planarization layer and a pixel defining layer. The planarization layer may have a first contact hole. The pixel defining layer may be disposed on the planarization layer, and may partially expose the lower electrode disposed in the sub-pixel region. The pixel defining layer may expose at least a portion of the planarization layer in the transparent region, and may have a second contact hole exposing the first contact hole.

In example embodiments, the OLED device may further include a touch sensor wiring. The touch sensor wiring may be disposed under the pixel defining layer, and may electrically connect the touch sensor electrode perforating the first and second contact holes and an external device. The touch sensor wiring may transfer a changed capacitance of the touch sensor electrode to the external device, and may provide a sensing voltage generated from the external device to the touch sensor electrode. The pixel defining layer may be opaque.

In example embodiments, the OLED device may further include a pixel defining layer. The pixel defining layer may be disposed in the transparent region on the substrate, and may partially expose the lower electrode disposed in the sub-pixel region. The touch sensor electrode may be disposed in the transparent region on the pixel defining layer.

In example embodiments, the OLED device may further include a touch sensor wiring and a light blocking member. The touch sensor wiring may be disposed on the touch sensor electrode, and may electrically connect the touch sensor electrode and an external device. The touch sensor wiring may transfer a changed capacitance of the touch sensor electrode to the external device, and may provide a sensing voltage generated from the external device to the touch sensor electrode. The light blocking member may be disposed on the pixel defining layer, and may overlap the touch sensor wiring.

In example embodiments, the OLED device may further include a semiconductor element in the sub-pixel region on the substrate. The semiconductor element may include an active layer on the substrate, a gate electrode on the active layer, and source and drain electrodes on the gate electrode.

In example embodiments, the touch sensor electrode and the active layer may be simultaneously formed using the same materials.

In example embodiments, a thickness of the touch sensor electrode may be less than a thickness of the active layer, and the touch sensor wiring may be substantially transparent.

In example embodiments, the OLED device may further include a pixel defining layer. The pixel defining layer may be disposed on the substrate, and may partially expose the lower electrode disposed in the sub-pixel region. The pixel defining layer may partially expose the touch sensor electrode disposed in the transparent region.

In example embodiments, the OLED device may further include a touch sensor wiring. The touch sensor wiring may be disposed on the touch sensor electrode, and may electrically connect the touch sensor electrode and an external device. The touch sensor wiring may transfer a changed capacitance of the touch sensor electrode to the external device, and may provide a sensing voltage generated from the external device to the touch sensor electrode In example embodiments, the substrate may further include an opaque region between the sub-pixel region and the transparent region. The pixel defining layer may be disposed in the opaque region.

In example embodiments, the OLED device may further include a gate insulation layer and an insulating interlayer. The gate insulation layer may be disposed between the pixel defining layer and the substrate. The gate insulation layer may partially expose the touch sensor electrode in the transparent region, and may have a first contact hole located in the opaque region. The insulating interlayer may be disposed on the gate insulation layer. The insulating interlayer may cover the gate electrode, and may partially expose the touch sensor electrode in the transparent region. The insulating interlayer may have a second contact hole exposing the first contact hole.

In example embodiments, the touch sensor electrode may overlap at least a portion of the opaque region.

In example embodiments, the OLED device may further include a touch sensor wiring. The touch sensor wiring may be disposed on a portion under which the touch sensor electrode is disposed in the opaque region on the insulating interlayer, and may electrically connect the touch sensor electrode and an external device via the first and second contact holes. The touch sensor wiring may transfer a changed capacitance of the touch sensor electrode to the external device, and may provide a sensing voltage generated from the external device to the touch sensor electrode.

In example embodiments, the touch sensor wiring and the source and drain electrodes may be simultaneously formed using the same materials, and a thickness of the touch sensor wiring may be the same as a thickness of the source and drain electrodes.

In example embodiments, the pixel defining layer may be opaque.

In example embodiments, the OLED device may further include a light blocking member. The light blocking member may be disposed on the pixel defining layer, and may overlap the touch sensor wiring.

In example embodiments, the OLED device may further include at least one insulation layer on the substrate.

In example embodiments, the insulation layer may not be disposed on the substrate such that the insulation layer exposes the transparent region on the substrate, and the touch sensor electrode may be directly disposed on the substrate.

In example embodiments, the at least one insulation layer may be disposed in the transparent region on the substrate, and the touch sensor electrode may be disposed on the at least one insulation layer.

In example embodiments, the OLED device may further include a pixel defining layer. The pixel defining layer may be disposed on the substrate, and may partially expose the lower electrode disposed in the sub-pixel region. The pixel defining layer may partially expose the touch sensor electrode in the transparent region.

In example embodiments, the substrate may further include an opaque region between the sub-pixel region and the transparent region. The pixel defining layer may be disposed in the opaque region, and the touch sensor wiring may have a first thickness and a second thickness that is less than the first thickness. The touch sensor wiring having the second thickness may be in contact with the touch sensor electrode in the transparent region, and the touch sensor wiring having the first thickness may be disposed in the opaque region on the pixel defining layer.

According to some aspect of example embodiments, an organic light emitting display (OLED) device includes a substrate, a lower electrode, a light emitting layer, an upper electrode, a touch sensor electrode, and a touch sensor wiring. The substrate includes a plurality of pixel regions each having sub-pixel regions, a transparent region corresponding to the sub-pixel regions, and an opaque region surrounding the sub-pixel regions and the transparent region. The lower electrode may be disposed in the sub-pixel region on the substrate. The light emitting layer may be disposed on the lower electrode. The upper electrode may be disposed in the sub-pixel region on the light emitting layer. The touch sensor electrode may be disposed in the transparent region on the substrate and in a first portion of the opaque region, and may expose the sub pixel region and a second portion of the opaque region surrounding the sub-pixel region. The touch sensor electrode may be spaced apart from the upper electrode, and may surround the upper electrode. The touch sensor wiring may be disposed on the touch sensor electrode, and may electrically connect the touch sensor electrode and an external device. The touch sensor wiring may transfer a changed capacitance of the touch sensor electrode to the external device, and may provide a sensing voltage generated from the external device to the touch sensor electrode.

In example embodiments, the pixel regions may be arranged in a first direction and a second direction that is perpendicular to the first direction. Adjacent two pixel regions among the pixel regions may be defined as first and second pixel regions, respectively, and the touch sensor electrode may be integrally formed to expose the sub-pixel regions and the second portion of the opaque region included in the first and second pixel regions. The upper electrode may be disposed as an island shape in each of the sub-pixel regions included in the first and second pixel regions.

In example embodiments, the touch sensor electrode and the upper electrode may be simultaneously formed using the same materials.

In example embodiments, the touch sensor wiring may extend in the second direction on the touch sensor electrode that is integrally formed in the first and second pixel regions, and the touch sensor wiring extending in the second direction may have a planar shape of a bar.

In example embodiments, the OLED device may further include a planarization layer. The planarization layer may be disposed on the substrate, and may have a contact hole located in the transparent region. The touch sensor wiring may be electrically connected to the touch sensor electrode via the contact hole of the planarization layer, and may extend in the second direction under the touch sensor electrode which is integrally formed in the first and second pixel regions. The touch sensor wiring extending in the second direction may have a planar shape of a bar.

According to some aspect of example embodiments, an organic light emitting display (OLED) device may include a substrate including a sub-pixel region and a transparent region, a pixel structure disposed in the sub-pixel region on the substrate, and a touch sensor electrode disposed in the transparent region. The touch sensor electrode may not be disposed in the sub-pixel region.

As an OLED device according to example embodiments includes the touch sensor electrode that is operated in a sensing method using a self-capacitance in the transparent region, the OLED device may sense a contact of the user. Accordingly, a thickness of the OLED device may be relatively decreased. In addition, a manufacturing cost of the OLED device may be reduced because the touch sensor electrode is formed using the lower electrode or the upper electrode. In addition, as the touch sensor wiring is not disposed in the transparent region, a transmissivity of the OLED device may not be decreased. Further, as the touch sensor wiring and the source and drain electrodes are simultaneously formed, a wiring resistance of the touch sensor wiring may be reduced.

BRIEF DESCRIPTION OF THE DRAWINGS

Example embodiments can be understood in more detail from the following description taken in conjunction with the accompanying drawings, in which:

FIG. 14 is a planar view for describing a touch sensor electrode and a touch sensor wiring included in the OLED device of FIG. 13;

FIG. 22 is a planar view for describing a touch sensor electrode, a touch sensor wiring, and a connection wiring included in the OLED device of FIG. 21;

FIG. 32 is a planar view for describing a pixel region included in the OLED device of FIG. 30;

DETAILED DESCRIPTION

Hereinafter, embodiments of the present inventive concept will be explained in detail with reference to the accompanying drawings.

Figure 1:
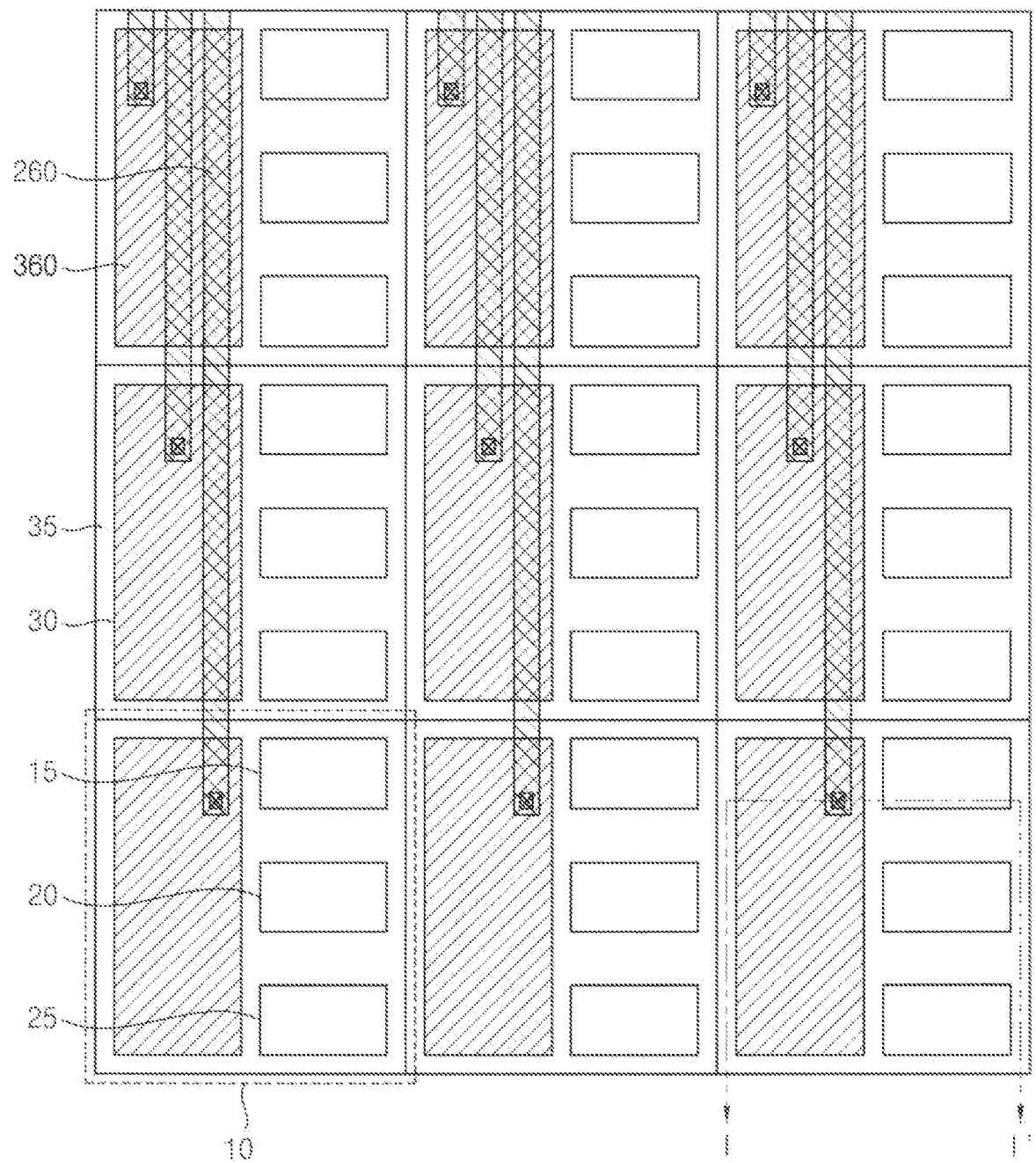
FIG. 1 is a planar view illustrating an organic light emitting display (OLED) device in accordance with example embodiments.
Figure 2:
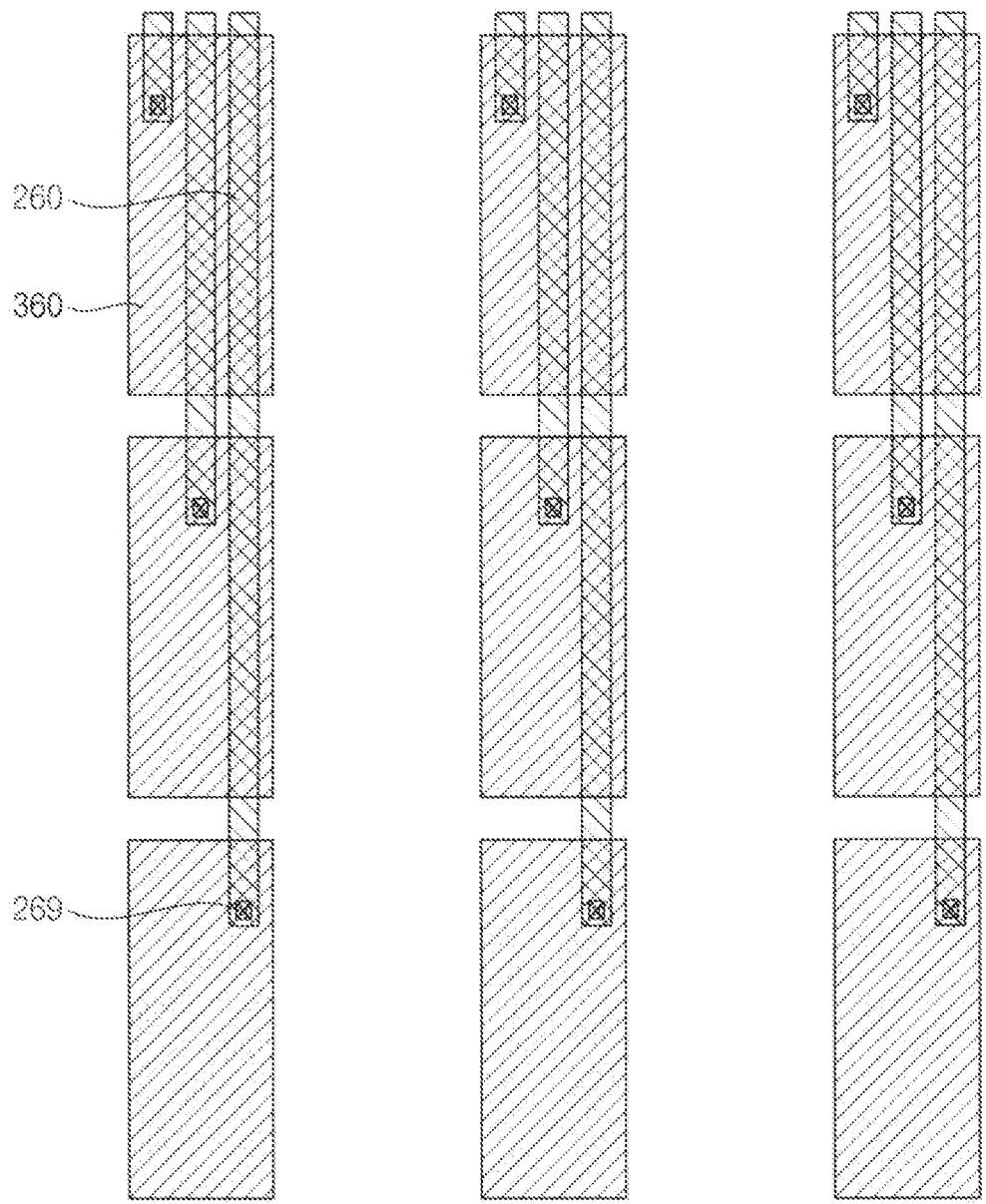
FIG. 2 is a planar view for describing a touch sensor electrode and a touch sensor wiring included in the OLED device of FIG. 1.
Figure 3:
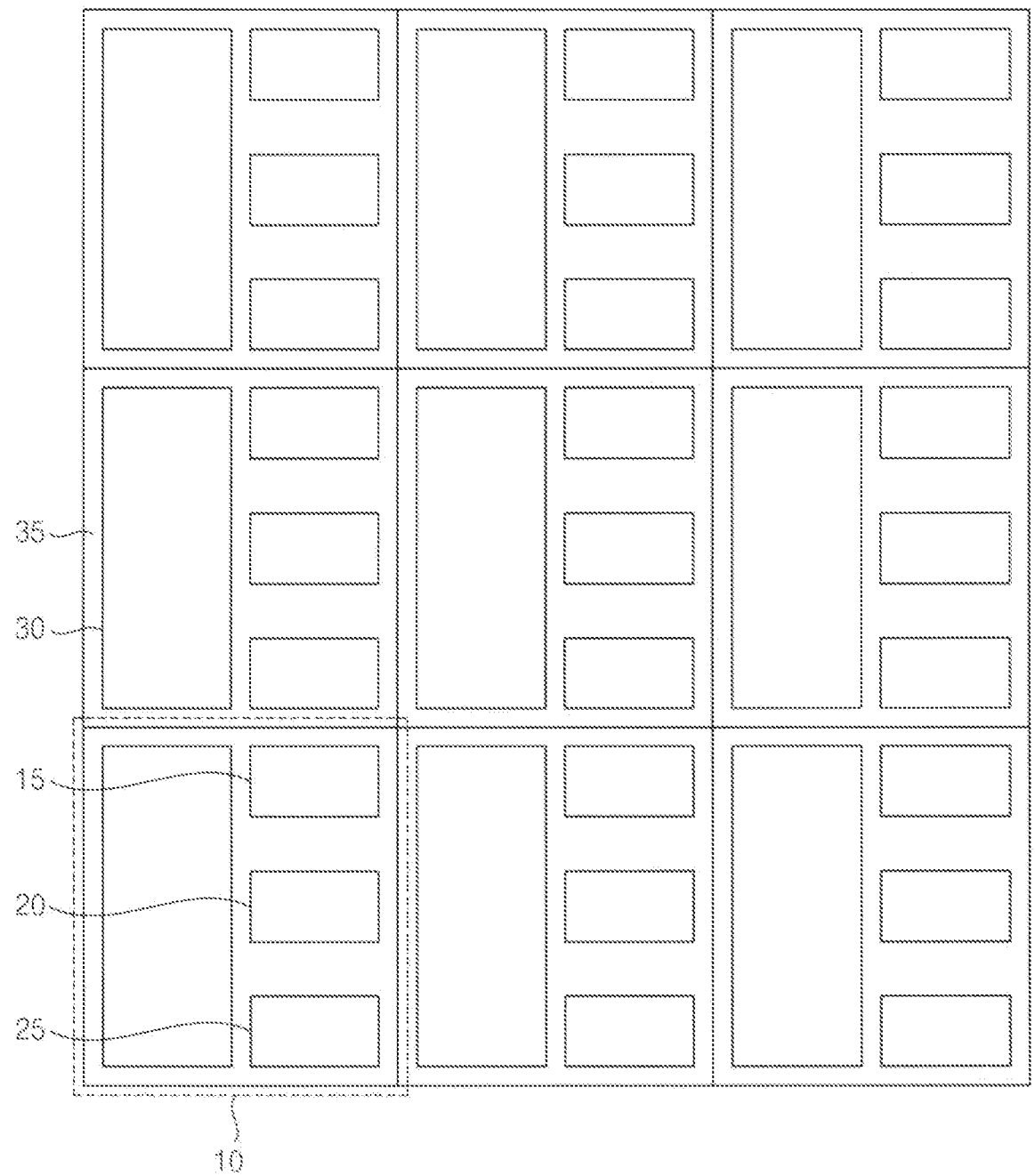
FIG. 3 is a planar view for describing a pixel region included in the OLED device of FIG. 1.

FIG. 1 is a planar view illustrating an organic light emitting display (OLED) device in accordance with example embodiments, and FIG. 2 is a planar view for describing a touch sensor electrode and a touch sensor wiring included in the OLED device of FIG. 1. FIG. 3 is a planar view for describing a pixel region included in the OLED device of FIG. 1.

Referring to FIGS. 1, 2, and 3, an organic light emitting display (OLED) device 100 may include a plurality of pixel regions. One pixel region 10 among a plurality of pixel regions may include first, second, and third sub-pixel regions 15, 20, and 25, a transparent region 30, and an opaque region 35. For example, the pixel regions 10 may be arranged in first and second directions D1 and D2 on the entire substrate, which will be described below, included in the OLED device 100. Here, the first direction D1 (e.g., a direction from the transparent region 30 to the sub-pixel region 15) may be parallel to an upper surface of the substrate, and the second direction D2 may be perpendicular to the first direction D1.

First, second, and third sub-pixels may be disposed in the first, second, and third sub-pixel region 15, 20, and 25, respectively. For example, the first sub-pixel may emit a red color of light, and the second sub-pixel may emit a green color of light. In addition, the third sub-pixel may emit a blue color of light. The first through third sub-pixels may be substantially disposed at the same level.

In the transparent region 30, a light incident from the outside may be transmitted. In example embodiments, a touch sensor electrode 360 may be disposed in the transparent region 30. As the touch sensor electrodes 360 are disposed in the respective transparent regions 30, the OLED device 100 may sense (or detect) a contact (or an input) position of a user in the front of the OLED device 100.

In the opaque region 35, a pixel defining layer, which will be described below, included in the OLED device 100 may be disposed. For example, each of the first, second, and third sub-pixel region 15, 20, and 25 and the transparent region 30 may be substantially surrounded by the pixel defining layer. That is, the first, second, and third sub-pixel regions 15, 20, and 25 and the transparent region 30 may be defined by the pixel defining layer, and the pixel defining layer may expose the first, second, and third sub-pixel region 15, 20, and 25 and the transparent region 30. The pixel defining layer may extend in the first and second directions D1 and D2 to surround the first, second, and third sub-pixel region 15, 20, and 25 and the transparent region 30. In other word, the pixel defining layer may be disposed in a portion except the first, second, and third sub-pixel region 15, 20, and 25 and the transparent region 30. The metal wirings (e.g., data signal wirings, scan signal wirings, light emission signal wiring, power supply voltage wirings, etc.) may be disposed in the opaque region 35.

In example embodiments, the transparent region 30 is exposed by the pixel defining layer, but not being limited thereto. In some example embodiments, the pixel defining layer may be disposed in the opaque region 35 and the transparent region 30. For example, the transparent region 30 may define a region that i) a light incident from the outside is transmitted, and ii) the first, second, and third sub-pixels are not disposed.

In example embodiments, a touch sensor wiring 260 may be disposed in the transparent region 30 and the opaque region 35 on the substrate. For example, the touch sensor wiring 260 may be disposed in the pixel regions 10 that are arranged in the second direction D2 among a plurality of the pixel regions 10. In other word, the touch sensor wiring 260 may extend in the second direction D2 on the substrate, and may be electrically connected to the touch sensor electrode 360 disposed in the pixel regions 10 that are arranged in the second direction D2 among a plurality of the pixel regions 10. For example, the touch sensor wiring 260 may be disposed under the touch sensor electrode 360, and the touch sensor electrode 360 may be in contact with the touch sensor wiring 260 by a contact hole. Each of the touch sensor electrode 360 disposed in the transparent region 30 included in the pixel regions 10 may be electrically connected to the touch sensor wiring 260. Here, the touch sensor wiring 260 and the touch sensor electrode 360 may be substantially transparent, and a transmissivity of the transparent region 30 included in the OLED device 100 may not be significantly decreased. That is, although the touch sensor wiring 260 and the touch sensor electrode 360 are disposed in the transparent region 30, an image of an object that is located in the rear (or the back) of the OLED device 100 may be transmitted. Accordingly, the OLED device 100 may serve as a transparent OLED device.

In example embodiments, one pixel region 10 of the OLED device 100 includes the first through third sub-pixel regions 15, 20, and 25 and one transparent region 30, but not being limited thereto. In some example embodiments, for example, a plurality of pixel regions 10 may be corresponding to one transparent region 30.

Figure 4:
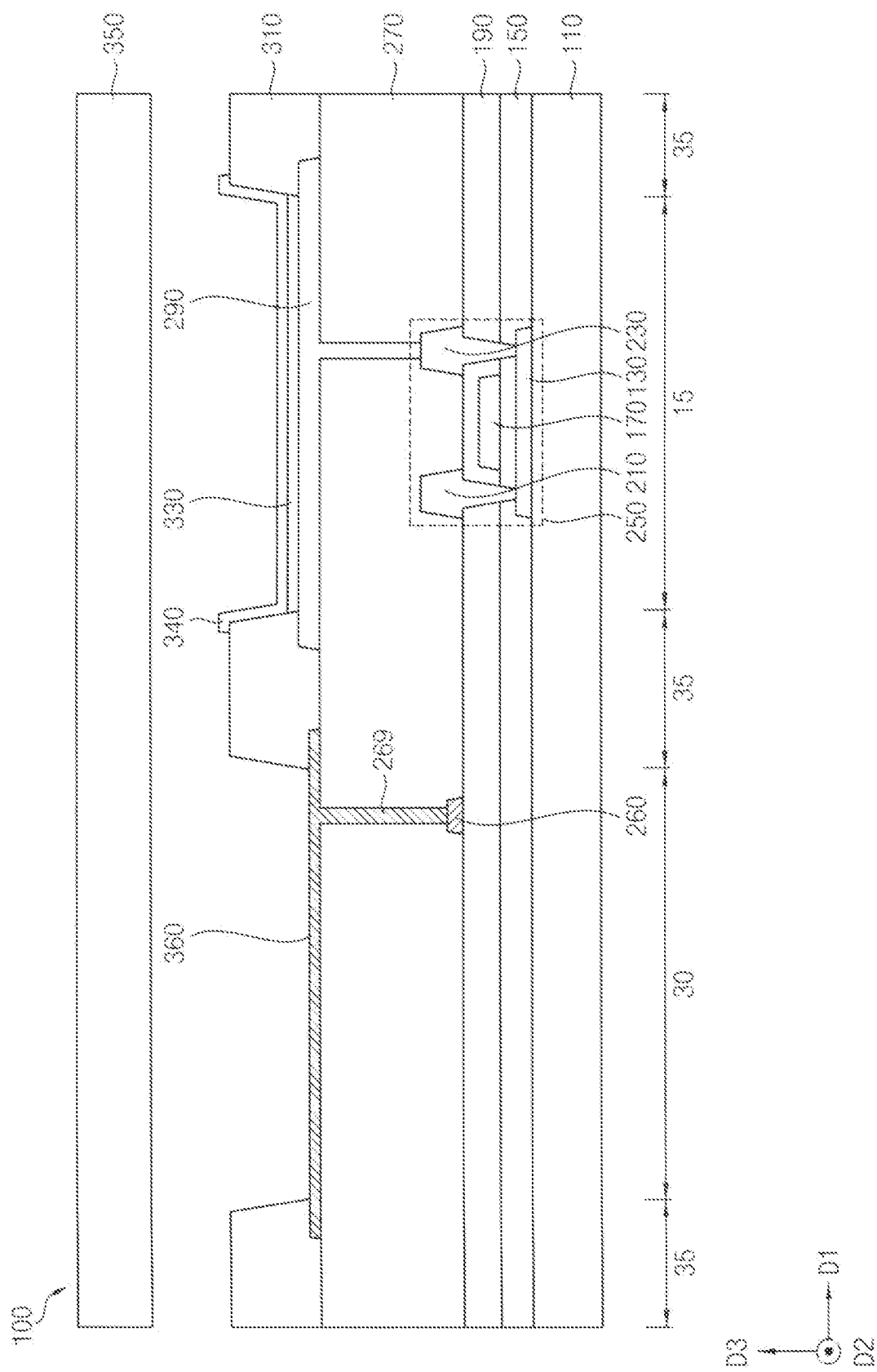
FIG. 4 is a cross-sectional view taken along a line I-I' of FIG. 1.
Figure 5:
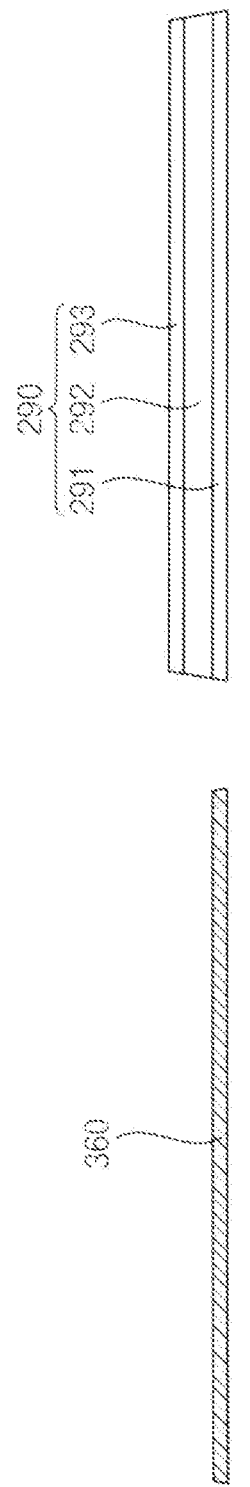
FIG. 5 is a cross-sectional view for describing a touch sensor electrode included in the OLED device of FIG. 4.
Figure 6:
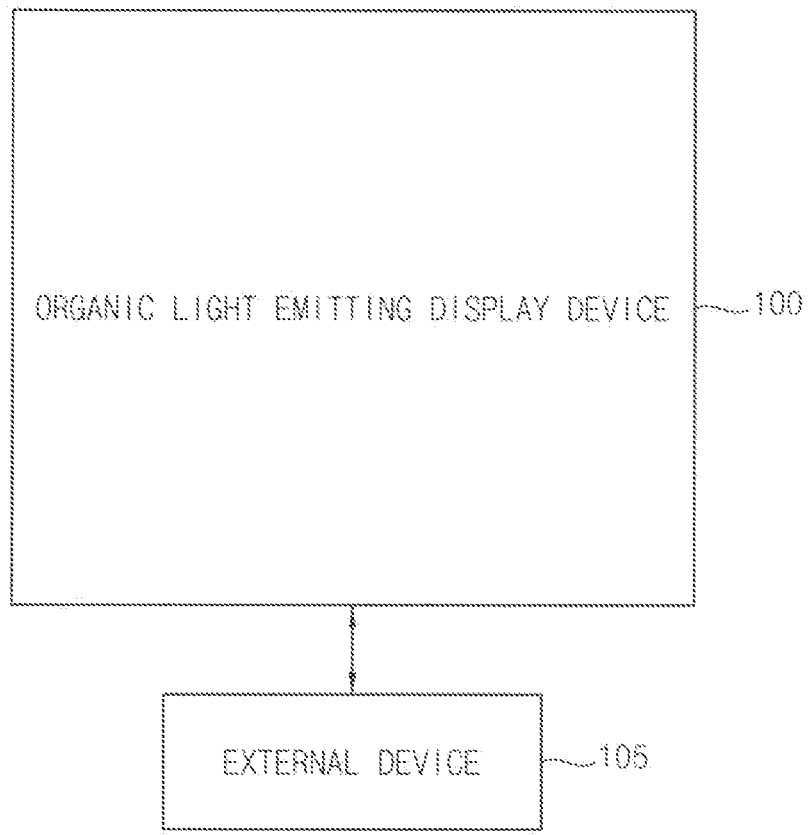
FIG. 6 is a block diagram for describing an external device electrically connected to a touch sensor electrode included in the OLED device of FIG. 4.

FIG. 4 is a cross-sectional view taken along a line I-I' of FIG. 1, and FIG. 5 is a cross-sectional for describing a touch sensor electrode included in the OLED device of FIG. 4. FIG. 6 is a block diagram for describing an external device electrically connected to a touch sensor electrode included in the OLED device of FIG. 4.

Referring to FIGS. 1, 2, 3, 4, 5, and 6, an OLED device 100 may include a substrate 110, a gate insulation layer 150, an insulating interlayer 190, a planarization layer 270, a semiconductor element 250, a touch sensor wiring 260, a pixel structure, a touch sensor electrode 360, a pixel defining layer 310, an encapsulation substrate 350, etc. Here, the pixel structure may include a lower electrode 290, a light emitting layer 330, and an upper electrode 340, and the semiconductor element 250 may include an active layer 130, a gate electrode 170, a source electrode 210, and a drain electrode 230.

As described above, the OLED device 100 may include a plurality of pixel regions. One pixel region among a plurality of the pixel regions may have a sub-pixel region 15, a transparent region 30, and an opaque region 35. The semiconductor element 250, the lower electrode 290, the light emitting layer 330, the upper electrode 340 may be disposed in the sub-pixel region 15. The pixel defining layer 310 may be disposed in the opaque region 35. In example embodiments, the touch sensor electrode 360 and the touch sensor wiring 260 may be disposed in the transparent region 30. The touch sensor wiring 260 may be electrically connected to touch sensor electrode 360.

The semiconductor element 250, the pixel structure, the touch sensor wiring 260, and the touch sensor electrode 360 may be disposed on the substrate 110.

The substrate 110 may be formed of transparent materials. For example, the substrate 110 may include a quartz substrate, a synthetic quartz substrate, a calcium fluoride substrate, a fluoride-doped quartz substrate, a sodalime glass substrate, a non-alkali glass substrate etc. Alternatively, the substrate 110 may be formed of a flexible transparent material such as a flexible transparent resin substrate (e.g., a polyimide substrate). For example, the polyimide substrate may include a first polyimide layer, a barrier film layer, a second polyimide layer, etc. Since the polyimide substrate is relatively thin and flexible, the polyimide substrate may be disposed on a rigid glass substrate to help support the formation of the semiconductor element 250 and the pixel structure. That is, the substrate 110 may have a structure in which the first polyimide layer, the barrier film layer and the second polyimide layer are stacked on the rigid glass substrate. In a manufacturing the OLED device 100, after an insulating layer (e.g., a buffer layer) is provided on the second polyimide layer of the polyimide substrate, the semiconductor element 250 and the pixel structure may be disposed on the insulating layer. After the semiconductor element 250 and the pixel structure are formed on the insulating layer, the rigid glass substrate under which the polyimide substrate is disposed may be removed. It may be difficult to directly form the semiconductor element 250 and the pixel structure on the polyimide substrate because the polyimide substrate is relatively thin and flexible. Accordingly, the semiconductor element 250 and the pixel structure are formed on the polyimide substrate and the rigid glass substrate, and then the polyimide substrate may serve as the substrate 110 of the OLED device 100 after the removal of the rigid glass substrate. As the OLED device 100 includes the sub-pixel region 15, the transparent region 30, and the opaque region 35, the substrate 110 may also include the sub-pixel region 15, the transparent region 30, and the opaque region 35.

A buffer layer (not shown) may be disposed on the substrate 110. The buffer layer may be disposed on the entire substrate 110. The buffer layer may prevent the diffusion of metal atoms and/or impurities from the substrate 110 into the semiconductor element 250. Additionally, the buffer layer may control a rate of a heat transfer in a crystallization process for forming the active layer 130, thereby obtaining a substantially uniform active layer. Furthermore, the buffer layer may improve a surface flatness of the substrate 110 when a surface of the substrate 110 is relatively uneven. According to a type of the substrate 110, at least two buffer layers may be provided on the substrate 110, or the buffer layer may not be disposed. For example, the buffer layer may include organic materials or inorganic materials.

The semiconductor element 250 may be formed of the active layer 130, the gate electrode 170, the source electrode 210, and the drain electrode 230. For example, the active layer 130 may be disposed in the sub-pixel region 15 on the substrate 110, and may be formed of an oxide semiconductor, an inorganic semiconductor (e.g., amorphous silicon, polysilicon, etc.), an organic semiconductor, etc.

The gate insulation layer 150 may be disposed on the active layer 130. The gate insulation layer 150 may cover the active layer 130 in the sub-pixel region 15, and may extend in a first direction D1 on the substrate 110. That is, the gate insulation layer 150 may be disposed on the entire substrate 110.

In example embodiments, the gate insulation layer 150 may sufficiently cover the active layer 130, and may have a substantially even surface without a step around the active layer 130. Alternatively, the gate insulation layer 150 may cover the active layer 130, and may be disposed as a substantially uniform thickness along a profile of the active layer 130. The gate insulation layer 150 may be formed of a silicon compound, a metal oxide, etc. For example, the gate insulation layer 150 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc.

The gate electrode 170 may be disposed on the gate insulation layer 150. The gate electrode 170 may be located on a portion of the gate insulation layer 150 under which the active layer 130 is disposed to overlap the active layer 130 in a planar view. The gate electrode 170 may include a metal, a metal alloy, metal nitride, conductive metal oxide, transparent conductive materials, etc.

The insulating interlayer 190 may be disposed on the gate electrode 170. The insulating interlayer 190 may cover the gate electrode 170 in the sub-pixel region 15. That is, the insulating interlayer 190 may be disposed on the entire gate insulation layer 150. In example embodiments, the insulating interlayer 190 may sufficiently cover the gate electrode 170, and may have a substantially even surface without a step around the gate electrode 170. Alternatively, the insulating interlayer 190 may cover the gate electrode 170, and may be disposed as a substantially uniform thickness along a profile of the gate electrode 170. The insulating interlayer 190 may include a silicon compound, a metal oxide, etc.

The source electrode 210, the drain electrode 230, and the touch sensor wiring 260 may be disposed on the insulating interlayer 190. The source electrode 210 may be in contact with a first side of the active layer 130 via a contact hole formed by removing a portion of the gate insulation layer 150 and the insulating interlayer 190. The drain electrode 230 may be in contact with a second side of the active layer 130 via a contact hole formed by removing a portion of the gate insulation layer 150 and the insulating interlayer 190. Accordingly, the semiconductor element 250 including the active layer 130, the gate electrode 170, the source electrode 210, and the drain electrode 230 may be formed.

The touch sensor wiring 260 may be disposed in the transparent region 30 on the insulating interlayer 190. For example, the touch sensor wiring 260 may be disposed under the touch sensor electrode 360. As illustrated in FIG. 6, the touch sensor wiring 260 included in the OLED device 100 may be electrically connected to the touch sensor electrode 360 and an external device 105. In addition, the touch sensor wiring 260 may transfer a changed capacitance of the touch sensor electrode 360 to the external device 105, and may provide a sensing voltage generated from the external device 105 to the touch sensor electrode 360. For example, when a user of the OLED device 100 contacts an upper surface of the encapsulation substrate 350 (e.g., a contact of a finger of the user, a portion of a body, a touch pen, etc.), a capacitance of the touch sensor electrode 360 corresponding to (or adjacent to) the contact surface may be changed. In other word, a changed capacitance may be generated between a portion of the body that is contacted to the upper surface of the encapsulation substrate 350 and the touch sensor electrode 360, and the external device 105 electrically connected to the touch sensor wiring 260 may sense (or detect) the changed capacitance. After a contact of the user and the OLED device 100 is ended (e.g., the user and the OLED device 100 are electrically separated.), the external device 105 may provide the sensing voltage to the touch sensor electrode 360. Accordingly, the OLED device 100 may sense a contact position of the user through the external device 105. In example embodiments, the external device 105 is disposed in the outside of the OLED device 100, but not being limited thereto. For example, in some example embodiments, the external device 105 may be disposed in the inside of the OLED device 100.

Each of the source electrode 210, the drain electrode 230, and the touch sensor wiring 260 may be simultaneously formed using the same materials, and may include a metal, a metal alloy, metal nitride, conductive metal oxide, transparent conductive materials, etc. For example, each of the source electrode 210, the drain electrode 230, and the touch sensor wiring 260 may be formed of gold (Au), silver (Ag), aluminum (Al), an alloy of aluminum, aluminum nitride (AlNx), silver (Ag), an alloy of silver, tungsten (W), tungsten nitride (WNx), copper (Cu), an alloy of copper, nickel (Ni), chrome (Cr), chrome nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), stannum oxide (SnOx), indium oxide (InOx), gallium oxide (GaOx), indium tin oxide (ITO), indium zinc oxide (IZO), etc. These may be used alone or in a suitable combination thereof. In example embodiments, a thickness of the touch sensor wiring 260 may be less than that of the source and drain electrodes 210 and 230. For example, since the touch sensor wiring 260 is disposed in the transparent region 30, a thickness of the touch sensor wiring 260 may be formed as a thin thickness such that a transmissivity of the transparent region 30 is not decreased, and the touch sensor wiring 260 may be substantially transparent. That is, the touch sensor wiring 260 may be transparent, and the source electrode 210 and the drain electrode 230 may be opaque. In addition, the touch sensor wiring 260 and the source and drain electrodes 210 and 230 may be formed as different processes from each other. Alternatively, the touch sensor wiring 260 and the source and drain electrodes 210 and 230 may be simultaneously formed as the same process, and touch sensor wiring 260 and the source and drain electrodes 210 and 230 may be opaque.

In example embodiments, the semiconductor element 250 of the OLED device 100 has a top gate structure, but not being limited thereto. For example, in some example embodiments, the semiconductor element 250 may have a bottom gate structure.

In addition, the semiconductor element 250 of the OLED device 100 is disposed in the sub-pixel region 15, but not being limited thereto. In some example embodiments, the semiconductor element 250 may be disposed in the transparent region 30 or the opaque region 35.

The planarization layer 270 may be disposed on the source and drain electrodes 210 and 230 (or the semiconductor element 250), and the touch sensor wiring 260. The planarization layer 270 may cover the source electrode 210, the drain electrode 230, and the touch sensor wiring 260 in the sub-pixel region 15 and the transparent region 30. That is, the planarization layer 270 may be disposed on the entire substrate 110. For example, the planarization layer 270 may be disposed as a relatively high thickness to sufficiently cover the touch sensor wiring 260 and the source and drain electrodes 210 and 230. In this case, the planarization layer 270 may have a substantially even upper surface, and a planarization process may be further performed on the planarization layer 270 to implement the even upper surface of the planarization layer 270. Alternatively, the planarization layer 270 may cover the touch sensor wiring 260 and the source and drain electrodes 210 and 230, and may be disposed as a substantially uniform thickness along a profile of the touch sensor wiring 260 and the source and drain electrodes 210 and 230. The planarization layer 270 may have a contact hole 269 exposing a portion of the touch sensor wiring 260. The touch sensor electrode 360 may be in contact with the touch sensor wiring 260 through the contact hole 269, and the touch sensor electrode 360 may be electrically connected to the touch sensor wiring 260. The planarization layer 270 may include organic materials or inorganic materials.

The lower electrode 290 may be disposed in the sub-pixel region 15 on the planarization layer 270. The touch sensor electrode 360 may be disposed in the transparent region 30 on the planarization layer 270. The lower electrode 290 may be in contact with the drain electrode 230 of the semiconductor element 250 through a contact hole formed in the planarization layer 270. Thus, the lower electrode 290 may be electrically connected to the semiconductor element 250.

When the OLED device 100 may be manufactured as a top emission structure in the sub-pixel region 15, the lower electrode 290 may include a light reflection layer. For example, as illustrated in FIG. 5, the lower electrode 290 may have a multilayer structure. The multilayer structure may include the first, second, and third electrode layers 291, 292, and 293. The first electrode layer 291 may be disposed in the sub-pixel region 15 on the planarization layer 270, and the second electrode layer 292 and the third electrode layer 293 may be sequentially disposed on the first electrode layer 291. Here, the first electrode layer 291 and the third electrode layer 293 may include substantially the same materials, and the second electrode layer 292 may be interposed between the first electrode layer 291 and the third electrode layer 293. A thickness of the first and third electrode layers 291 and 293 each may be substantially less than that of the second electrode layer 292, and a thickness of the first electrode layer 291 may be substantially the same as that of the third electrode layer 293.

The first electrode layer 291 may cover an upper surface of the planarization layer 270. As the first electrode layer 291 is disposed on the planarization layer 270, the first electrode layer 291 may help the formation of the second electrode layer 292. As the third electrode layer 293 is disposed on the second electrode layer 292, a color coordinate of the OLED device 100 may be readily controlled. The second electrode layer 292 may serve as the light reflection layer. The second electrode layer 292 may reflect a light emitted from the first light emitting layer 330 in the front (e.g., a third direction D3 that is vertical to the first and second directions D1 and D2) of the OLED device 100. Thus, the lower electrode 290 including the second electrode layer 292 may be substantially opaque. Alternatively, the lower electrode 290 may have a multilayer structure including the first electrode layer 291 and the second electrode layer 292, or may have a single layer structure including the second electrode layer 292. For example, the second electrode layer 292 may include Au, Ag, Al, Pt, Ni, Ti, palladium (Pd), magnesium (Mg), Calcium (Ca), Lithium (Li), Cr, Ta, W, Cu, Mo, Sc, Nd, Iridium (Jr). These may be used alone or in a suitable combination thereof. Alternatively, the second electrode layer 292 may be formed of a metal, a metal alloy, metal nitride, conductive metal oxide, transparent conductive materials, etc. Each of the first electrode layer 291 and the third electrode layer 293 may be substantially transparent. For example, each of the first electrode layer 291 and the third electrode layer 293 may include transparent conductive materials, etc. For example, each of the first electrode layer 291 and the third electrode layer 293 may include ZnOx, SnOx, InOx, GaOx, ITO, IZO, etc.

In example embodiments, the touch sensor electrode 360 and the lower electrode 290 may be spaced apart from each other on the planarization layer 270. The touch sensor electrode 360 and the first electrode layer 291 may be simultaneously formed using the same materials. That is, the touch sensor electrode 360 may be formed in a process forming the lower electrode 290 without an extra manufacturing process. Thus, a manufacturing cost of the OLED device 100 may be relatively reduced. Alternatively, the touch sensor electrode 360 and the third electrode layer 293 may be simultaneously formed using the same materials. Thus, a thickness of the touch sensor electrode 360 may be less than that of the lower electrode 290, and the touch sensor electrode 360 may be transparent. As described above, the touch sensor electrode 360 may be in contact with the touch sensor wiring 260 through the contact hole 269. The OLED device 100 including the touch sensor electrode 360 and the touch sensor wiring 260 may sense a contact of the user without a touch screen panel additionally disposed on the encapsulation substrate 350.

The pixel defining layer 310 may be disposed in the opaque region 35 on the planarization layer 270 to expose a portion (e.g., both lateral portions) of the lower electrode 290 in the sub-pixel region 15 and a portion (e.g., both lateral portions) of the touch sensor electrode 360 in the transparent region 30. Alternatively, the pixel defining layer 310 may be disposed in the opaque region 35 and the transparent region 30. The light emitting layer 330 may be located on the lower electrode 290 where at least a portion is exposed by the pixel defining layer 310. Alternatively, the pixel defining layer 310 may be transparent. The pixel defining layer 310 may include organic materials or inorganic materials.

The light emitting layer 330 may be disposed on a portion where at least a portion of the lower electrode 290 is exposed. The light emitting layer 330 may have a multilayer structure including an emission layer (EL), a hole injection layer (HIL), a hole transfer layer (HTL), an electron transfer layer (ETL), an electron injection layer (EIL), etc. The EL of the light emitting layer 330 may be formed using at least one of light emitting materials capable of generating different colors of light (e.g., a red color of light, a blue color of light, and a green color of light, etc.) according to first, second, and third sub-pixels illustrated in FIG. 1. Alternatively, the EL of the light emitting layer 330 may generally generate a white color of light by stacking a plurality of light emitting materials capable of generating different colors of light such as a red color of light, a green color of light, a blue color of light, etc. In some example embodiments, the HIL, the HTL, the ETL, the EIL, etc. except the EL may be disposed in the transparent region 30 on the lower electrode 290.

The upper electrode 340 may be disposed on a portion of the pixel defining layer 310 and the light emitting layer 330. The upper electrode 340 may cover the light emitting layer 330 in the sub-pixel region 15, and may expose the transparent region 30. The upper electrode 340 may be formed of a transparent conductive layer such as a metal, a metal alloy, metal nitride, conductive metal oxide and transparent conductive materials. These may be used alone or in a suitable combination thereof.

The encapsulation substrate 350 may be disposed on the pixel defining layer 310, the upper electrode 340, and the touch sensor electrode 360. The encapsulation substrate 350 and the substrate 110 may include substantially the same materials. For example, the encapsulation substrate 350 may include quartz, synthetic quartz, calcium fluoride, fluoride-doped quartz, sodalime glass, non-alkali glass etc. In some example embodiments, the encapsulation substrate 350 may include a transparent inorganic material or flexible plastic. For example, the encapsulation substrate 350 may include a flexible transparent resin substrate. In this case, to increase flexibility of the OLED device 100, the encapsulation substrate 350 may include a stacked structure where at least one inorganic layer and at least one organic layer are alternately stacked.

As the OLED device 100 in accordance with example embodiments includes the touch sensor electrode 360 that senses a self-capacitance in the transparent region 30 and the touch sensor wiring 260 that is electrically connected to the touch sensor electrode 360, the OLED device 100 may sense a contact of the user. Accordingly, a thickness of the OLED device 100 may be relatively decreased, and a manufacturing cost of the OLED device 100 may be reduced because the touch sensor electrode 360 is formed using the lower electrode 290.

FIGS. 7, 8, 9, and 10 are cross-sectional views illustrating a method of manufacturing an OLED device in accordance with example embodiments.

Figure 7:
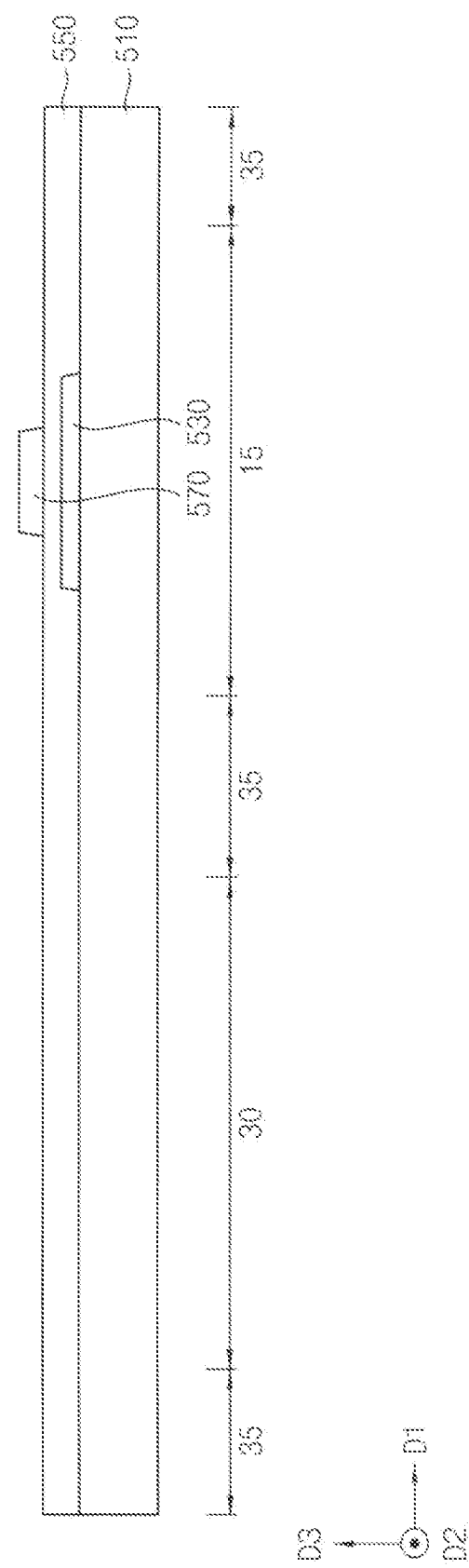
FIGS. 7, 8, 9, and 10 are cross-sectional views illustrating a method of manufacturing an OLED device in accordance with example embodiments.

Referring to FIG. 7, an active layer 530 may be formed in a sub-pixel region 15 on a substrate 510. The substrate 510 may be formed using quartz, synthetic quartz, calcium fluoride, fluoride-doped quartz, a sodalime glass, a non-alkali glass etc. Alternatively, a buffer layer may be formed on the substrate 510. The buffer layer may be formed on the entire substrate 510. The buffer layer may prevent the diffusion of metal atoms and/or impurities from the substrate 510 into a semiconductor element 650. The active layer 530 may be formed using an oxide semiconductor, an inorganic semiconductor, an organic semiconductor, etc. A gate insulation layer 550 may be formed on the substrate 510. The gate insulation layer 550 may cover the active layer 530. The gate insulation layer 550 may be entirely formed in the sub-pixel region 15, the transparent region 30, and opaque region 35 on the substrate 510. The gate insulation layer 550 may be formed using a silicon compound, a metal oxide, etc. A gate electrode 570 may be formed on a portion of the gate insulation layer 550 under which the active layer 530 is located to overlap the active layer 530 in a plan view. The gate electrode 570 may be formed using a metal, a metal alloy, metal nitride, conductive metal oxide, transparent conductive materials, etc.

Figure 8:
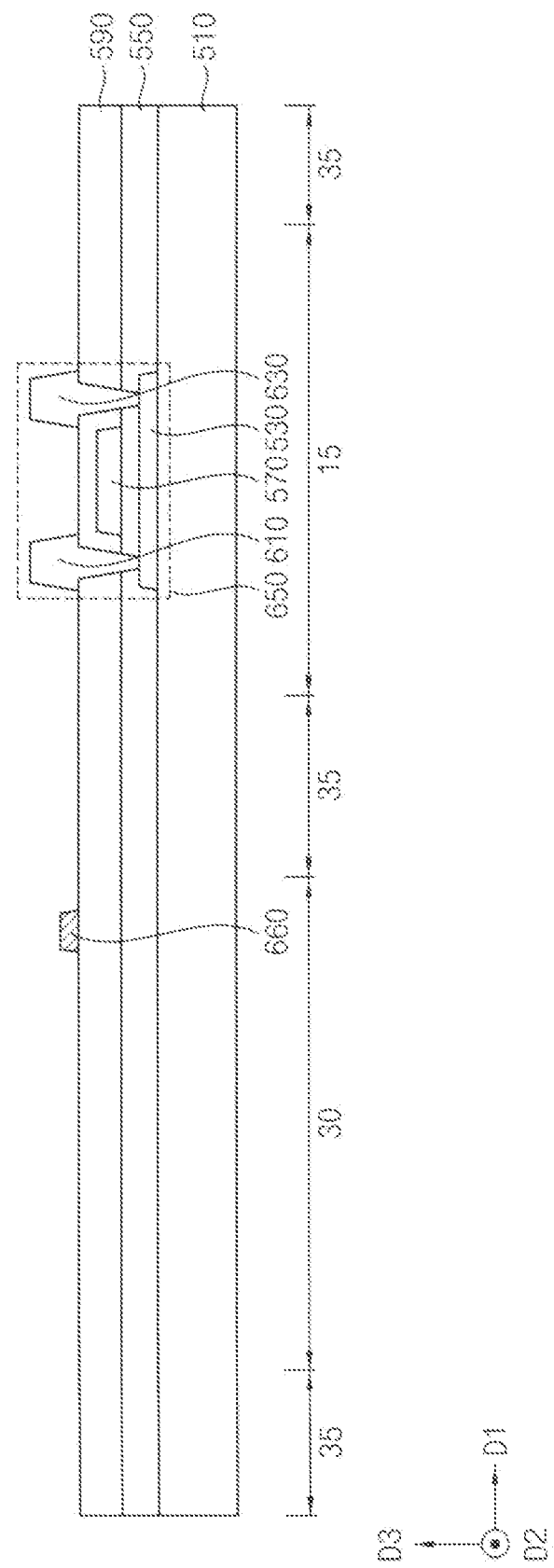

Referring to FIG. 8, an insulating interlayer 590 may be formed on the gate electrode 570. The insulating interlayer 590 may cover the gate electrode 570. The insulating interlayer 590 may be entirely formed on the sub-pixel region 15, the transparent region 30, and the opaque region 35. The insulating interlayer 590 may be formed using a silicon compound, a metal oxide, etc. A source electrode 610, a drain electrode 630, and a touch sensor wiring 660 may be formed on the insulating interlayer 590. Each of the source electrode 610, the drain electrode 630, and the touch sensor wiring 660 may be simultaneously formed using the same materials. The source electrode 610 may be in contact with a first side of the active layer 530 via a contact hole formed by removing a portion of the gate insulation layer 550 and the insulating interlayer 590. The drain electrode 630 may be in contact with a second side of the active layer 530 via a contact hole formed by removing a portion of the gate insulation layer 550 and the insulating interlayer 590. Accordingly, the semiconductor element 650 including the active layer 530, the gate electrode 570, the source electrode 610, and the drain electrode 630 may be formed.

In example embodiments, a thickness of the touch sensor wiring 660 may be less than that of the source and drain electrodes 610 and 630. For example, since the touch sensor wiring 660 is formed in the transparent region 30, a thickness of the touch sensor wiring 660 may be formed as a thin thickness such that a transmissivity of the transparent region 30 is not decreased, and the touch sensor wiring 660 may be substantially transparent. For example, after the source and drain electrodes 610 and 630 and the touch sensor electrode 660 are simultaneously formed, the touch sensor electrode 660 may be partially removed. In some example embodiments, the touch sensor wiring 660 and the source and drain electrodes 610 and 630 may be formed as different processes from each other. Alternatively, when the touch sensor wiring 660 and the source and drain electrodes 610 and 630 have a multilayer structure including a transparent electrode layer and an opaque electrode layer, the opaque electrode layer included in the touch sensor electrode 660 may be selectively removed after the source and drain electrodes 610 and 630 and the touch sensor electrode 660 are simultaneously formed.

Each of the source and drain electrodes 610 and 630 and the touch sensor electrode 660 may be formed using a metal, a metal alloy, metal nitride, conductive metal oxide, transparent conductive materials, etc. These may be used alone or in a suitable combination thereof.

Figure 9:
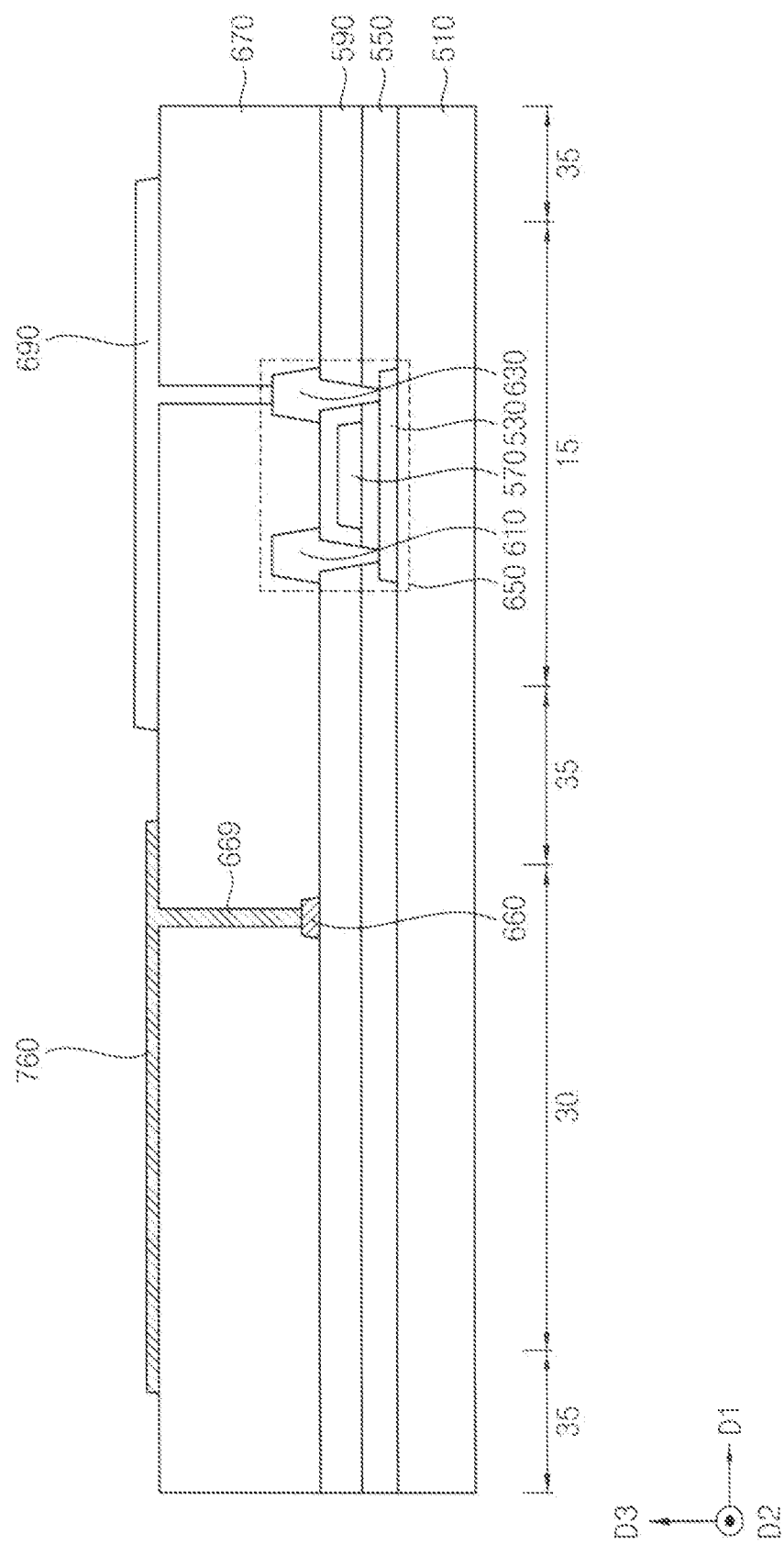

Referring to FIG. 9, a planarization layer 670 may be formed on the insulating interlayer 590. The planarization layer 670 may cover the source electrode 610, the drain electrode 630, and the touch sensor electrode 660 in the sub-pixel region 15 and the transparent region 30. The planarization layer 670 may be entirely formed in the sub-pixel region 15, the transparent region 30, and the opaque region 35 on the substrate 510. The planarization layer 670 may have a contact hole 669 exposing a portion of the touch sensor wiring 660. The touch sensor electrode 760 may be in contact with the touch sensor wiring 660 via the contact hole 669, and the touch sensor electrode 760 may be electrically connected to the touch sensor wiring 660. The planarization layer 670 may be formed using organic materials or inorganic materials.

A lower electrode 690 may be formed in the sub-pixel region 15 on the planarization layer 670. The lower electrode 690 may be in contact with the drain electrode 630 of the semiconductor element 650 via a contact hole formed through the planarization layer 670. The lower electrode 690 may have a multilayer structure. As illustrated in FIG. 5, the multilayer structure may include the first, second, and third electrode layers. The first electrode layer may be formed in the sub-pixel region 15 on the planarization layer 670, and the second electrode layer and the third electrode layer may be sequentially formed on the first electrode layer. Here, the first electrode layer and the third electrode layer may include substantially the same materials, and the second electrode layer may be interposed between the first electrode layer and the third electrode layer. A thickness of the first and third electrode layers each may be substantially less than that of the second electrode layer, and a thickness of the first electrode layer may be substantially the same as that of the third electrode layer. The second electrode layer may be substantially opaque. For example, the lower electrode may be formed using Au, Ag, Al, Pt, Ni, Ti, Pd, Mg, Ca, Li, Cr, Ta, W, Cu, Mo, Sc, Nd, Ir. These may be used alone or in a suitable combination thereof. Each of the first electrode layer and the third electrode layer may be substantially transparent. For example, each of the first electrode layer and the third electrode layer may be formed using transparent conductive materials, etc.

In example embodiments, the touch sensor electrode 760 and the first electrode layer may be simultaneously formed using the same materials. For example, after the first, second, and third electrode layer are formed on the planarization layer 670, the lower electrode 690 and a preliminary touch sensor electrode are formed by patterning. Then, the touch sensor electrode 760 may be formed by partially etching the preliminary touch sensor electrode. Thus, a thickness of the touch sensor electrode 760 may be less than that of the lower electrode 690, and the touch sensor electrode 760 may be substantially transparent.

As described above, the touch sensor electrode 760 may be in contact with the touch sensor wiring 660 via the contact hole 669. In some example embodiments, when an OLED device has a bottom emission structure, the lower electrode 690 may be formed as a thin thickness (e.g., a thickness of the first electrode layer). That is, the lower electrode 690 may be substantially transparent. In this case, a thickness of the lower electrode 690 may be substantially the same as that of the touch sensor electrode 760, and the lower electrode 690 and the touch sensor electrode 760 may be simultaneously formed using the same materials.

Figure 10:
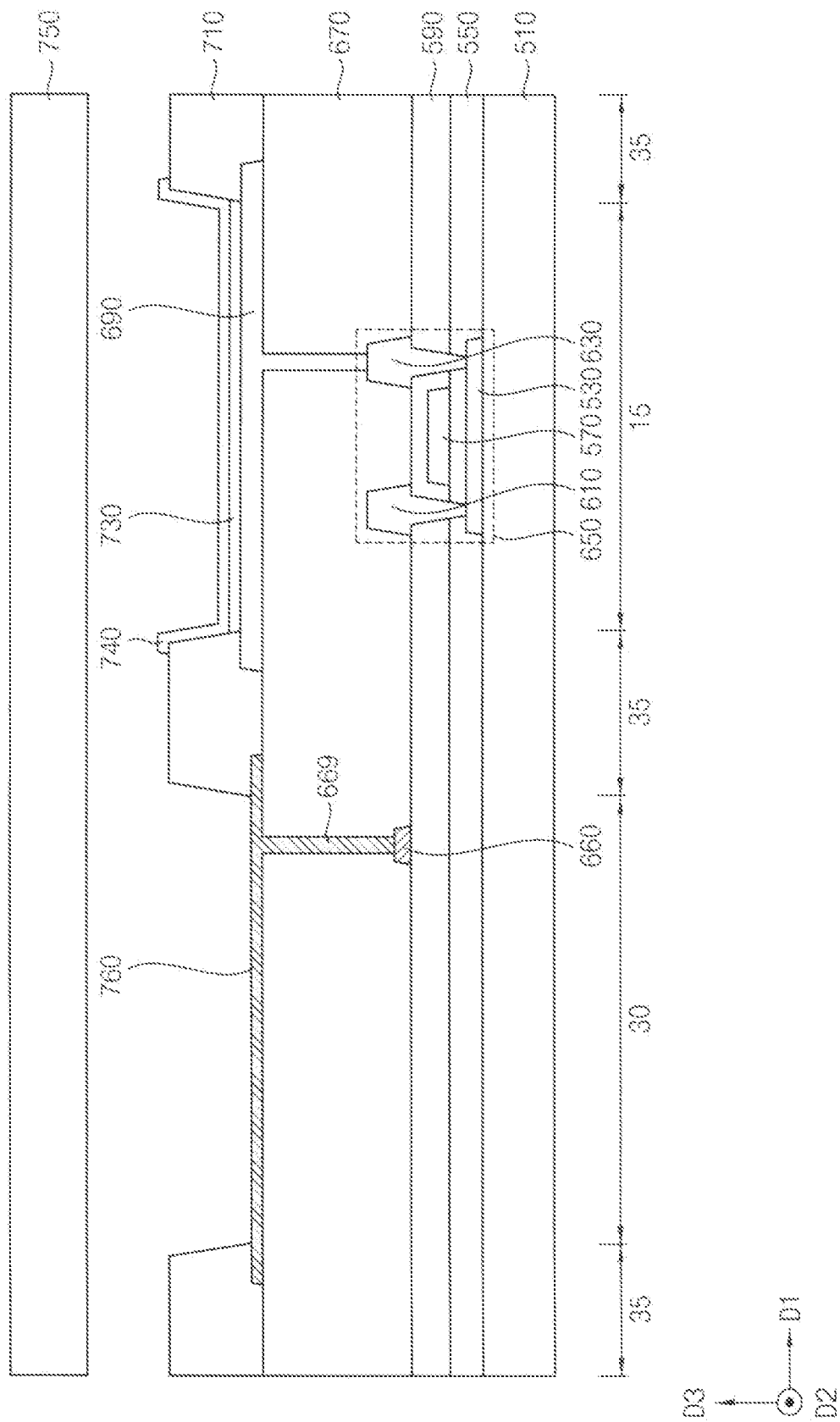

Referring to FIG. 10, a pixel defining layer 710 may be formed in the opaque region 35 on the planarization layer 670 to expose a portion of the lower electrode 690 in the sub-pixel region 15 and a portion of the touch sensor electrode 760 in the transparent region 30. The pixel defining layer 710 may be formed using organic materials or inorganic materials.

A light emitting layer 730 may be formed on a portion where at least a portion of the lower electrode 690 is exposed. The light emitting layer 730 may have a multilayer structure including EL, HIL, HTL, ETL, EIL, etc. The EL of the light emitting layer 730 may be formed using at least one of light emitting materials capable of generating different colors of light (e.g., a red color of light, a blue color of light, and a green color of light, etc.) according to first, second, and third sub-pixels illustrated in FIG. 1. Alternatively, the EL of the light emitting layer 730 may generally generate a white color of light by stacking a plurality of light emitting materials capable of generating different colors of light such as a red color of light, a green color of light, a blue color of light, etc. In some example embodiments, the HIL, the HTL, the ETL, the EIL, etc. except the EL may be formed in the transparent region 30. An upper electrode 740 may be formed on a portion of the pixel defining layer 710 and the light emitting layer 730. The upper electrode 740 may cover the light emitting layer 730 in the sub-pixel region 15, and may expose the transparent region 30. The upper electrode 740 may be formed using a metal, a metal alloy, metal nitride, conductive metal oxide, transparent conductive materials, etc. These may be used alone or in a suitable combination thereof.

An encapsulation substrate 750 may be formed on the pixel defining layer 710, the upper electrode 740, and the touch sensor electrode 760. The encapsulation substrate 750 and the substrate 510 may include substantially the same materials. For example, the encapsulation substrate 750 may be formed using quartz, synthetic quartz, calcium fluoride, fluoride-doped quartz, sodalime glass, non-alkali glass etc. The encapsulation substrate 750 is combined with the substrate 510 by performing an encapsulation process on the upper electrode 740. Accordingly, the OLED device illustrated in FIG. 4 may be manufactured.

Figure 11:
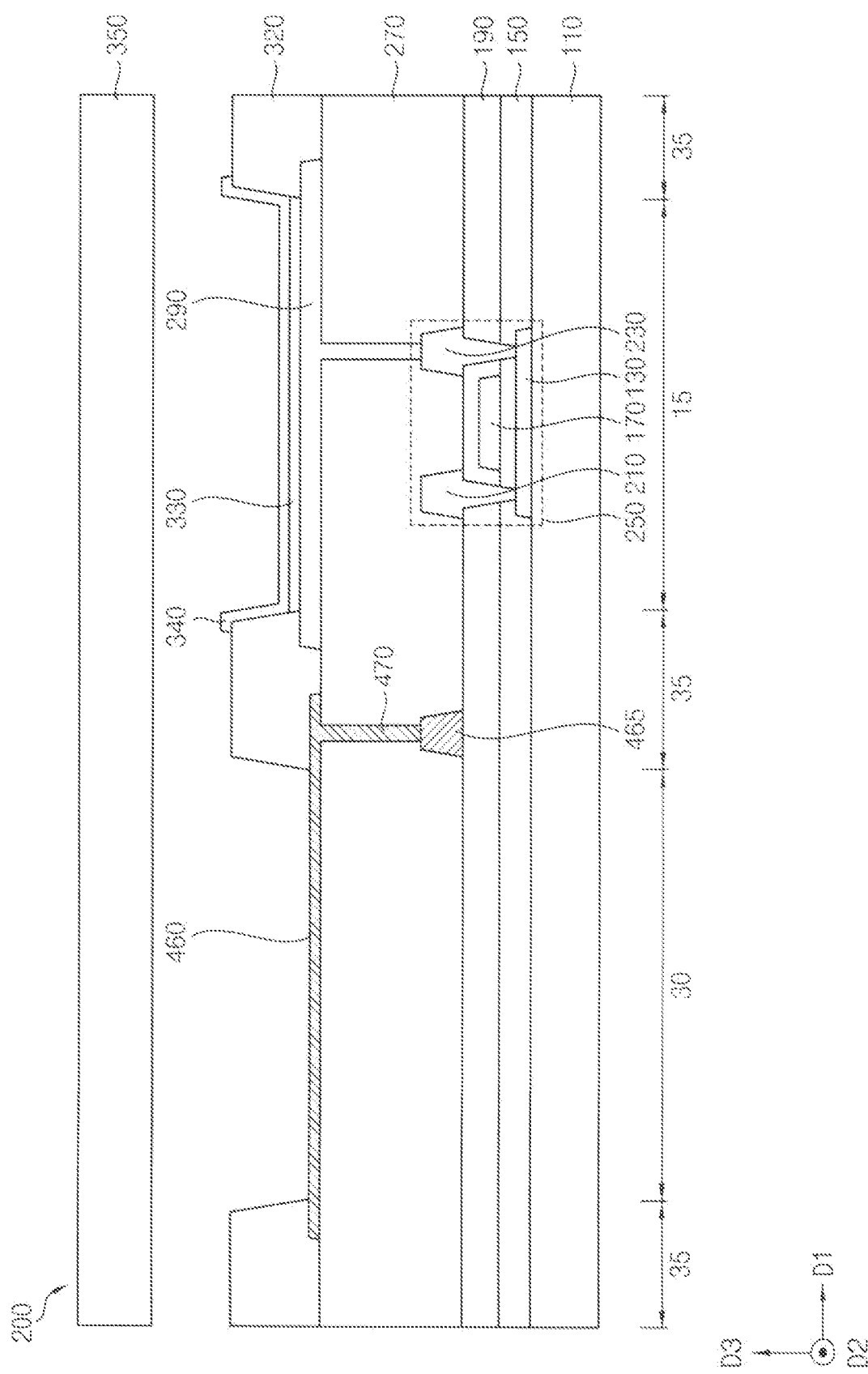
FIG. 11 is a cross-sectional view illustrating an OLED device in accordance with example embodiments.

FIG. 11 is a cross-sectional view illustrating an OLED device in accordance with example embodiments. An OLED device 200 illustrated in FIG. 11 may have a configuration substantially the same as or similar to that of an OLED device 100 described with reference to FIG. 4 except a pixel defining layer 320, a touch sensor electrode 460, and a touch sensor wiring 465. In FIG. 11, detailed descriptions for elements that are substantially the same as or similar to elements described with reference to FIG. 4 may not be repeated.

Referring to FIGS. 4 and 11, an OLED device 200 may include a substrate 110, a gate insulation layer 150, an insulating interlayer 190, a planarization layer 270, a semiconductor element 250, a touch sensor wiring 465, a pixel structure, a touch sensor electrode 460, a pixel defining layer 320, an encapsulation substrate 350, etc. Here, the pixel structure may include a lower electrode 290, a light emitting layer 330, and an upper electrode 340, and the semiconductor element 250 may include an active layer 130, a gate electrode 170, a source electrode 210, and a drain electrode 230.

The touch sensor wiring 465 may be disposed in the opaque region 35 on the insulating interlayer 190. For example, the touch sensor wiring 465 may be disposed under the touch sensor electrode 460. As illustrated in FIG. 6, the touch sensor wiring 465 included in the OLED device 200 may be electrically connected to the touch sensor electrode 460 and an external device 105. In addition, the touch sensor wiring 465 may transfer a changed capacitance of the touch sensor electrode 460 to the external device 105, and may provide a sensing voltage generated from the external device 105 to the touch sensor electrode 460. For example, when a user of the OLED device 200 contacts an upper surface of the encapsulation substrate 350, a capacitance of the touch sensor electrode 460 corresponding to the contact surface may be changed. In other word, a changed capacitance may be generated between a portion of the body that is contacted to the upper surface of the encapsulation substrate 350 and the touch sensor electrode 460, and the external device 105 electrically connected to the touch sensor wiring 465 may sense the changed capacitance. After a contact of the user and the OLED device 200 is ended, the external device 105 may provide the sensing voltage to the touch sensor electrode 460. Accordingly, the OLED device 200 may sense a contact position of the user through the external device 105.

Each of the source electrode 210, the drain electrode 230, and the touch sensor wiring 465 may be simultaneously formed using the same materials. In example embodiments, a thickness of the touch sensor wiring 465 may be substantially the same as that of the source electrode 210 and the drain electrode 230 each. For example, the touch sensor wiring 465 may be substantially opaque.

The planarization layer 270 may be disposed on the source and drain electrodes 210 and 230, and touch sensor wiring 465. The planarization layer 270 may have a contact hole 470 exposing a portion of the touch sensor wiring 465. The touch sensor electrode 460 may be in contact with the touch sensor wiring 465 via the contact hole 470, and the touch sensor electrode 460 may be electrically connected to the touch sensor wiring 465. In example embodiments, the contact hole 470 may be located in the opaque region 35. The planarization layer 270 may include organic materials or inorganic materials.

In example embodiments, the touch sensor electrode 460 may extend in a first direction D1 on the planarization layer 270, and the first direction D1 may be parallel to an upper surface of the substrate 110. For example, the touch sensor electrode 460 may overlap at least a portion of the opaque region 35, and the contact hole 470 and the touch sensor wiring 465 may be located under the touch sensor electrode 460 extending in the first direction D1. As the touch sensor electrode 460 is disposed in the opaque region 35, the touch sensor electrode 460 may be in contact with the touch sensor wiring via the contact hole 470.

The pixel defining layer 320 may be disposed in the opaque region 35 on the planarization layer 270. The pixel defining layer 320 may block light such that an external light is prevented from being reflected from the touch sensor wiring 465 disposed under the pixel defining layer 320. For example, the pixel defining layer 320 may have light blocking materials to reduce the reflection of the external light. The light blocking materials may include carbon black, titanium nitride oxide, titanium black, phenylene black, aniline black, cyanine black, nigrosine acid black, etc. The pixel defining layer 320 may include organic materials or inorganic materials.

As the OLED device 200 in accordance with example embodiments includes the opaque pixel defining layer 320 and the touch sensor wiring 465 that has relatively thick thickness and is located under the pixel defining layer 320, a wiring resistance of the touch sensor wiring 465 may be decreased. In addition, as the touch sensor wiring 465 is disposed under the pixel defining layer 320, a transmissivity of the transparent region 30 and a visibility of the OLED device 200 may be relatively increased.

Figure 12:
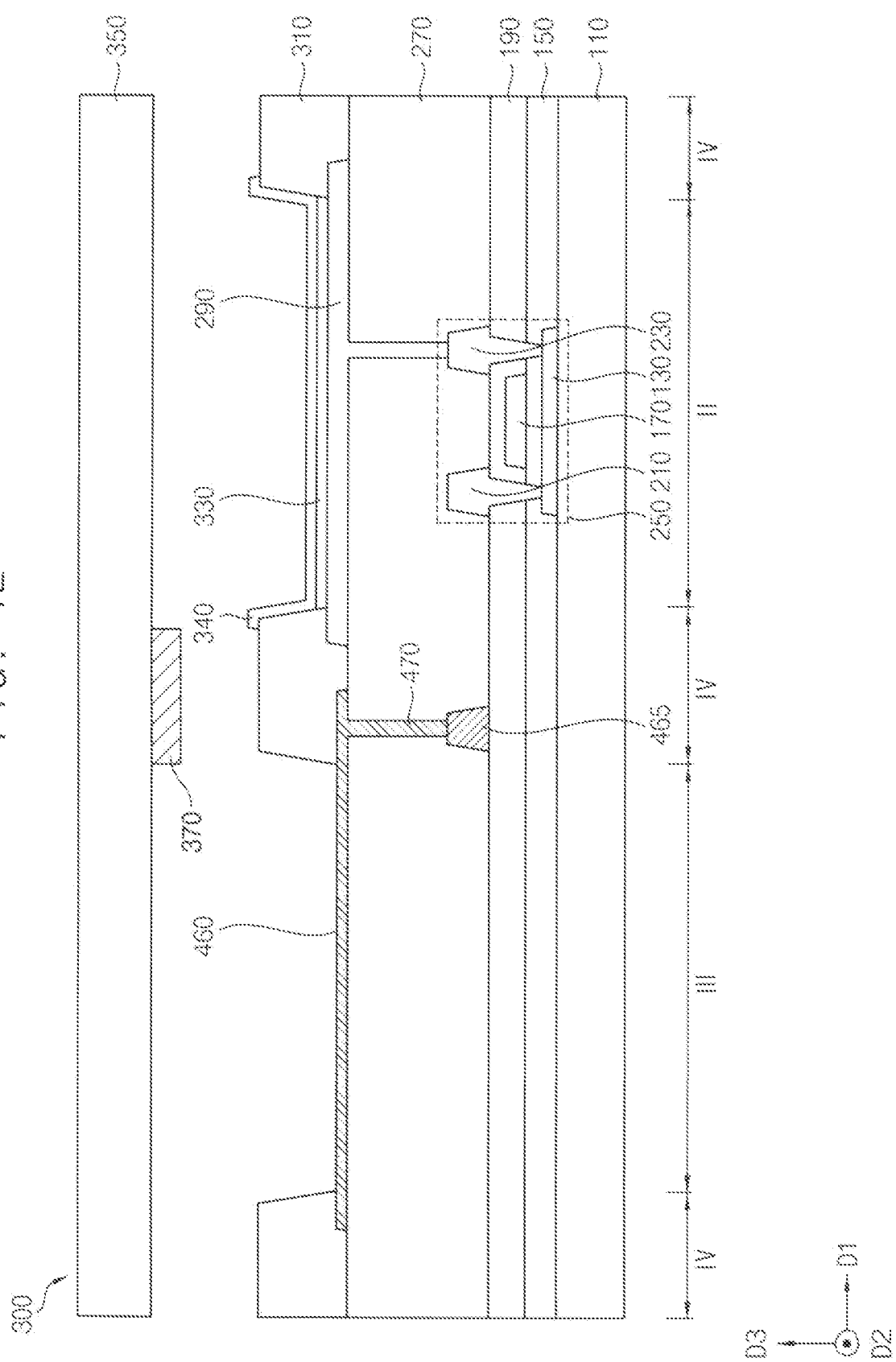
FIG. 12 is a cross-sectional view illustrating an OLED device in accordance with example embodiments.

FIG. 12 is a cross-sectional view illustrating an OLED device in accordance with example embodiments. An OLED device 300 illustrated in FIG. 12 may have a configuration substantially the same as or similar to that of an OLED device 200 described with reference to FIG. 11 except a light blocking member 370. In FIG. 12, detailed descriptions for elements that are substantially the same as or similar to elements described with reference to FIG. 11 may not be repeated.

Referring to FIGS. 11 and 12, an OLED device 300 may include a substrate 110, a gate insulation layer 150, an insulating interlayer 190, a planarization layer 270, a semiconductor element 250, a touch sensor wiring 465, a pixel structure, a touch sensor electrode 460, a pixel defining layer 310, an encapsulation substrate 350, etc. Here, the pixel structure may include a lower electrode 290, a light emitting layer 330, and an upper electrode 340, and the semiconductor element 250 may include an active layer 130, a gate electrode 170, a source electrode 210, and a drain electrode 230.

The touch sensor electrode 460 may extend in a first direction D1 on the planarization layer 270, and the first direction D1 may be parallel to an upper surface of the substrate 110. As the touch sensor electrode 460 is disposed in the opaque region 35, the touch sensor electrode 460 may be in contact with the touch sensor wiring 465 via the contact hole 470.

The pixel defining layer 310 may be disposed in the opaque region 35 on the planarization layer 270 to expose a portion (e.g., both lateral portions) of the lower electrode 290 in the sub-pixel region 15 and a portion (e.g., both lateral portions) of the touch sensor electrode 360 in the transparent region 30. The pixel defining layer 310 may include organic materials or inorganic materials.

The light blocking member 370 may be disposed on the pixel defining layer 310. For example, the light blocking member 370 may be disposed on a lower surface of the encapsulation substrate 350 to overlap the pixel defining layer 310. When the pixel defining layer 310 is substantially transparent, an external light may be reflected from the touch sensor wiring 465 disposed under the pixel defining layer 310. In order to prevent this, the light blocking member 370 which blocks light may overlap the touch sensor wiring 465.

For example, the light blocking member 370 may have light blocking materials to reduce the reflection of the external light. The light blocking materials may include carbon black, titanium nitride oxide, titanium black, phenylene black, aniline black, cyanine black, nigrosine acid black, etc. The light blocking member 370 may include a resin having the light blocking materials. The resin capable of being used as the light blocking member 370 may include epoxy resin, acryl resin, siloxane resin, polymer resin, polyimide resin, etc.

As the OLED device 300 in accordance with example embodiments includes the light blocking member 370 disposed on the pixel defining layer 310, the external light is prevented from being reflected from the touch sensor wiring 465. Accordingly, a visibility of the OLED device 300 may be relatively increased.

Figure 13:
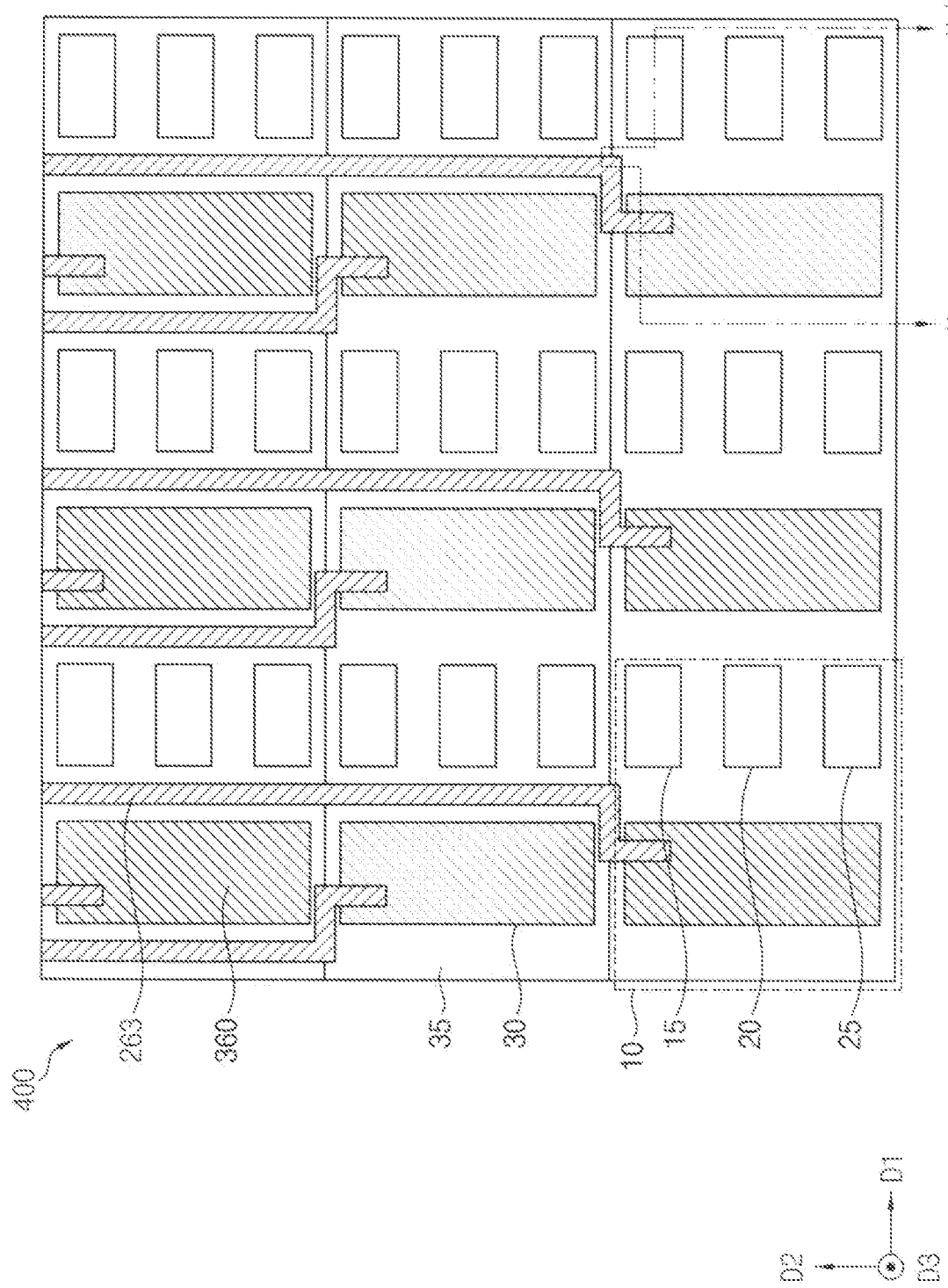
FIG. 13 is a planar view illustrating an OLED device in accordance with example embodiments.
Figure 15:
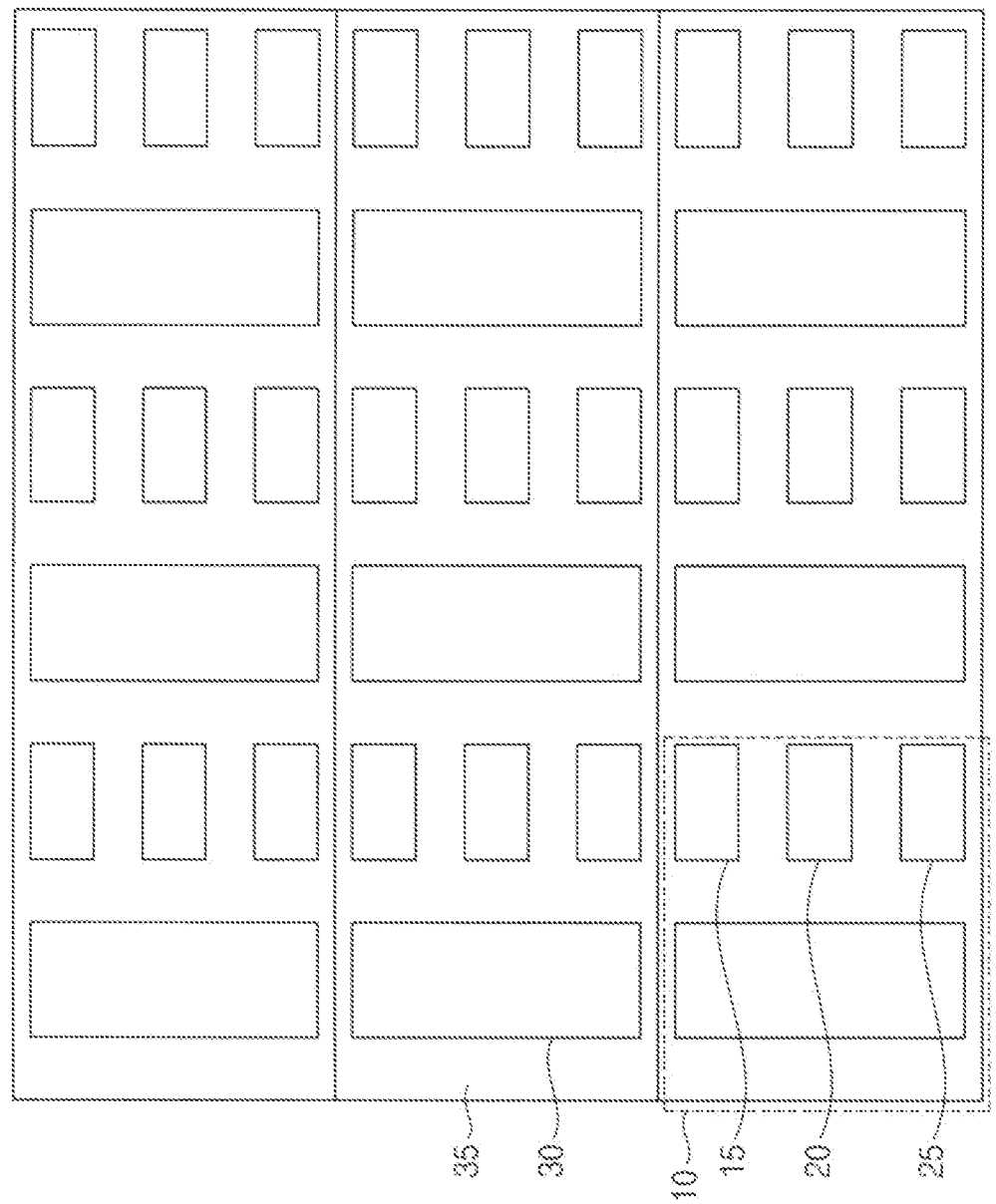
FIG. 15 is a planar view for describing a pixel region included in the OLED device of FIG. 13.

FIG. 13 is a planar view illustrating an OLED device in accordance with example embodiments, and FIG. 14 is a planar view for describing a touch sensor electrode and a touch sensor wiring included in the OLED device of FIG. 13. FIG. 15 is a planar view for describing a pixel region included in the OLED device of FIG. 13. An OLED device 400 illustrated in FIGS. 13, 14, and 15 may have a configuration substantially the same as or similar to that of an OLED device 100 described with reference to FIGS. 1, 2, and 3 except a touch sensor wiring 263. In FIGS. 13, 14, and 15, detailed descriptions for elements that are substantially the same as or similar to elements described with reference to FIGS. 1, 2, and 3 may not be repeated.

Referring to FIGS. 1, 2, 3, 13, 14, and 15, an OLED device 400 may include a plurality of pixel regions. One pixel region 10 among a plurality of pixel regions may include first, second, and third sub-pixel regions 15, 20, and 25, a transparent region 30, and an opaque region 35. For example, the pixel regions 10 may be arranged in first and second directions D1 and D2 on the entire substrate included in the OLED device 400. Here, the first direction D1 may be parallel to an upper surface of the substrate, and the second direction D2 may be perpendicular to the first direction D1. In addition, the opaque region 35 may extend in the first and second directions D1 and D2 to surround the first, second, and third sub-pixel regions 15, 20, and 25 and the transparent region 30.

First, second, and third sub-pixels may be disposed in the first, second, and third sub-pixel region 15, 20, and 25, respectively. For example, the first sub-pixel may emit a red color of light, and the second sub-pixel may emit a green color of light. In addition, the third sub-pixel may emit a blue color of light.

In the transparent region 30, a light incident from the outside may be transmitted. In example embodiments, a touch sensor electrode 360 may be disposed in the transparent region 30.

In the opaque region 35, a pixel defining layer included in the OLED device 400 may be disposed. For example, the first, second, and third sub-pixel region 15, 20, and 25 and the transparent region 30 may be substantially surrounded by the pixel defining layer.

In example embodiments, the touch sensor wiring 263 may be disposed in at least a portion of the transparent region 30 and the opaque region 35 on the substrate. For example, the touch sensor wiring 263 may be disposed in the pixel regions 10 that are arranged in the second direction D2 among a plurality of the pixel regions 10. In other word, the touch sensor wiring 263 may extend in the second direction D2 on the substrate, and may be electrically connected to the touch sensor electrode 360 disposed in the pixel regions 10 that are arranged in the second direction D2 among a plurality of the pixel regions 10. For example, the touch sensor wiring 263 may be disposed on the touch sensor electrode 360. The touch sensor electrode 360 disposed in the transparent region 30 included in the pixel regions 10 each may be electrically connected to the touch sensor wiring 263. Here, the touch sensor wiring 263 and the touch sensor electrode 360 may be substantially transparent, and at least a portion of the touch sensor wiring 263 may be disposed in the transparent region 30 such that the touch sensor wiring 263 is in contact with the touch sensor electrode 360. In addition, the touch sensor wiring 263 may extend in the second direction D2 in the opaque region 35 on the pixel defining layer. In example embodiments, the touch sensor wiring 263 may have a first thickness and a second thickness that is less than the first thickness. The touch sensor wiring 263 having the second thickness may be contact with the touch sensor electrode 360 in the transparent region 30. The touch sensor wiring 263 having the second thickness may be substantially transparent in the transparent region 30. Meanwhile, the touch sensor wiring 263 having the first thickness may be disposed in the opaque region 35, and may extend in the second direction D2. Accordingly, a wiring resistance of the touch sensor wiring 263 may be reduced. Thus, a transmissivity of the transparent region 30 included in the OLED device 300 may not be significantly decreased.

Figure 16:
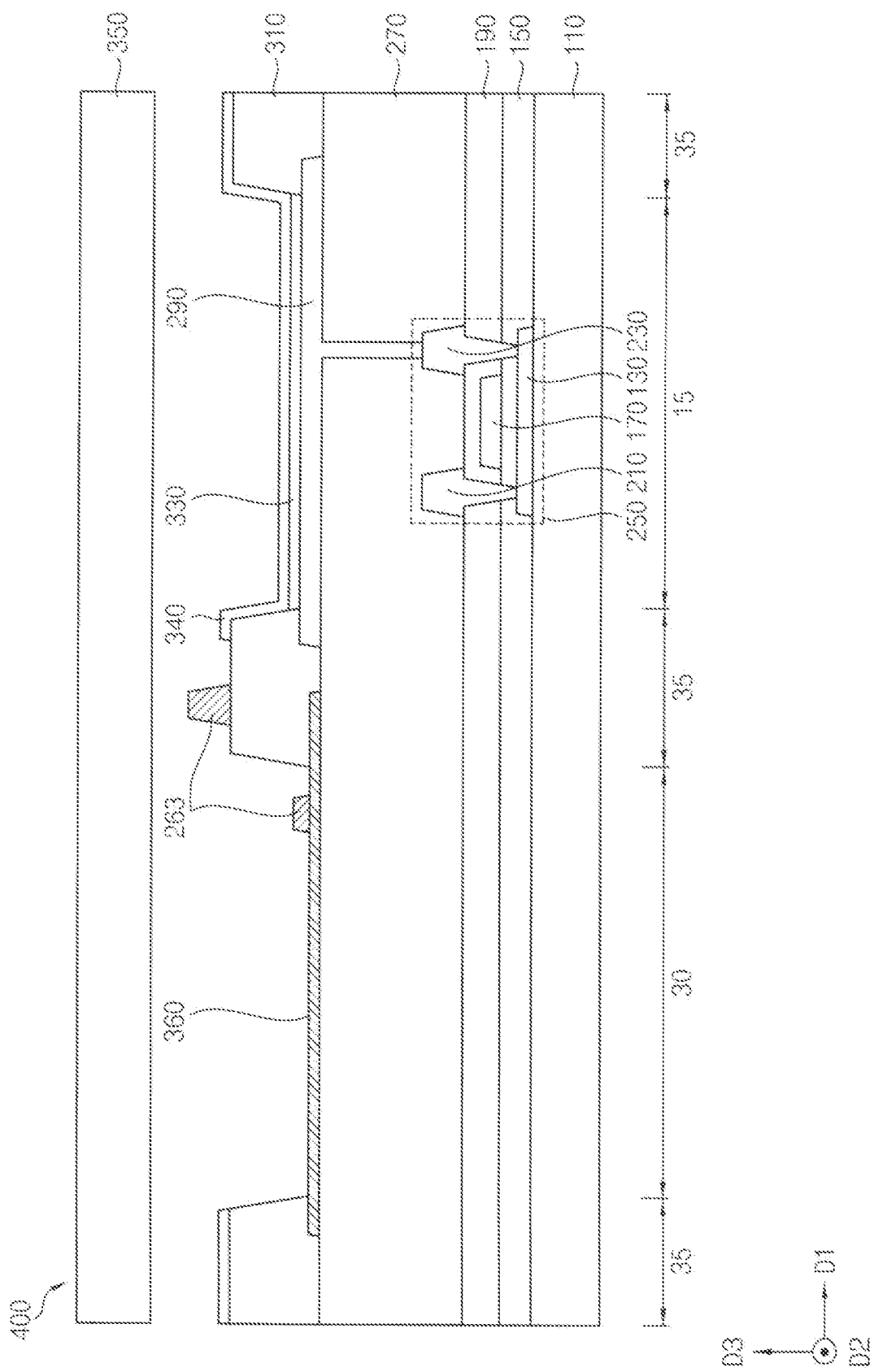
FIG. 16 is a cross-sectional view taken along a line II-II' of FIG. 13.

FIG. 16 is a cross-sectional view taken along a line II-II' of FIG. 13. An OLED device 400 illustrated in FIG. 16 may have a configuration substantially the same as or similar to that of an OLED device 100 described with reference to FIG. 4 except a touch sensor wiring 263. In FIG. 16, detailed descriptions for elements that are substantially the same as or similar to elements described with reference to FIG. 4 may not be repeated.

Referring to FIGS. 4 and 16, an OLED device 400 may include a substrate 110, a gate insulation layer 150, an insulating interlayer 190, a planarization layer 270, a semiconductor element 250, a touch sensor wiring 263, a pixel structure, a touch sensor electrode 360, a pixel defining layer 310, an encapsulation substrate 350, etc. Here, the pixel structure may include a lower electrode 290, a light emitting layer 330, and an upper electrode 340, and the semiconductor element 250 may include an active layer 130, a gate electrode 170, a source electrode 210, and a drain electrode 230.

The touch sensor wiring 263 may be disposed in the transparent region 30 on the touch sensor electrode 360. As illustrated in FIG. 6, the touch sensor wiring 263 included in the OLED device 400 may be electrically connected to the touch sensor electrode 360 and an external device 105. In addition, the touch sensor wiring 263 may transfer a changed capacitance of the touch sensor electrode 360 to the external device 105, and may provide a sensing voltage generated from the external device 105 to the touch sensor electrode 360.

The touch sensor wiring 263 and the touch sensor electrode 360 may be substantially transparent, and the touch sensor wiring 263, and at least a portion of the touch sensor wiring 263 may be disposed in the transparent region 30 such that the touch sensor wiring 263 is in contact with the touch sensor electrode 360. In addition, the touch sensor wiring 263 may extend in the second direction D2 in the opaque region 35 on the pixel defining layer 310. In example embodiments, the touch sensor wiring 263 in the transparent region 30 may have a first thickness, and the touch sensor wiring 263 in the opaque region 35 may have a second thickness that is thicker than the first thickness. The touch sensor wiring 263 having the second thickness may be contact with the touch sensor electrode 360 in the transparent region 30. The touch sensor wiring 263 having the second thickness may be substantially transparent in the transparent region 30. Meanwhile, the touch sensor wiring 263 having the first thickness may be disposed in the opaque region 35, and may extend in the second direction D2. Accordingly, a wiring resistance of the touch sensor wiring 263 may be reduced. In example embodiments, the touch sensor wiring 263 and the touch sensor electrode 360 may include different materials from each other. For example, after the touch sensor electrode 360 is formed, a preliminary touch sensor wiring may be formed on the entire substrate 110. In a process etching the preliminary touch sensor wiring, the touch sensor electrode 360 may not be etched using a difference of an etch rate while the preliminary touch sensor wiring is partially etched.

Figure 17:
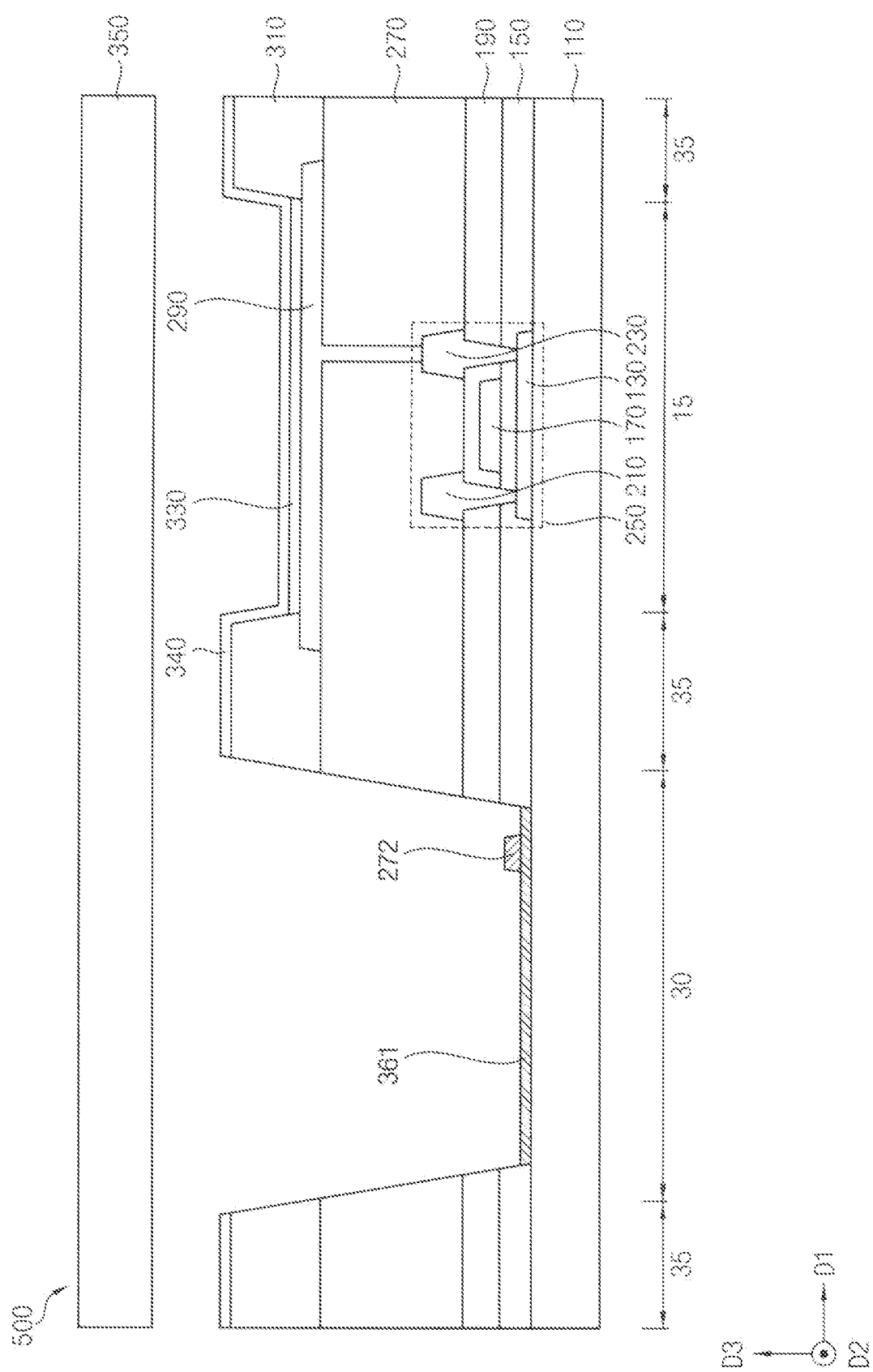
FIG. 17 is a cross-sectional view illustrating an OLED device in accordance with example embodiments.
Figure 18:
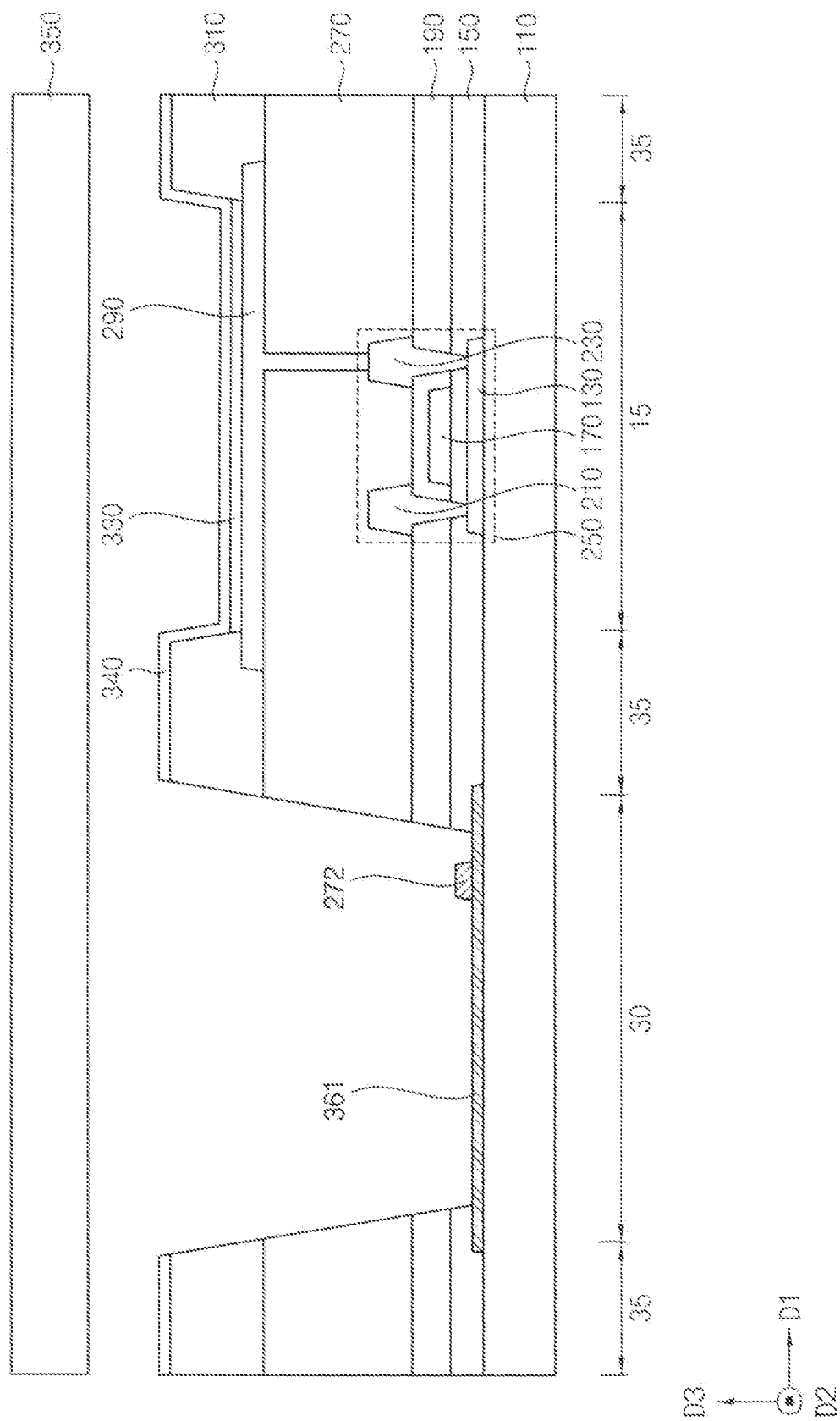
FIG. 18 is a cross-sectional view illustrating an OLED device in accordance with example embodiments.

FIG. 17 is a cross-sectional view illustrating an OLED device in accordance with example embodiments, and FIG. 18 is a cross-sectional view illustrating an OLED device in accordance with example embodiments. OLED devices illustrated in FIGS. 17 and 18 may have a configuration substantially the same as or similar to that of an OLED device 100 described with reference to FIG. 4 except a touch sensor electrode 361 and a touch sensor wiring 272. In FIGS. 17 and 18, detailed descriptions for elements that are substantially the same as or similar to elements described with reference to FIG. 4 may not be repeated.

Referring to FIGS. 4 and 17, an OLED device 500 may include a substrate 110, a gate insulation layer 150, an insulating interlayer 190, a planarization layer 270, a semiconductor element 250, a touch sensor wiring 272, a pixel structure, a touch sensor electrode 361, a pixel defining layer 310, an encapsulation substrate 350, etc. Here, the pixel structure may include a lower electrode 290, a light emitting layer 330, and an upper electrode 340, and the semiconductor element 250 may include an active layer 130, a gate electrode 170, a source electrode 210, and a drain electrode 230.

In the transparent region 30, the substrate 110 may be exposed by removing a portion of the gate insulation layer 150, the insulating interlayer 190, and the planarization layer 270. The touch sensor electrode 361 may be disposed on the exposed substrate 110, and the touch sensor wiring 272 may be disposed in a first side on the touch sensor electrode 361. Alternatively, at least one insulation layer may be disposed on the substrate 110.

The touch sensor wiring 272 and the touch sensor electrode 361 may be substantially transparent. As illustrated in FIG. 13, at least a portion of the touch sensor wiring 272 may be disposed in the transparent region 30 such that the touch sensor wiring 272 is in contact with the touch sensor electrode 361, and the touch sensor wiring 272 may extend along the second direction D2 in the opaque region 35 on the pixel defining layer 310. In example embodiments, the touch sensor wiring 272 and the touch sensor electrode 361 may include different materials from each other. For example, after the touch sensor electrode 361 is formed, a preliminary touch sensor wiring may be formed on the entire substrate 110. In a process etching the preliminary touch sensor wiring, the touch sensor electrode 361 may not be etched using a difference of an etch rate while the preliminary touch sensor wiring is partially etched.

The touch sensor electrode 361 and the upper electrode 340 may be simultaneously formed using the same materials. In this case, the HIL, the HTL, the ETL, the EIL, etc. except the EL may be disposed in the transparent region 30 on the substrate 110. Alternatively, the touch sensor electrode 361 and the lower electrode 290 may be simultaneously formed using the same materials.

In some example embodiments, as illustrated in FIG. 18, the touch sensor electrode 361 and the active layer 130 may be simultaneously formed using the same materials. For example, the active layer 130 may include an oxide semiconductor, and the touch sensor electrode 361 may serve as a metal by performing an impurity implantation process. In this case, the gate insulation layer 150 may cover both lateral portions of the touch sensor electrode 361. For example, a thickness of the touch sensor electrode 361 may be less than that of the active layer 130, and the touch sensor electrode 361 may be substantially transparent. In addition, the touch sensor wiring 272 and the touch sensor electrode 361 may include different materials from each other.

As the OLED device 500 in accordance with example embodiments removes the gate insulation layer 150, the insulating interlayer 190, and the planarization layer 270 each in the transparent region 30, a transmissivity of the transparent region 30 included in the OLED device 500 may be relatively increased.

Figure 19:
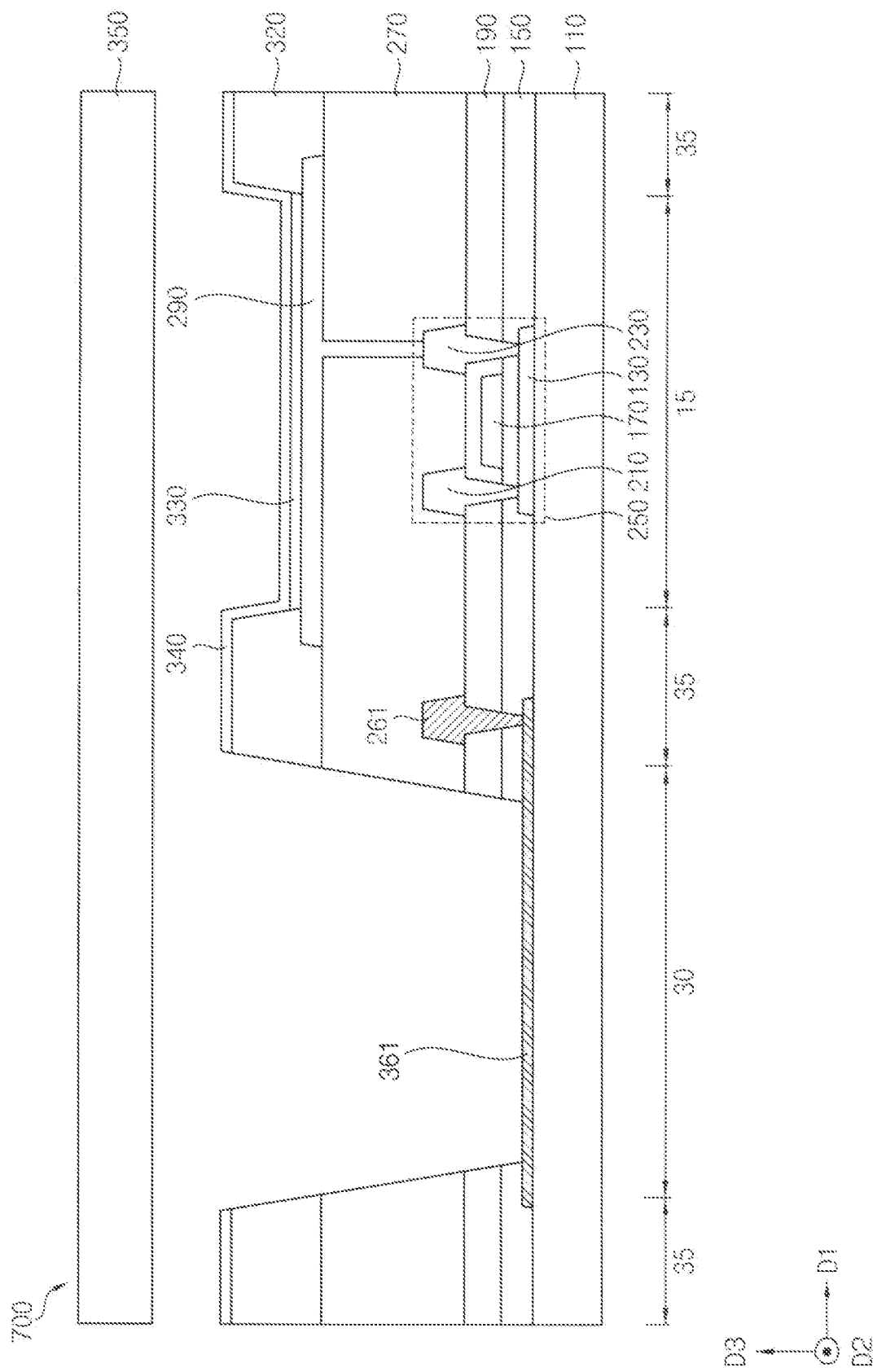
FIG. 19 is a cross-sectional view illustrating an OLED device in accordance with example embodiments.
Figure 20:
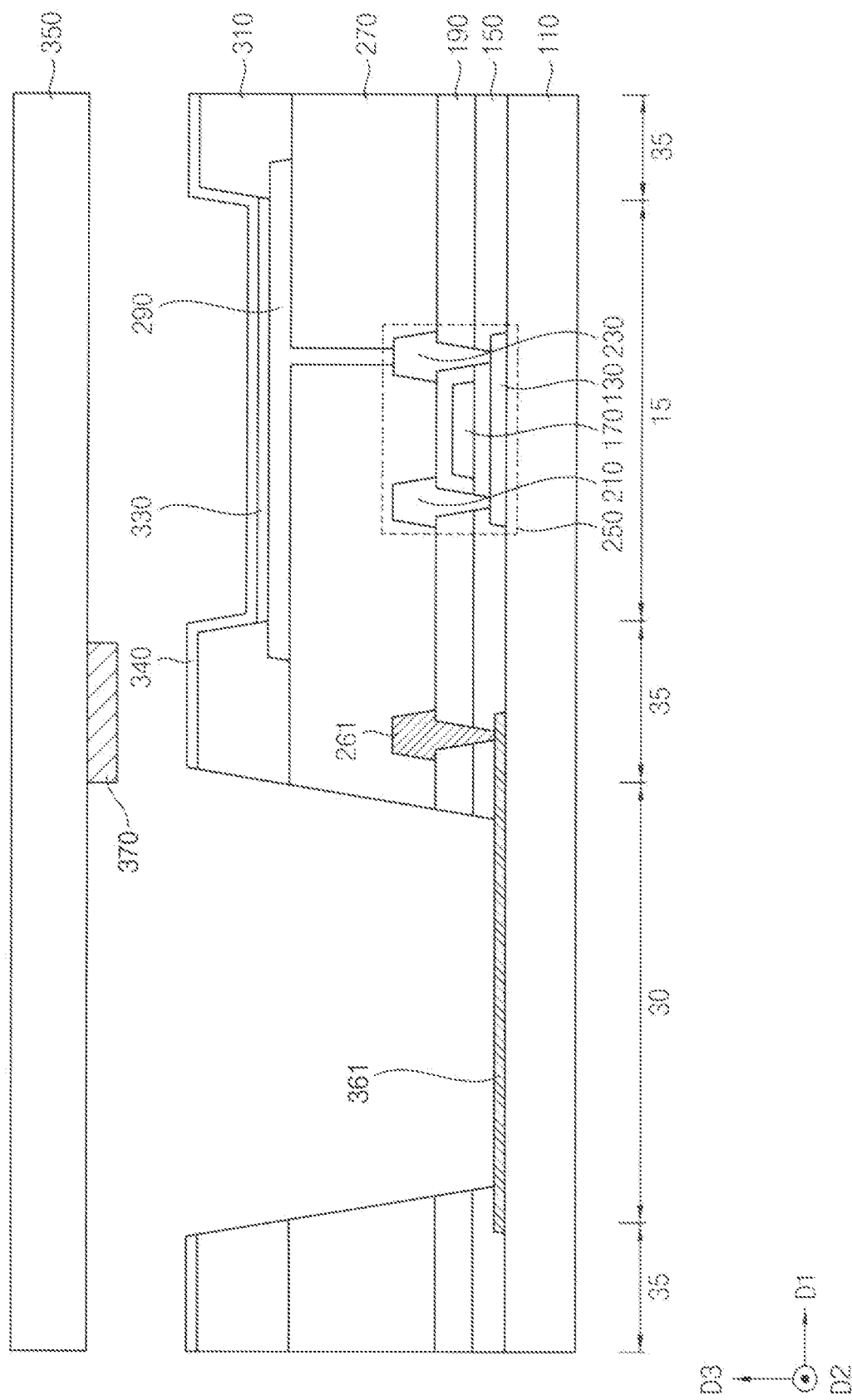
FIG. 20 is a cross-sectional view illustrating an OLED device in accordance with example embodiments.

FIG. 19 is a cross-sectional view illustrating an OLED device in accordance with example embodiments, and FIG. 20 is a cross-sectional view illustrating an OLED device in accordance with example embodiments. OLED devices illustrated in FIGS. 19 and 20 may have a configuration substantially the same as or similar to that of an OLED device 100 described with reference to FIG. 4 except a pixel defining layer 320, a touch sensor electrode 361, a touch sensor wiring 261, and a light blocking member 370. In FIGS. 19 and 20, detailed descriptions for elements that are substantially the same as or similar to elements described with reference to FIG. 4 may not be repeated.

Referring to FIGS. 4 and 19, an OLED device 700 may include a substrate 110, a gate insulation layer 150, an insulating interlayer 190, a planarization layer 270, a semiconductor element 250, a touch sensor wiring 261, a pixel structure, a touch sensor electrode 361, a pixel defining layer 320, an encapsulation substrate 350, etc. Here, the pixel structure may include a lower electrode 290, a light emitting layer 330, and an upper electrode 340, and the semiconductor element 250 may include an active layer 130, a gate electrode 170, a source electrode 210, and a drain electrode 230.

The touch sensor electrode 361 may be disposed in the transparent region 30 on the substrate 110. The touch sensor electrode 361 and the active layer 130 may be simultaneously formed using the same materials. For example, the active layer 130 may include an oxide semiconductor, and the touch sensor electrode 361 may serve as a metal by performing an impurity implantation process. A thickness of the touch sensor electrode 361 may be less than that of the active layer 130, and the touch sensor electrode 361 may be substantially transparent. In example embodiments, the touch sensor electrode 361 may extend in the first direction D1 on the substrate 110, may overlap at least a portion of opaque region 35. The touch sensor wiring 261 may be disposed on the touch sensor electrode 361 extending in the first direction D1.

The gate insulation layer 150 may be disposed on the substrate 110. The gate insulation layer 150 may expose a portion of the touch sensor electrode 361 in the transparent region 30. In addition, the gate insulation layer 150 may have a first contact hole exposing a portion of the touch sensor electrode 361 in the opaque region 35.

The insulating interlayer 190 may be disposed on the gate insulation layer 150. The insulating interlayer 190 may expose a portion of the touch sensor electrode 361 in the transparent region 30. In addition, the insulating interlayer 190 may have a second contact hole exposing the first contact hole in the opaque region 35. The first contact hole and the second contact hole may be formed simultaneously using one mask.

The touch sensor wiring 261 may be disposed in the opaque region 35 on the insulating interlayer 190. For example, the touch sensor wiring 261 may be located on a portion under which the touch sensor electrode 361 is disposed. The touch sensor wiring 261 may be in contact with the touch sensor electrode 361 via the first and second contact holes. That is, the touch sensor wiring 261 may be electrically connected to the touch sensor electrode 361.

The source electrode 210 may be disposed in the opaque region 35 on the planarization layer 270. In example embodiments, the pixel defining layer 320 may be substantially opaque such that an external light is prevented from being reflected from the touch sensor wiring 261 disposed under the pixel defining layer 320. For example, the pixel defining layer 320 may have light blocking materials to reduce the reflection of the external light. The pixel defining layer 320 may include organic materials or inorganic materials.

In some example embodiments, as illustrated in FIG. 20, a light blocking member 370 may be disposed on the pixel defining layer 310. For example, the light blocking member 370 may be disposed on a lower surface of the encapsulation substrate 350 to overlap the pixel defining layer 310. When the pixel defining layer 310 is substantially transparent, an external light may be reflected from the touch sensor wiring 261 disposed under the pixel defining layer 310. In order to prevent this, the light blocking member 370 having an opaque color may overlap the touch sensor wiring 261.

For example, the light blocking member 370 may have light blocking materials to reduce the reflection of the external light. In addition, the light blocking member 370 may include a resin having the light blocking materials.

Figure 21:
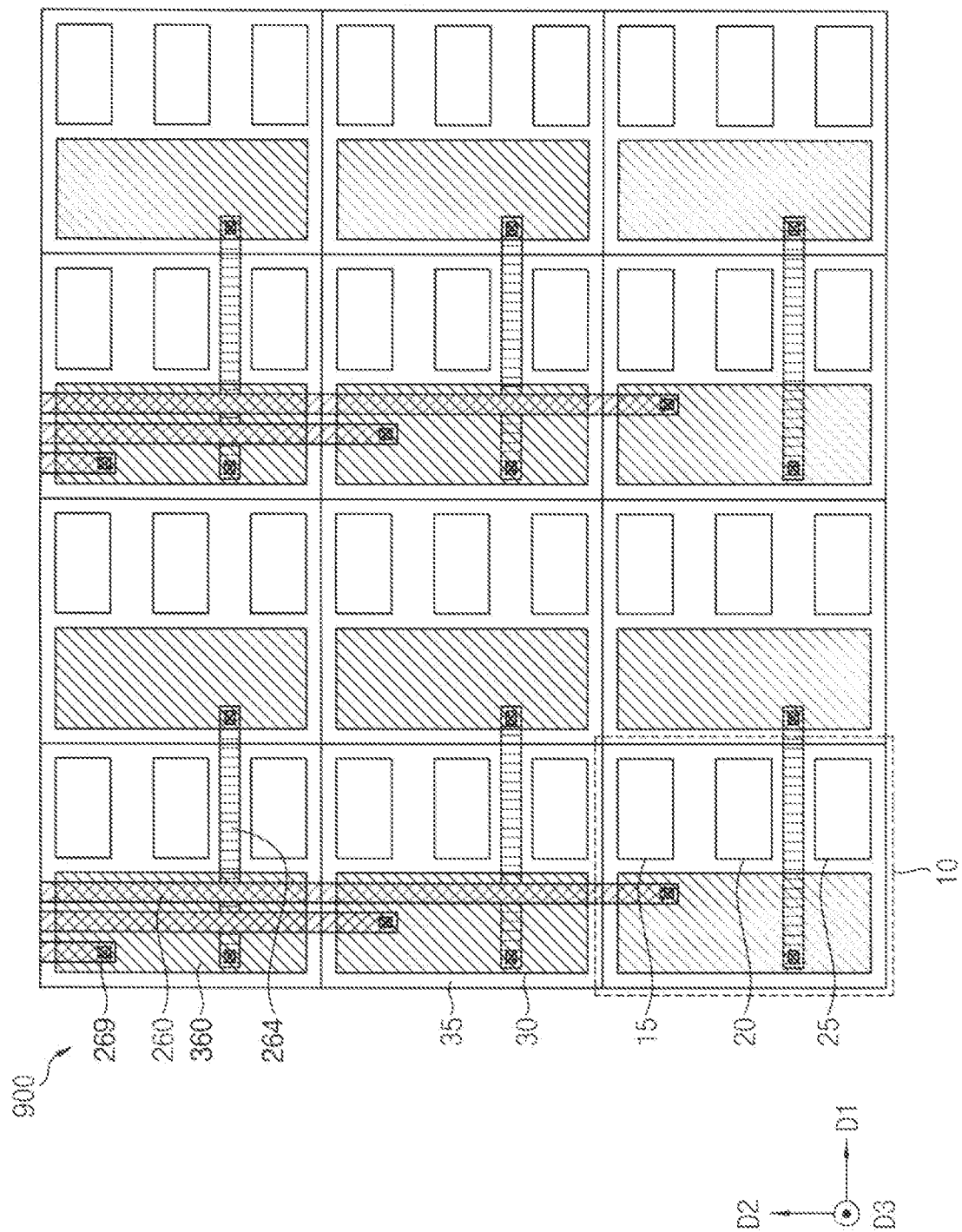
FIG. 21 is a planar view illustrating an OLED device in accordance with example embodiments.
Figure 23:
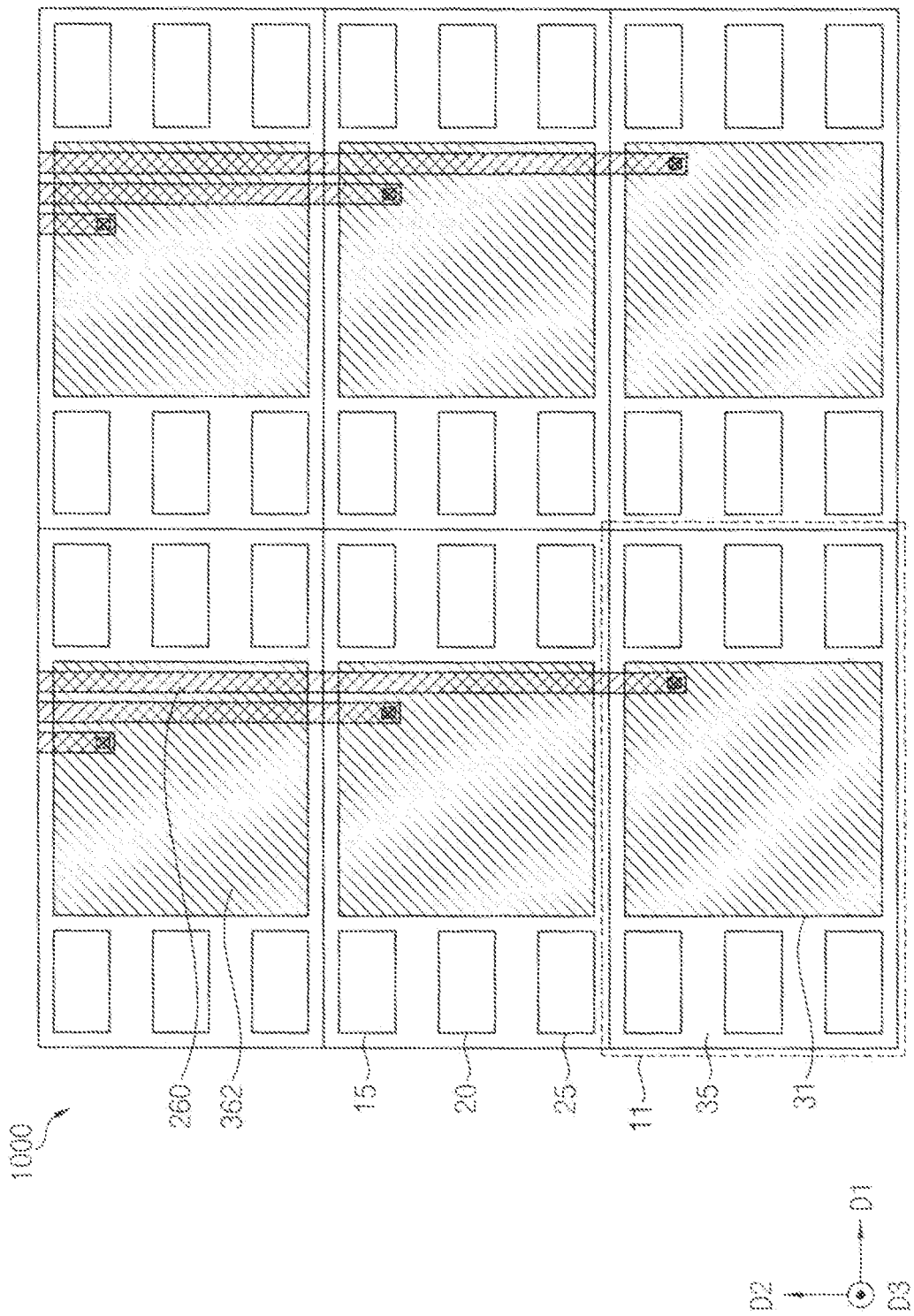
FIG. 23 is a planar view illustrating an OLED device in accordance with example embodiments.
Figure 24:
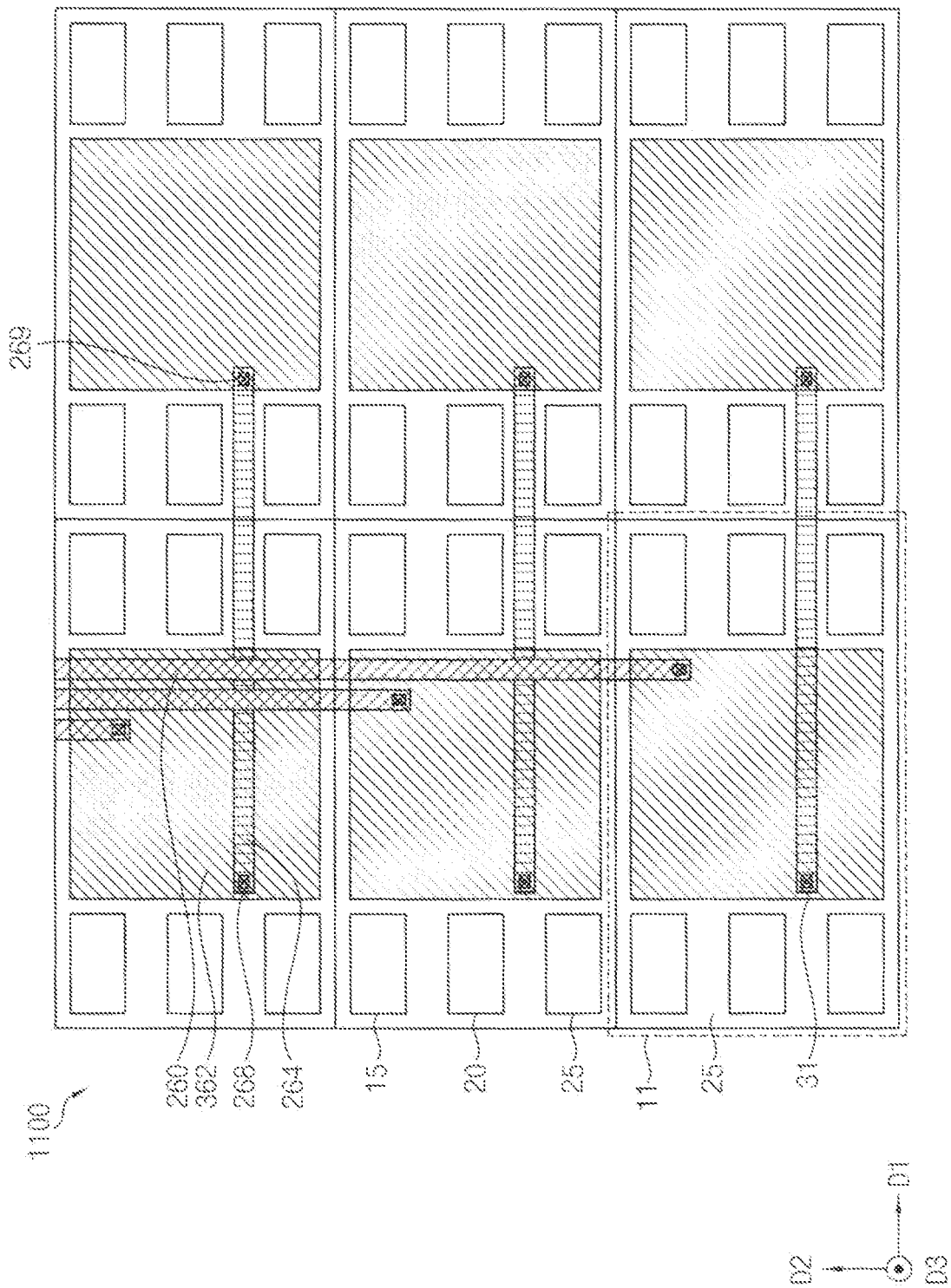
FIG. 24 is a planar view illustrating an OLED device in accordance with example embodiments.

FIG. 21 is a planar view illustrating an OLED device in accordance with example embodiments, and FIG. 22 is a planar view for describing a touch sensor electrode, a touch sensor wiring, and a connection wiring included in the OLED device of FIG. 21. FIG. 23 is a planar view illustrating an OLED device in accordance with example embodiments, and FIG. 24 is a planar view illustrating an OLED device in accordance with example embodiments. OLED devices illustrated in FIGS. 21, 22, 23, and 24 may have a configuration substantially the same as or similar to that of an OLED device 100 described with reference to FIGS. 1, 2, and 3. In FIGS. 21, 22, 23, and 24, detailed descriptions for elements that are substantially the same as or similar to elements described with reference to FIGS. 1, 2, and 3 may not be repeated.

Referring to FIGS. 1, 2, 3, 21, and 22, an OLED device 900 may include a plurality of pixel regions. One pixel region 10 among a plurality of pixel regions may include first, second, and third sub-pixel regions 15, 20, and 25, a transparent region 30, and an opaque region 35. For example, the pixel regions 10 may be arranged in first and second directions D1 and D2 on the entire substrate included in the OLED device 900. Here, the first direction D1 may be parallel to an upper surface of the substrate, and the second direction D2 may be perpendicular to the first direction D1. In addition, the opaque region 35 may extend in the first and second directions D1 and D2 to surround the first, second, and third sub-pixel regions 15, 20, and 25 and the transparent region 30.

The touch sensor wiring 260 may extend in the second direction D2 on the substrate, and may be electrically connected to the touch sensor electrode 360 disposed in the pixel regions 10 that are arranged in the second direction D2 among a plurality of the pixel regions 10. In example embodiments, adjacent two pixel regions 10 in the first direction D1 among the pixel regions 10 may be defined as first and second pixel regions, respectively. The touch sensor electrode 360 disposed in the first pixel region may overlap the touch sensor wiring 260, and may be in directly contact with the touch sensor wiring 260 via the contact hole 269. Meanwhile, the touch sensor electrode 360 disposed in the second pixel region may not overlap the touch sensor wiring 260, and may be electrically connected to the touch sensor electrode 360 disposed in the first pixel region through the connection wiring 264. For example, the connection wiring 264 may have a contact hole 271 overlapping the touch sensor electrode 360 of the first pixel region and a contact hole 272 overlapping the touch sensor electrode 360 of the second pixel region.

The touch sensor electrode 360 of the first pixel region and the touch sensor electrode 360 of the second pixel region may be electrically connected to each other via the contact holes 271 and 272, respectively. In this case, when a user contacts a portion corresponding to at least one of the touch sensor electrode 360 of the first pixel region and the touch sensor electrode 360 of the second pixel region, the OLED device 900 may sense a contact of the user.

In another example embodiment, as illustrated in FIG. 23, the OLED device 1000 may include a pixel region 11 having the transparent region that the transparent region 30 of the first pixel region and the transparent region 30 of the second pixel region are combined, and the transparent region may be defined as a transparent region 31. In one pixel region 11 included in the OLED device 1000, the transparent region 31 may be located between two of first, second, and third sub-pixel regions 15, 20, and 25. The touch sensor electrode 362 may be disposed in the transparent region 31 that has a relatively large area (or size). The pixel regions 11 may be arranged in the first and second directions D1 and D2.

The touch sensor wiring 260 may extend in the second direction D2 on the substrate, and may be electrically connected to the touch sensor electrode 362 disposed in the pixel regions 11 that are arranged in the second direction D2 among a plurality of the pixel regions 11. In this case, when the user contacts a portion corresponding to the touch sensor electrode 362 having a relatively large area, the OLED device 1000 may sense a contact of the user.

In example embodiments, since the touch sensor wiring 260 extends in the second direction D2, the touch sensor wiring 260 may be connected to the touch sensor electrodes 362 arranged in the second direction D2, but not being limited thereto. In some example embodiments, the touch sensor wiring 260 may extend in the first direction D1, and may be connected to the touch sensor electrode 362 arranged in the first direction D1.

In still another example embodiment, as illustrated in FIG. 24, the OLED device 1100 may include the transparent region 31 that has a relatively large area, and the touch sensor electrode 362 may be disposed in the transparent region 31.

Adjacent two pixel regions 11 in the first direction D1 among the pixel regions 11 may be defined as first and second pixel regions, respectively. The touch sensor electrode 362 disposed in the first pixel region may overlap the touch sensor wiring 260, and may be in directly contact with the touch sensor wiring 260 via a contact hole. Meanwhile, the touch sensor electrode 362 disposed in the second pixel region may not overlap the touch sensor wiring 260, and may be electrically connected to the touch sensor electrode 362 disposed in the first pixel region through a connection wiring 264. For example, the connection wiring 264 may have a contact hole 268 overlapping the touch sensor electrode 362 of the first pixel region and a contact hole 269 overlapping the touch sensor electrode 362 of the second pixel region. The touch sensor electrode 362 of the first pixel region and the touch sensor electrode 362 of the second pixel region may be electrically connected to each other via the contact holes 268 and 269, respectively. In this case, when a user contacts a portion corresponding to at least one of the touch sensor electrode 362 of the first pixel region and the touch sensor electrode 362 of the second pixel region, the OLED device 1100 may sense a contact of the user. Accordingly, since the number of the touch sensor wiring 260 is decreased, a transmissivity of the OLED device 1100 may be relatively increased.

Figure 25:
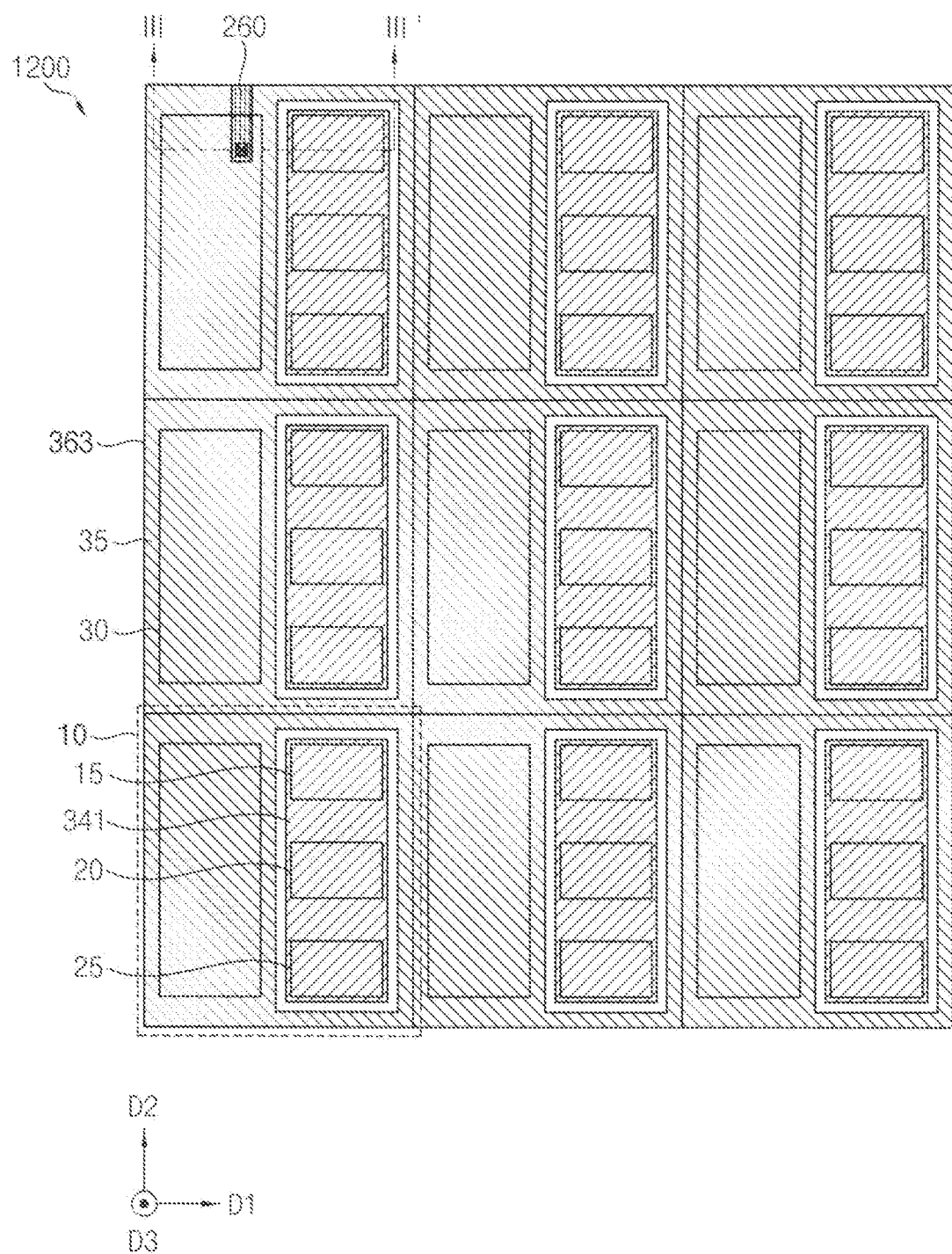
FIG. 25 is a planar view illustrating an OLED device in accordance with example embodiments.
Figure 26:
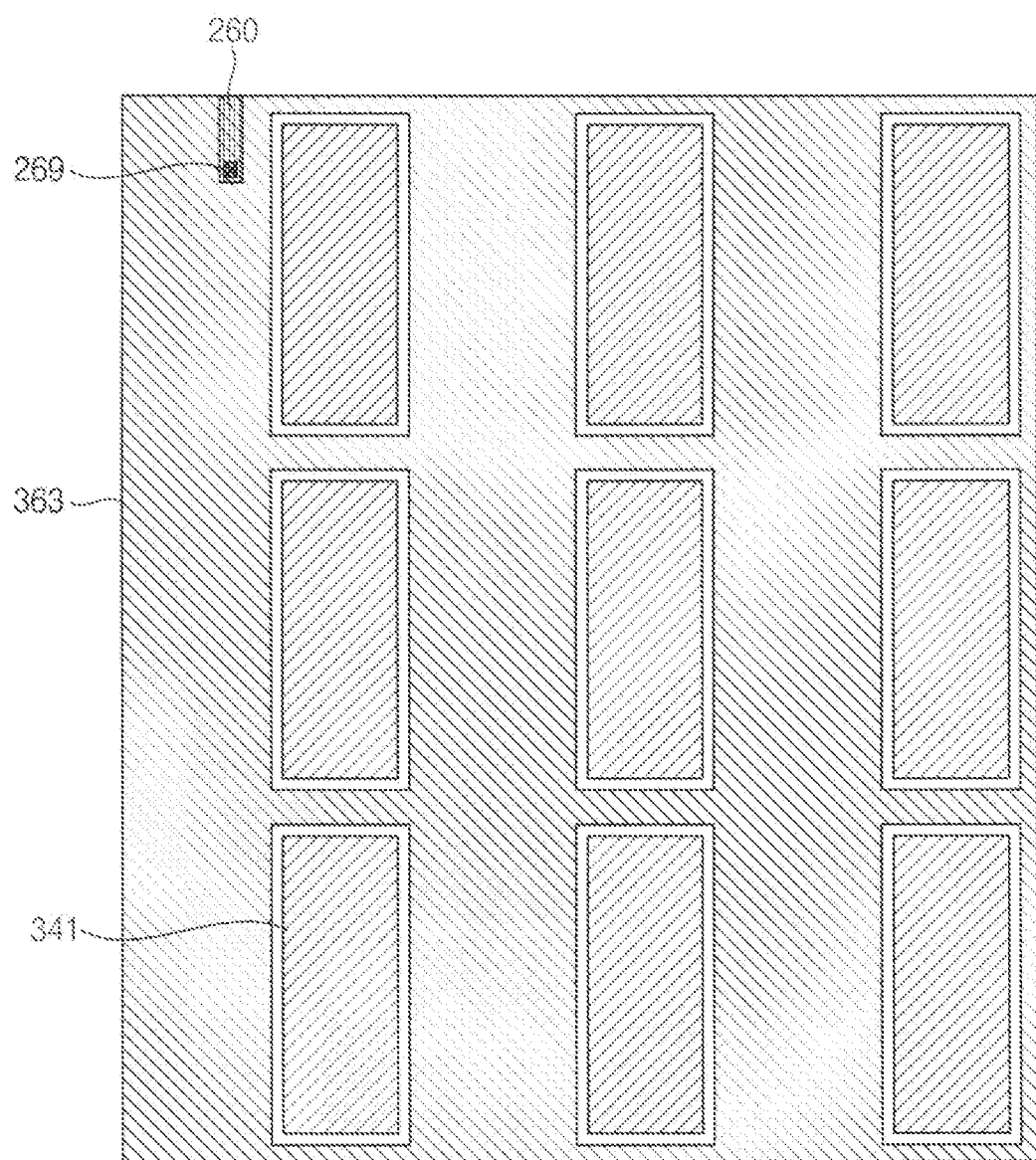
FIG. 26 is a planar view for describing a touch sensor electrode, a touch sensor wiring, and an upper electrode included in the OLED device of FIG. 25.
Figure 27:
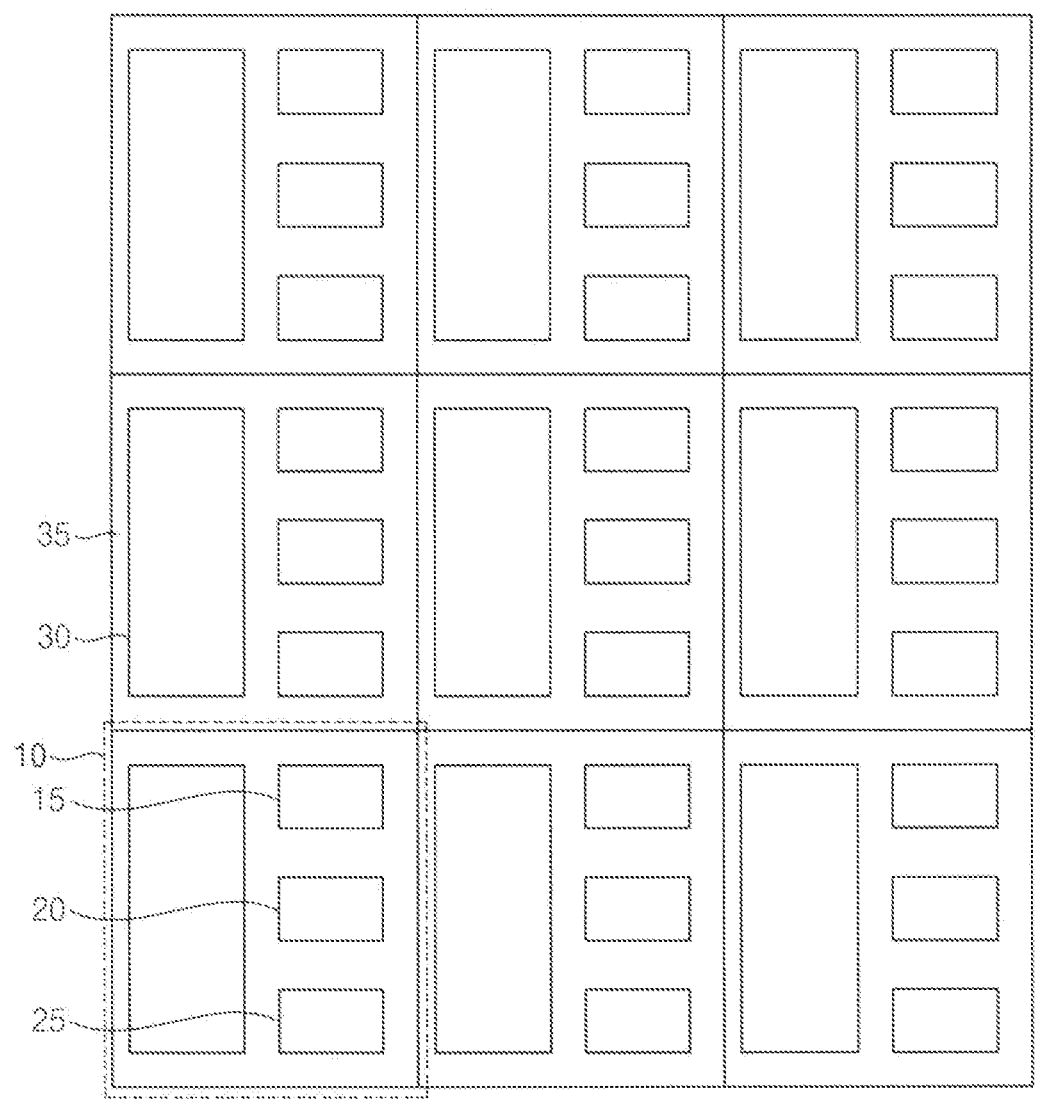
FIG. 27 is a planar view for describing a pixel region included in the OLED device of FIG. 25.

FIG. 25 is a planar view illustrating an OLED device in accordance with example embodiments, and FIG. 26 is a planar view for describing a touch sensor electrode, a touch sensor wiring, and an upper electrode included in the OLED device of FIG. 25. FIG. 27 is a planar view for describing a pixel region included in the OLED device of FIG. 25. An OLED device 1200 illustrated in FIGS. 25, 26, and 27 may have a configuration substantially the same as or similar to that of an OLED device 100 described with reference to FIGS. 1, 2, and 3 except a touch sensor electrode 363 and a upper electrode 341. In FIGS. 25, 26, and 27, detailed descriptions for elements that are substantially the same as or similar to elements described with reference to FIGS. 1, 2, and 3 may not be repeated.

Referring to FIGS. 1, 2, 3, 25, 26, and 27, an OLED device 1200 may include a plurality of pixel regions. One pixel region 10 among a plurality of pixel regions may include first, second, and third sub-pixel regions 15, 20, and 25, a transparent region 30, and an opaque region 35. For example, the pixel regions 10 may be arranged in first and second directions D1 and D2 on the entire substrate included in the OLED device 1200. Here, the first direction D1 may be parallel to an upper surface of the substrate, and the second direction D2 may be perpendicular to the first direction D1. In addition, the opaque region 35 may extend in the first and second directions D1 and D2 to surround the first, second, and third sub-pixel regions 15, 20, and 25 and the transparent region 30.

First, second, and third sub-pixels may be disposed in the first, second, and third sub-pixel regions 15, 20, and 25, respectively. The upper electrode 341 may be disposed in the first, second, and third sub-pixel regions 15, 20, and 25 on the first, second, and third sub-pixels.

The touch sensor electrode 363 may be disposed in the transparent region 30 and a first portion of the opaque region 35 on the substrate. The touch sensor electrode 363 may expose the first, second, and third sub-pixel regions 15, 20, and 25 and a second portion of the opaque region 35 surrounding the first, second, and third sub-pixel regions 15, 20, and 25. The touch sensor electrode 363 and the upper electrode 341 may be spaced apart from each other, and the touch sensor electrode 363 may substantially surround the upper electrode 341.

In example embodiments, adjacent two pixel regions 10 among the pixel regions 10 may be defined as first and second pixel regions, respectively. The touch sensor electrode 363 may be integrally formed in the first and second pixel regions to expose two of the sub-pixel regions 15, 20, and 25 and the second portion of the opaque region 35 included in the first and second pixel regions each. In this case, the upper electrode 341 may be disposed as a substantially island shape in the two of the first, second, and third sub-pixel regions 15, 20, and 25 included in the first and second pixel regions, In this way, the touch sensor electrode 363 may be integrally formed in adjacent at least two pixel regions 10. As illustrated in FIGS. 25 and 26, the touch sensor electrode 363 may be integrally formed in adjacent nine (3*3) pixel regions 10.

The touch sensor wiring 260 may be disposed in the transparent region 30 and the opaque region 35 on the substrate. For example, the touch sensor wiring 260 may be disposed under the integrally formed touch sensor electrode 363. The touch sensor wiring 260 may extend in the second direction D2, and may have a planar shape of a bar.

Figure 28:
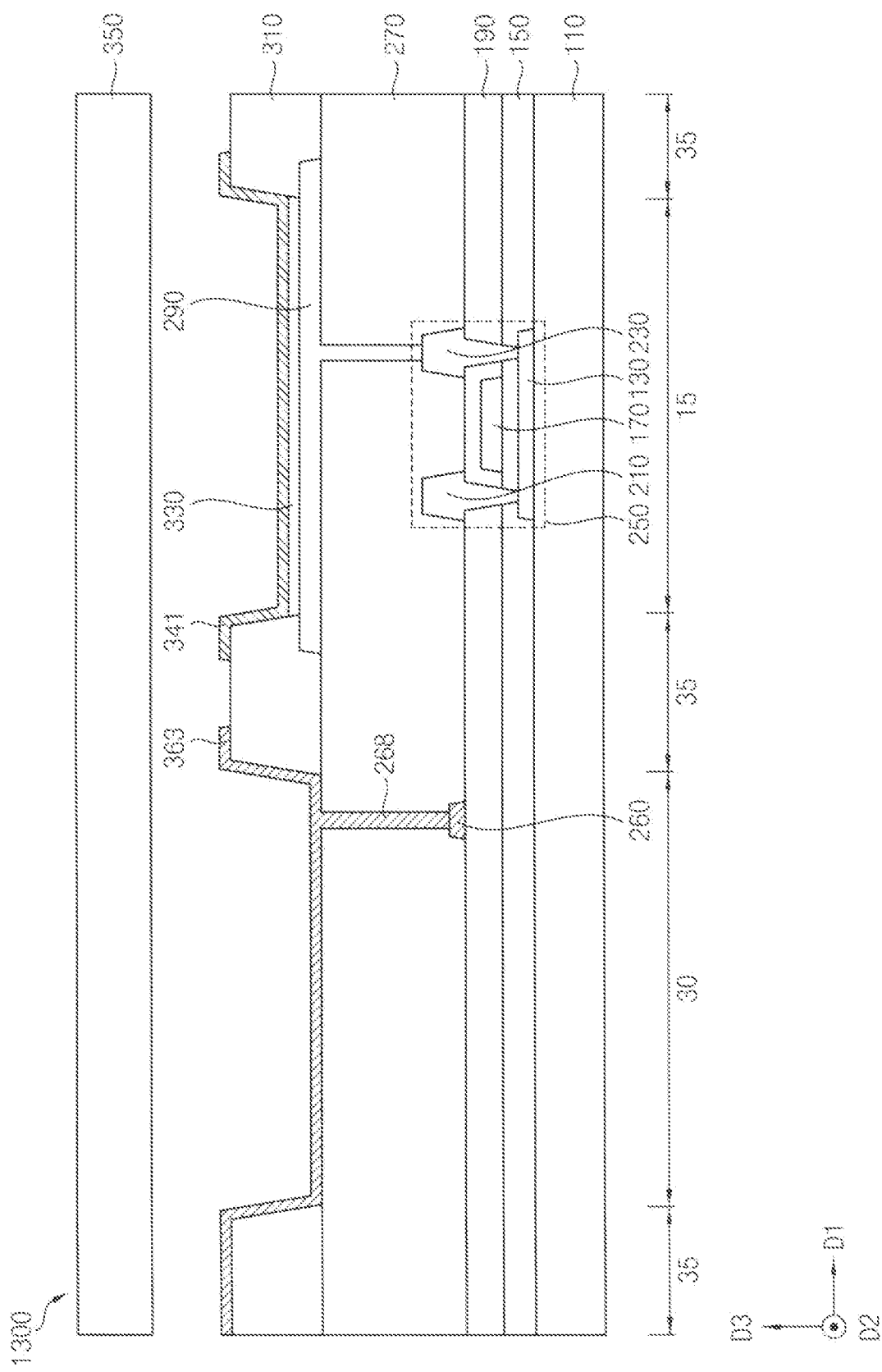
FIG. 28 is a cross-sectional view taken along a line III-III' of FIG. 25.
Figure 29:
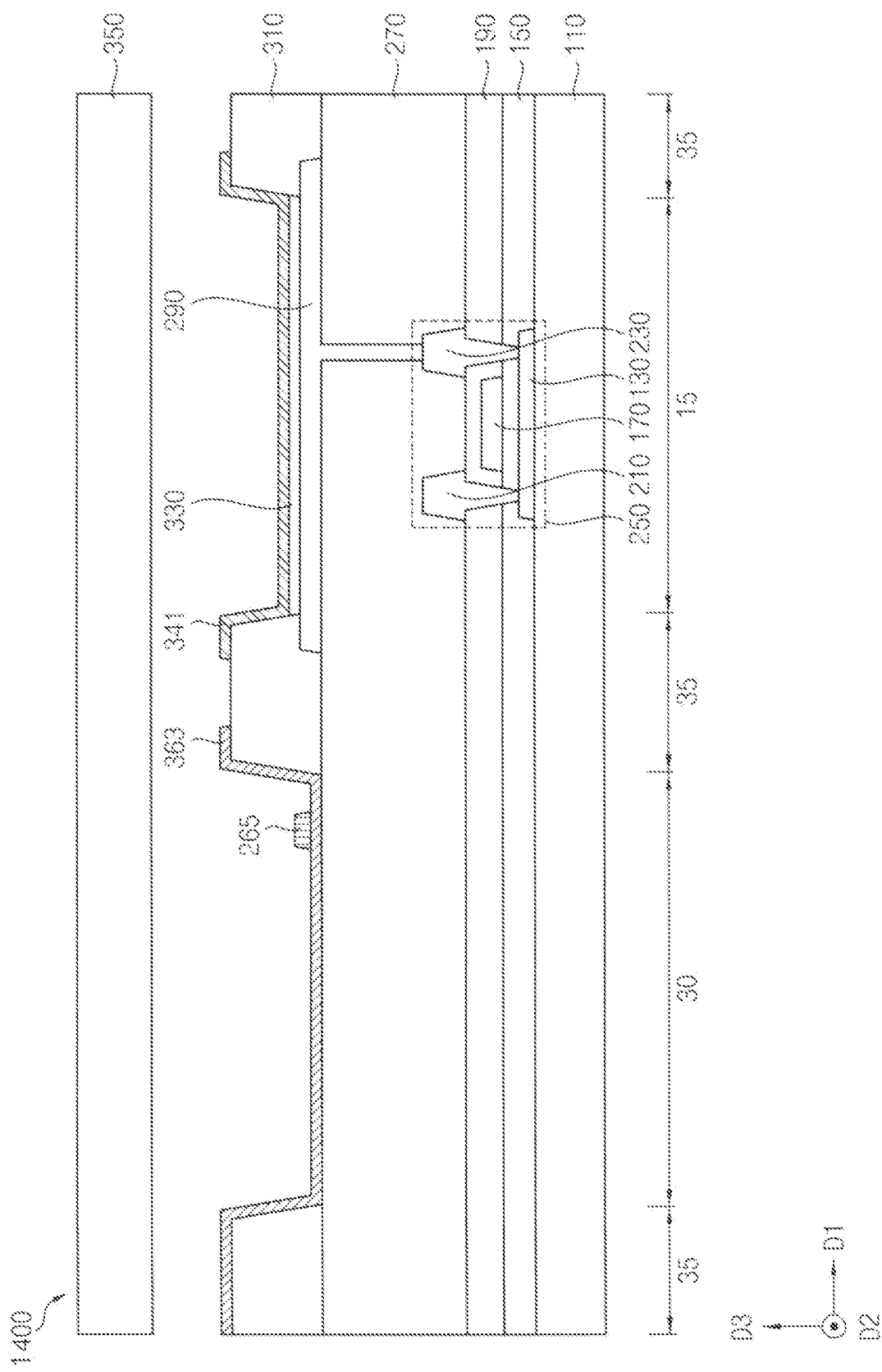
FIG. 29 is a cross-sectional view illustrating an OLED device in accordance with example embodiments.

FIG. 28 is a cross-sectional view taken along a line III-III' of FIG. 25, and FIG. 29 is a cross-sectional view illustrating an OLED device in accordance with example embodiments. OLED devices illustrated in FIGS. 28 and 29 may have a configuration substantially the same as or similar to that of an OLED device 100 described with reference to FIG. 4. In FIGS. 28 and 29, detailed descriptions for elements that are substantially the same as or similar to elements described with reference to FIG. 4 may not be repeated.

Referring to FIGS. 4 and 28, an OLED device 1300 may include a substrate 110, a gate insulation layer 150, an insulating interlayer 190, a planarization layer 270, a semiconductor element 250, a touch sensor wiring 260, a pixel structure, a touch sensor electrode 363, a pixel defining layer 310, an encapsulation substrate 350, etc. Here, the pixel structure may include a lower electrode 290, a light emitting layer 330, and an upper electrode 341, and the semiconductor element 250 may include an active layer 130, a gate electrode 170, a source electrode 210, and a drain electrode 230.

The upper electrode 341 may be electrically connected to a low power supply voltage wiring (not shown) disposed in the opaque region 35 on the substrate 110 via a contact hole, and the low power supply voltage wiring may provide a low power supply voltage to the upper electrode 341.

The touch sensor electrode 363 and the upper electrode 341 may be simultaneously formed using the same materials, may be located at the same level. For example, after a preliminary electrode is entirely formed on the planarization layer 270, the pixel defining layer 310, the light emitting layer 330, the touch sensor electrode 363 and the upper electrode 341 may be formed by partially etching. The touch sensor electrode 363 and the upper electrode 341 may be spaced apart from each other in the opaque region 35 on the pixel defining layer 310. The touch sensor electrode 363 may be in contact with the touch sensor wiring 260 via a contact hole 268.

The touch sensor wiring 260 may extend in the second direction D2 under the integrally formed touch sensor electrode 363, and may have a planar shape of a bar.

In some example embodiments, as illustrated in FIG. 29, the touch sensor wiring 265 included in the OLED device 1400 may extend in the second direction D2 on the integrally formed touch sensor electrode 363, and may have a planar shape of a bar. Here, the upper electrode 341 may be electrically connected to a low power supply voltage wiring (not shown) disposed in the opaque region 35 on substrate 110 via a contact hole, and the low power supply voltage wiring may provide a low power supply voltage to the upper electrode 341. In addition, the touch sensor wiring 265 and the touch sensor electrode 363 may include different materials from each other. For example, after the touch sensor electrode 265 is formed, a preliminary touch sensor wiring may be formed on the entire substrate 110. In a process etching the preliminary touch sensor wiring, the touch sensor electrode 363 may not be etched using a difference of an etch rate while the preliminary touch sensor wiring is partially etched.

Figure 30:
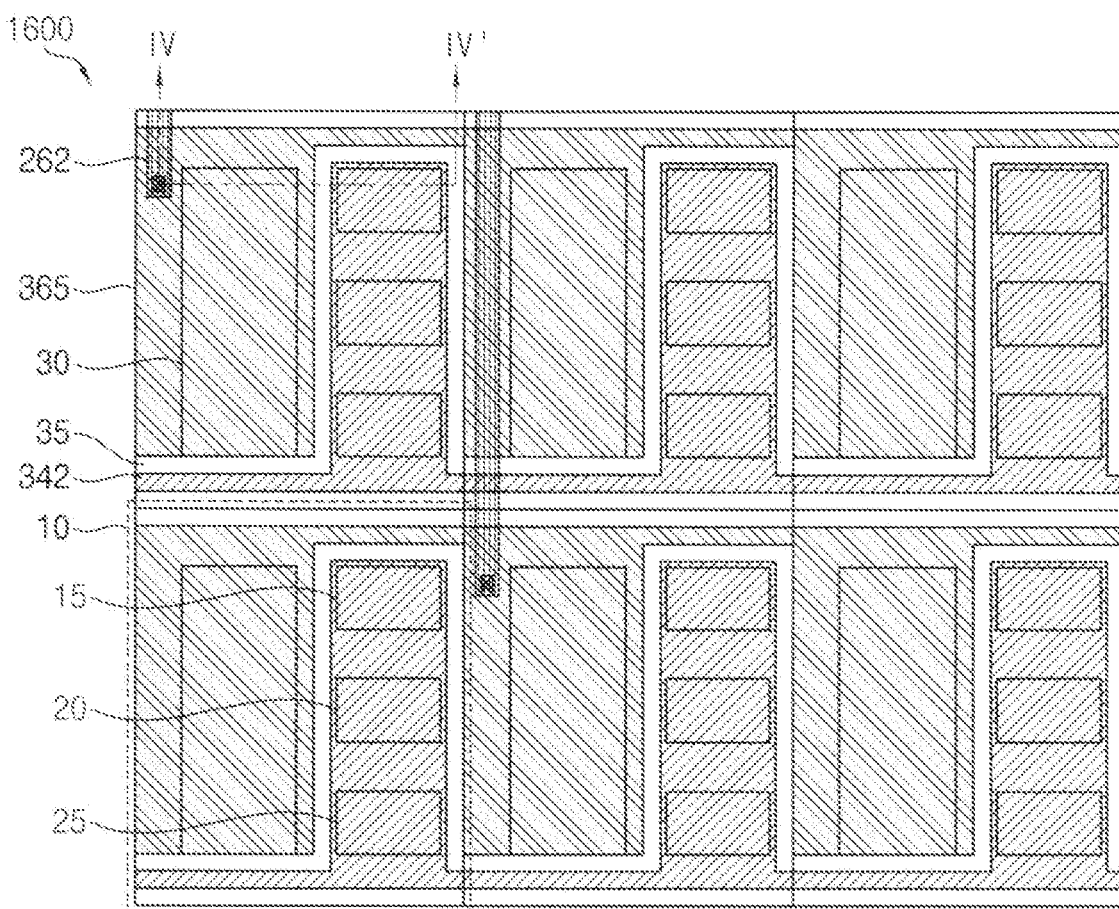
FIG. 30 is a planar view illustrating an OLED device in accordance with example embodiments.
Figure 31:
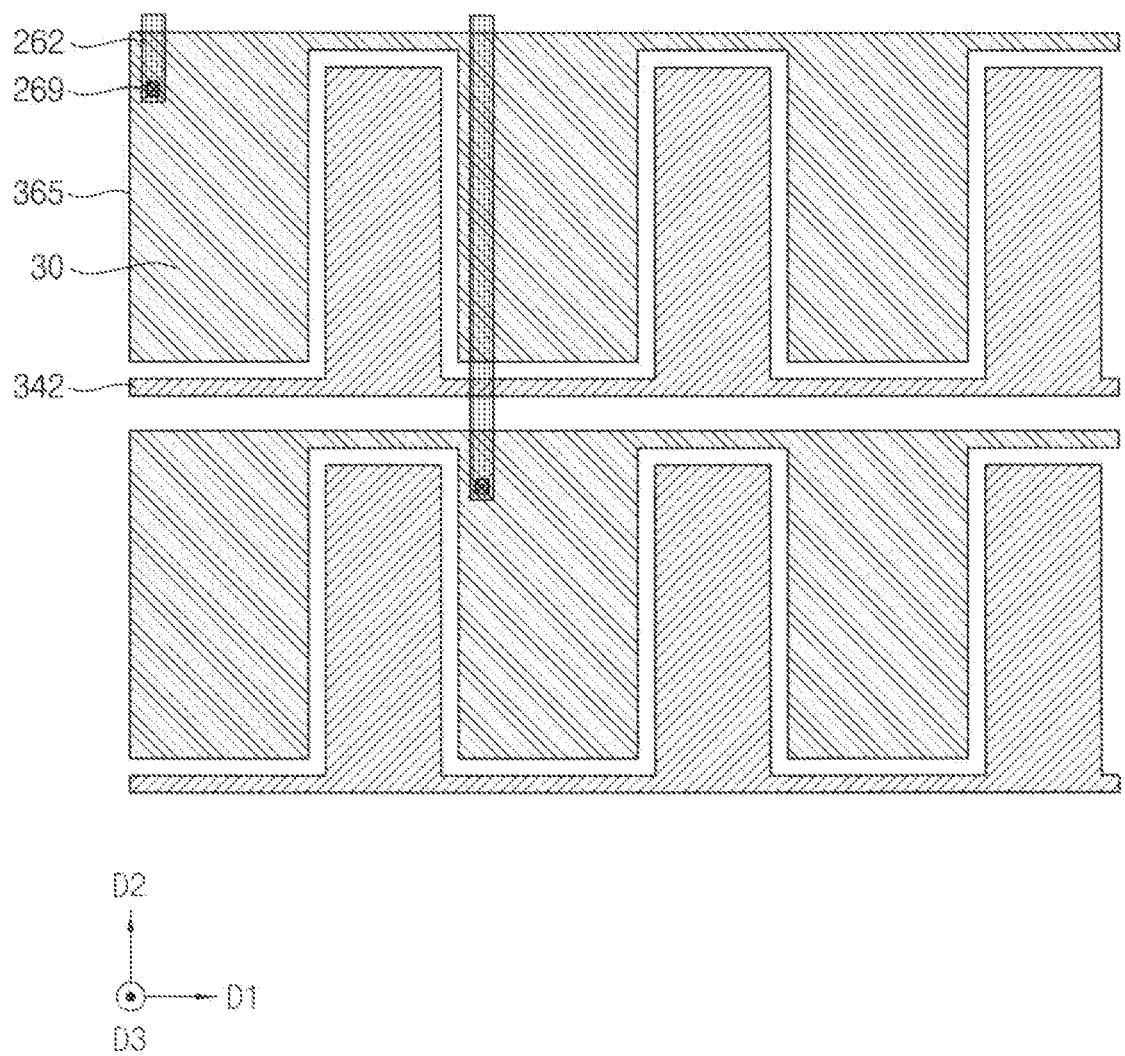
FIG. 31 is a planar view for describing a touch sensor electrode, a touch sensor wiring, and an upper electrode included in the OLED device of FIG. 30.

FIG. 30 is a planar view illustrating an OLED device in accordance with example embodiments, and FIG. 31 is a planar view for describing a touch sensor electrode, a touch sensor wiring, and an upper electrode included in the OLED device of FIG. 30. FIG. 32 is a planar view for describing a pixel region included in the OLED device of FIG. 30. An OLED device 1600 illustrated in FIGS. 30, 31, and 32 may have a configuration substantially the same as or similar to that of an OLED device 1200 described with reference to FIGS. 25, 26, and 27 except a touch sensor electrode 365 and a upper electrode 342. In FIGS. 30, 31, and 32, detailed descriptions for elements that are substantially the same as or similar to elements described with reference to FIGS. 25, 26, and 27 may not be repeated.

Referring to FIGS. 25, 26, 27, 30, 31, and 32, an OLED device 1600 may include a plurality of pixel regions. One pixel region 10 among a plurality of pixel regions may include first, second, and third sub-pixel regions 15, 20, and 25, a transparent region 30, and an opaque region 35. For example, the pixel regions 10 may be arranged in first and second directions D1 and D2 on the entire substrate included in the OLED device 1600. Here, the first direction D1 may be parallel to an upper surface of the substrate, and the second direction D2 may be perpendicular to the first direction D1. In addition, the opaque region 35 may extend in the first and second directions D1 and D2 to surround the first, second, and third sub-pixel regions 15, 20, and 25 and the transparent region 30.

First, second, and third sub-pixels may be disposed in the first, second, and third sub-pixel regions 15, 20, and 25, respectively. The upper electrode 342 may be disposed in the first, second, and third sub-pixel regions 15, 20, and 25 on the first, second, and third sub-pixels. For example, the upper electrode 342 may include a first extension extending in the first direction D1 on the substrate and a second extension extending in the second direction D2 on the substrate. Adjacent three pixel regions 10 in the first direction D1 among the pixel regions 10 may be defined as first, second, and third pixel regions, respectively. The second extensions of the upper electrode 342 each may be disposed on the first, second, and third sub-pixel regions 15, 20, and 25 included in the first pixel region, the first, second, and third sub-pixel regions 15, 20, and 25 included in the second pixel region, and the first, second, and third sub-pixel regions 15, 20, and 25 included in the third pixel region. A first side of the second extensions each of the upper electrode 342 may be in contact with the first extension extending in the first direction D1 of the upper electrode 342 in the bottom of the opaque region 35 included in the pixel region 10. The first and second extensions of the upper electrode 342 may be integrally formed, and may have a substantially W shape. A first side of the upper electrode 342 may be electrically connected to a low power supply voltage wiring (not shown) disposed in the border of the OLED device 1600, and the low power supply voltage wiring may provide a low power supply voltage to the upper electrode 342.

The touch sensor electrode 365 may be disposed in the transparent region 30. For example, the touch sensor electrode 365 may include a first extension extending in the first direction D1 on the substrate and a second extension extending in the second direction D2 on the substrate. Adjacent three pixel regions 10 in the first direction D1 among the pixel regions 10 may be defined as first, second, and third pixel regions, respectively. The second extensions of the touch sensor electrode 365 each may be disposed on the transparent region 30 included in the first pixel region, the transparent region 30 included in the second pixel region, and the transparent region 30 included in the third pixel region. A first side of the second extensions each of the touch sensor electrode 365 may be in contact with the first extension extending in the first direction D1 of the touch sensor electrode 365 in the top of the opaque region 35 included in the pixel region 10. The first extensions and the second extensions are disposed on an opposite side with respect to the transparent region 30. The first and second extensions of the touch sensor electrode 365 may be integrally formed, and may have a substantially M shape. The upper electrode 342 and the touch sensor electrode 365 may be spaced apart from each other on the substrate. The first extensions and the second extensions are interdigitated each other along a first direction D1.

The touch sensor wiring 262 may be disposed in the opaque region 35 on the substrate. For example, the touch sensor wiring 262 may be disposed under the integrally formed touch sensor electrode 365. The touch sensor wiring 262 may extend in the second direction D2, and may have a planar shape of a bar.

Figure 33:
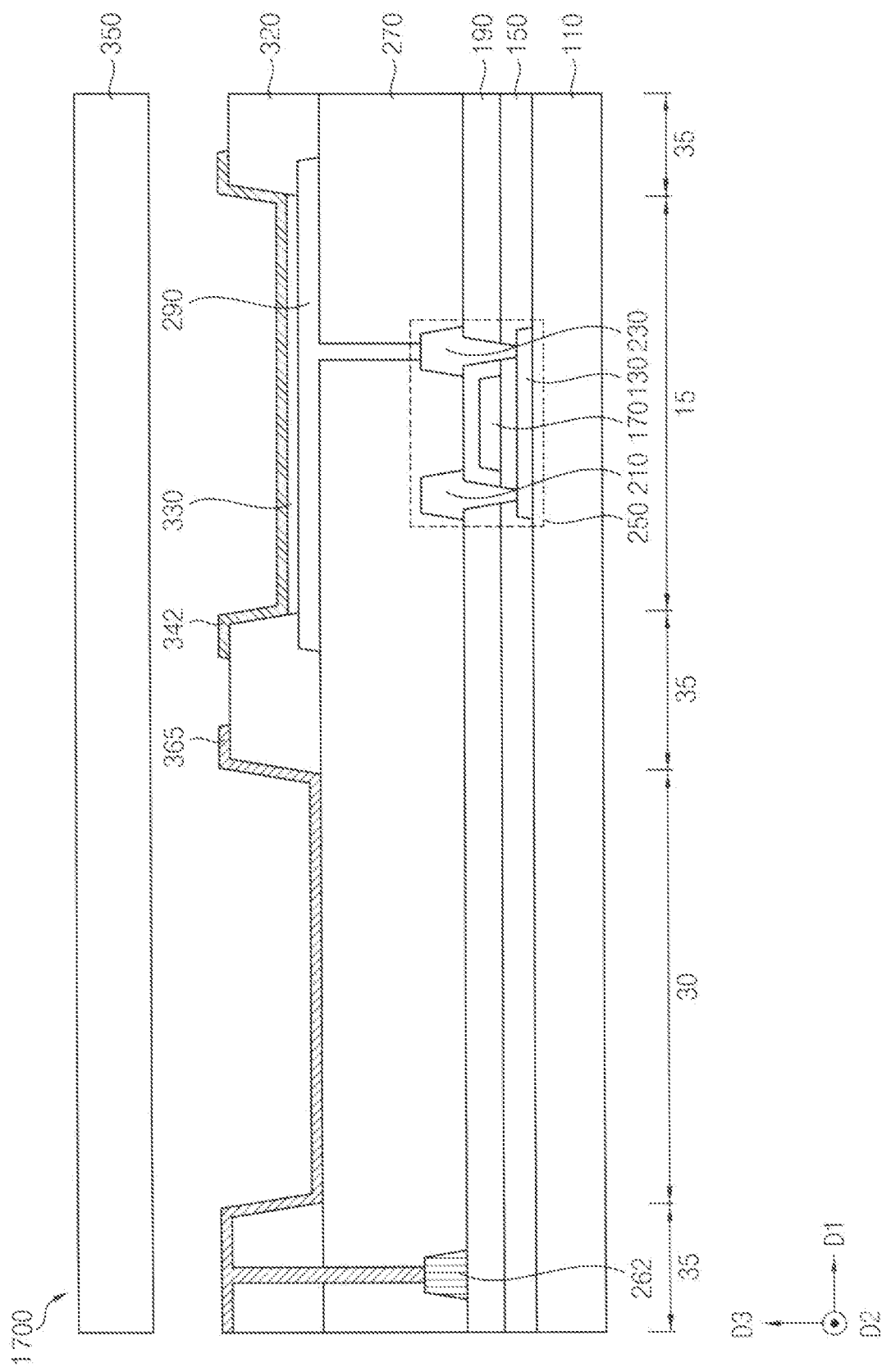
FIG. 33 is a cross-sectional view taken along a line IV-IV' of FIG. 30.
Figure 34:
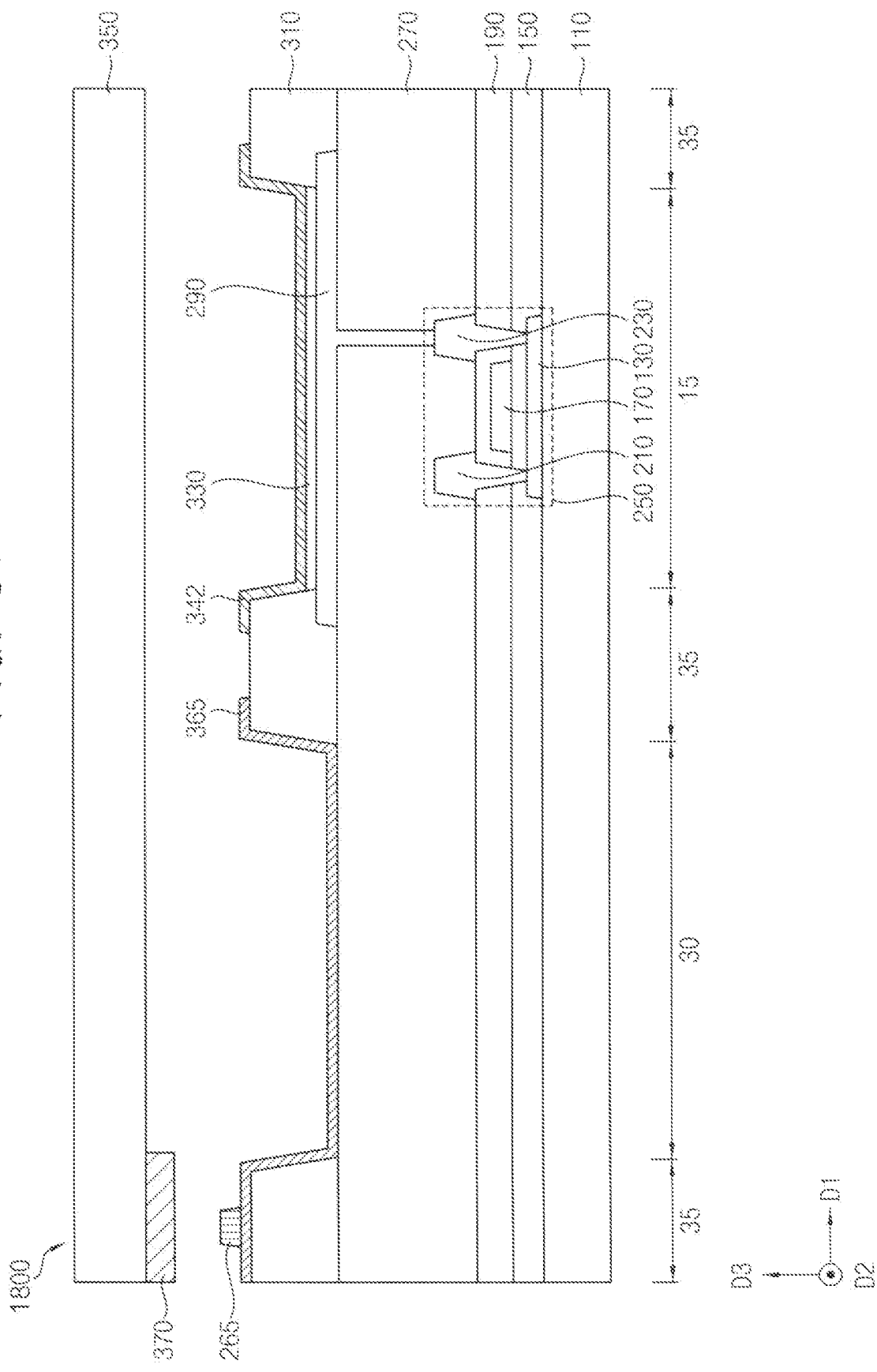
FIG. 34 is a cross-sectional view illustrating an OLED device in accordance with example embodiments.
Figure 35:
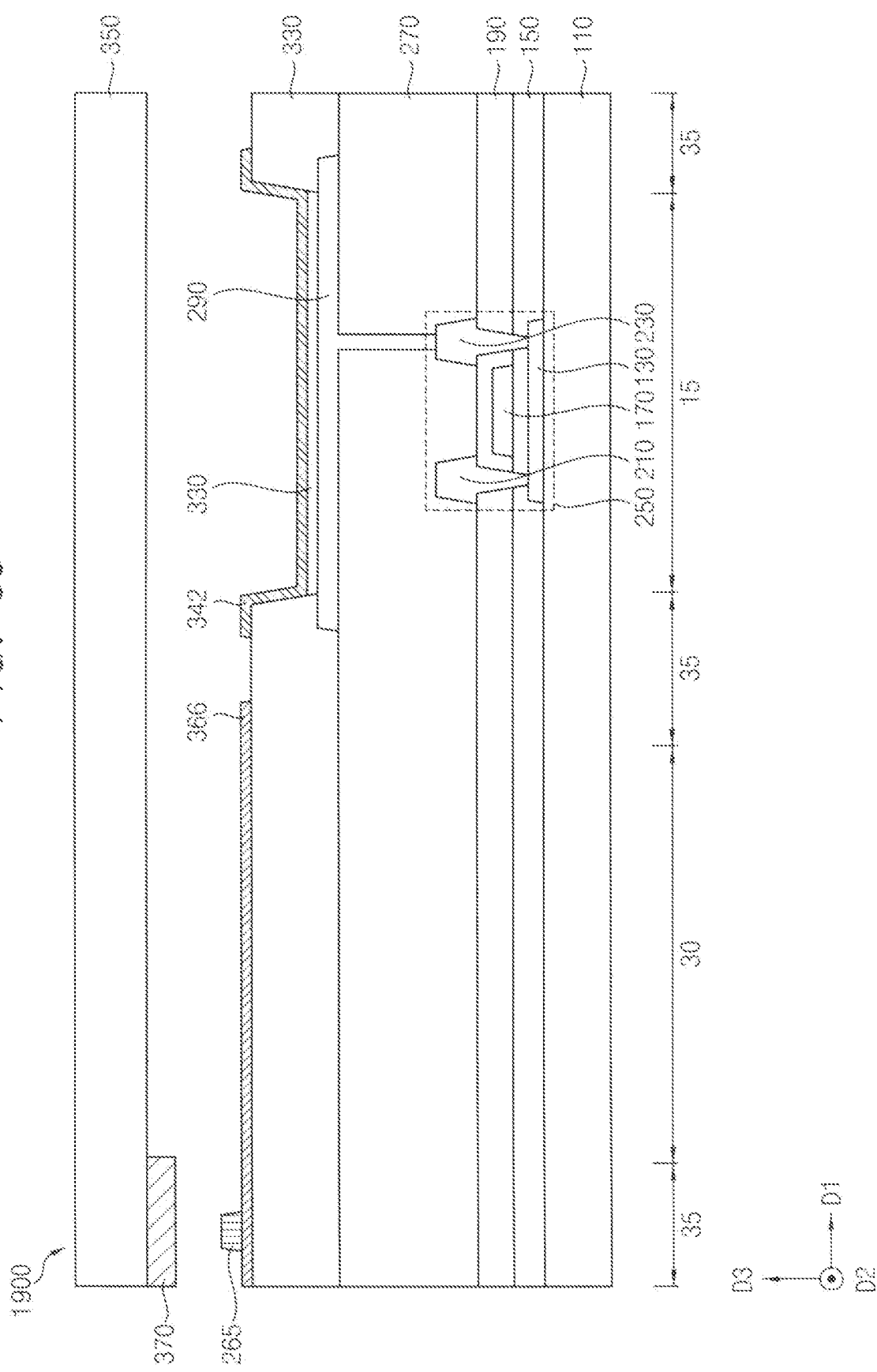
FIG. 35 is a cross-sectional view illustrating an OLED device in accordance with example embodiments.

FIG. 33 is a cross-sectional view taken along a line IV-IV' of FIG. 30, and FIG. 34 is a cross-sectional view illustrating an OLED device in accordance with example embodiments. FIG. 35 is a cross-sectional view illustrating an OLED device in accordance with example embodiments. OLED devices illustrated in FIGS. 33, 34 and 35 may have a configuration substantially the same as or similar to that of an OLED devices described with reference to FIGS. 28 and 29. In FIGS. 34, 35, and 39, detailed descriptions for elements that are substantially the same as or similar to elements described with reference to FIGS. 28 and 39 may not be repeated.

Referring to FIGS. 28, 29, and 33, an OLED device 1700 may include a substrate 110, a gate insulation layer 150, an insulating interlayer 190, a planarization layer 270, a semiconductor element 250, a touch sensor wiring 262, a pixel structure, a touch sensor electrode 365, a pixel defining layer 320, an encapsulation substrate 350, etc. Here, the pixel structure may include a lower electrode 290, a light emitting layer 330, and an upper electrode 342, and the semiconductor element 250 may include an active layer 130, a gate electrode 170, a source electrode 210, and a drain electrode 230.

The touch sensor electrode 365 and the upper electrode 342 may be simultaneously formed using the same materials, may be located at the same level. For example, after a preliminary electrode is entirely formed on the planarization layer 270, the pixel defining layer 310, the light emitting layer 330, the touch sensor electrode 365 and the upper electrode 342 may be formed by partially etching. The touch sensor electrode 365 and the upper electrode 342 may be spaced apart from each other in the opaque region 35 on the pixel defining layer 320. The touch sensor electrode 365 may be in contact with the touch sensor wiring 262 via a contact hole 269.

The touch sensor wiring 262 may extend along the second direction D2 in the opaque region 35 under the integrally formed touch sensor electrode 365, and may have a planar shape of a bar. In example embodiments, a thickness of the touch sensor wiring 262 may be the same as that of the source electrode 210 and the drain electrode 230 each. For example, the touch sensor wiring 262 may be substantially opaque. The touch sensor wiring and the source electrode 210 and the drain electrode 230 may be formed of the same material through the same process.

The pixel defining layer 320 may be disposed in the opaque region 35 on the planarization layer 270. In example embodiments, the pixel defining layer 320 may be substantially opaque such that an external light is prevented from being reflected from the touch sensor wiring 262 disposed under the pixel defining layer 320. For example, the pixel defining layer 320 may have light blocking materials to reduce the reflection of the external light.

In another example embodiment, as illustrated in FIG. 34, a light blocking member 370 included in the OLED device 1800 may be disposed on the pixel defining layer 310. For example, the light blocking member 370 may be disposed on a lower surface of the encapsulation substrate 350 to overlap the pixel defining layer 310. When the pixel defining layer 310 is substantially transparent, an external light may be reflected from the touch sensor wiring 265 disposed on the pixel defining layer 310. In order to prevent this, the light blocking member 370 which blocks light may overlap the touch sensor wiring 265. For example, the light blocking member 370 may have light blocking materials to reduce the reflection of the external light. In addition, the light blocking member 370 may include a resin having the light blocking materials. In this case, the touch sensor wiring 265 may have a relatively thick thickness. In addition, the touch sensor wiring 265 and the touch sensor electrode 365 may include different materials from each other. For example, after the touch sensor electrode 365 is formed, a preliminary touch sensor wiring may be formed on the entire substrate 110. In a process etching the preliminary touch sensor wiring, the touch sensor electrode 365 may not be etched using a difference of an etch rate while the preliminary touch sensor wiring is partially etched.

In still another example embodiment, as illustrated in FIG. 35, the OLED device 1900 may include a pixel defining layer 330 disposed in the transparent region 30 on the planarization layer 270. The pixel defining layer 330 may partially expose the lower electrode 290 disposed in the sub-pixel region 15, and may be entirely disposed in the transparent region 30. The touch sensor electrode 366 may be disposed on the pixel defining layer 330, and have a substantially even surface. The pixel defining layer 330 may be a transparent material. In addition, the touch sensor wiring 265 and the touch sensor electrode 366 may include different materials from each other.

Figure 36:
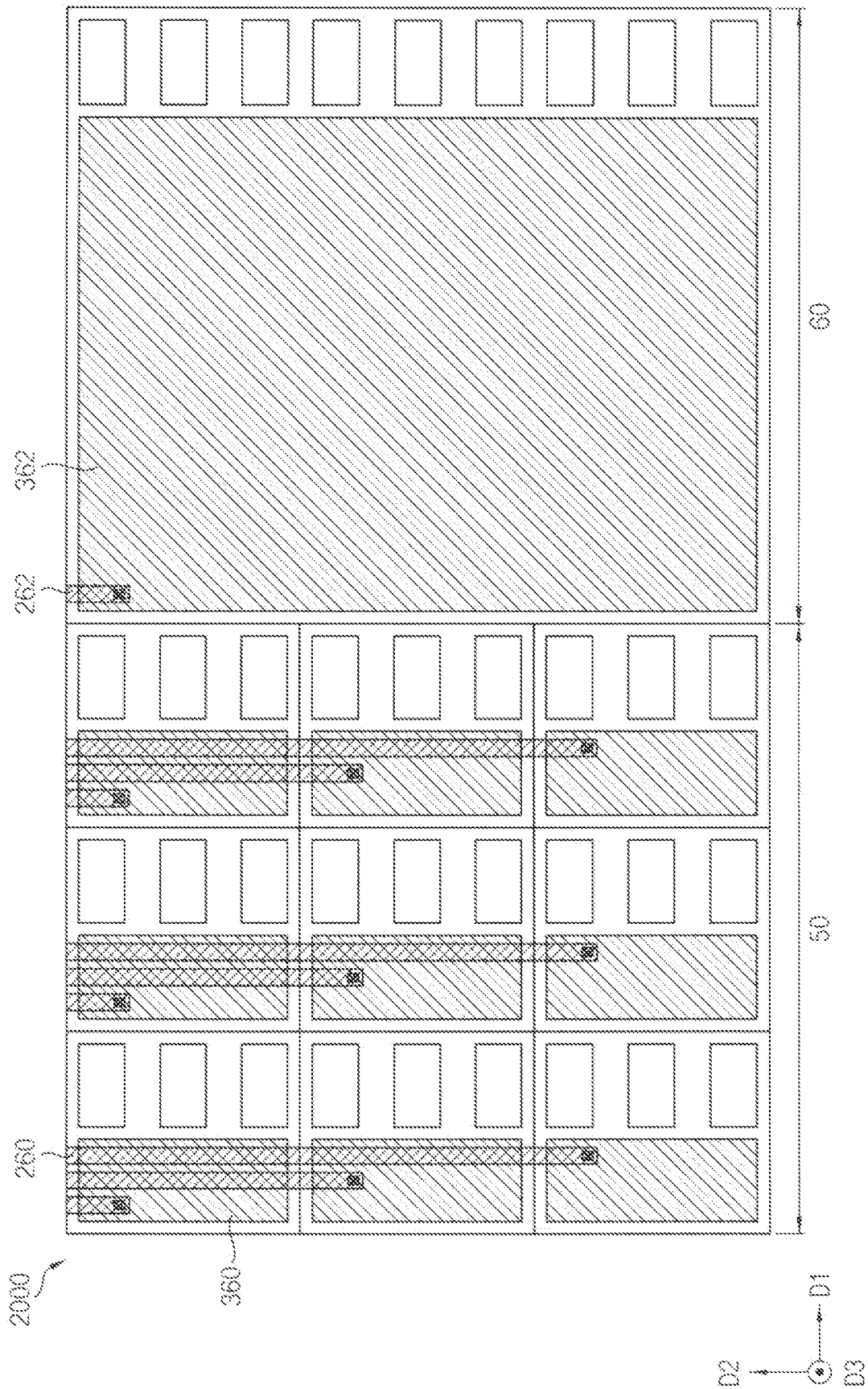
FIG. 36 is a planar view illustrating an OLED device in accordance with example embodiments.

FIG. 36 is a planar view illustrating an OLED device in accordance with example embodiments.

Referring to FIG. 36, an OLED device 2000 may include a first display region 50 and a second display region 60. The first display region 50 may be the same as pixel regions included in an OLED device 100 illustrated in FIG. 1. For example, a plurality of pixel regions including a touch sensor electrode 360 may be arranged in the first display region 50. A plurality of pixel regions including a touch sensor electrode 362 having a relatively large area may be arranged in the second display region 60. In example embodiments, the first and second display regions 50 and 60 included in the OLED device 2000 may be distinguished according to the number of sub-pixels or a size of a transparent region 30. For example, the number of sub-pixels in the first display region 50 may be greater than that of the second display region 60. An image of a high definition may be display in the first display region 50, and, thus, a transmissivity of the OLED device 2000 in the first display region 50 may be decreased. Meanwhile, a size of the transparent region 30 of the second display region 60 may be greater than that of the first display region 50. Thus, a size of the touch sensor electrode 362 may become large, and a sensitivity of the touch sensor electrode 362 may be increased in the second display region 60.

The present invention may be applied to various display devices including an organic light emitting display device. For example, the present invention may be applied to vehicle-display device, a ship-display device, an aircraft-display device, portable communication devices, display devices for display or for information transfer, a medical-display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. There-fore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A flexible organic light-emitting diode ("OLED") display comprising:
a flexible substrate;
a buffer layer disposed on the flexible substrate;
a plurality of thin film transistors disposed on the flexible substrate, each of the plurality of thin film transistors comprising an active layer, a gate electrode, a source electrode, and a drain electrode;
a plurality of pixels including a plurality of light emitting layers, a plurality of lower electrodes, and an upper electrode disposed on the flexible substrate, the plurality of light emitting layers being disposed between the plurality of lower electrodes and the upper electrode;
an encapsulation substrate disposed on the plurality of pixels;
a pixel defining layer disposed on the flexible substrate, the pixel defining layer having a plurality of openings defined therein for exposing at least part of the plurality lower electrodes; and
a touch sensor including a plurality of touch sensor electrodes, a plurality of touch sensor wirings, and a plurality of connection wirings disposed on the flexible substrate, each of the plurality of connection wirings connecting adjacent touch sensor electrodes among the plurality of touch sensor electrodes,
wherein the flexible substrate comprises:
a first polyimide layer;
a barrier layer disposed on the first polyimide layer; and
a second polyimide layer disposed on the barrier layer,
wherein the source electrode, the drain electrode, and the plurality of touch sensor wirings include same materials,
wherein the source electrode, the drain electrode, and the plurality of connection wirings include same materials,
wherein the plurality of connection wirings are disposed on the pixel defining layer to overlap the pixel defining layer in a plan view,
wherein the encapsulation substrate includes at least one inorganic layer and at least one organic layer,
wherein each of the plurality of touch sensor electrodes is disposed across at least nine pixel areas,
wherein a thickness of the plurality of touch sensor wirings is less than a thickness of the source and drain electrodes, and
wherein the plurality of touch sensor wirings, the source electrode, the drain electrode, and the plurality of connection wirings include aluminum and titanium.

2. The flexible OLED display of claim 1, wherein the plurality of touch sensor wirings electrically connect the plurality of touch sensor electrodes and an external device, and transfer a changed capacitance of the touch sensor electrode to the external device or provide a sensing voltage generated from the touch sensor electrode to the external device, and
wherein the external device senses a change in capacitance which is generated in the touch sensor electrodes.

3. A flexible organic light-emitting diode ("OLED") display comprising:
a flexible substrate;
a buffer layer disposed on the flexible substrate;

a plurality of thin film transistors disposed on the flexible substrate, each of the plurality of thin film transistors comprising an active layer, a gate electrode, a source electrode, and a drain electrode;

a plurality of pixels including a plurality of light emitting layers, a plurality of lower electrodes, and an upper electrode disposed on the flexible substrate, the plurality of light emitting layers being disposed between the plurality of lower electrodes and the upper electrode;

an encapsulation substrate disposed on the plurality of pixels;

a pixel defining layer disposed on the flexible substrate, the pixel defining layer having a plurality of openings defined therein for exposing at least part of the plurality lower electrodes;

a touch sensor including a plurality of touch sensor electrodes, a plurality of touch sensor wirings, and a plurality of connection wirings disposed on the flexible substrate, each of the plurality of connection wirings connecting adjacent touch sensor electrodes among the plurality of touch sensor electrodes; and a light blocking member disposed on the pixel defining layer, wherein the flexible substrate comprises:
a first polyimide layer;
a barrier layer disposed on the first polyimide layer; and
a second polyimide layer disposed on the barrier layer, wherein the source electrode, the drain electrode, and the plurality of touch sensor wirings include same materials, wherein the source electrode, the drain electrode, and the plurality of connection wirings include same materials, wherein the plurality of connection wirings are disposed on the pixel defining layer to overlap the pixel defining layer in a plan view, wherein the encapsulation substrate includes at least one inorganic layer and at least one organic layer, wherein each of the plurality of touch sensor electrodes is disposed across at least nine pixel areas, wherein the light blocking member has an opaque color, wherein the pixel defining layer is opaque, and wherein the pixel defining layer includes light blocking materials.

4. The flexible OLED display of claim 3, wherein the light blocking member overlaps the plurality of touch sensor wirings.

5. The flexible OLED display of claim 3, wherein the light blocking member includes light blocking materials, and
wherein the light blocking materials include carbon black, titanium nitride oxide, titanium black, phenylene black, aniline black, cyanine black, or nigrosine acid black.

6. The flexible OLED display of claim 5, wherein the light blocking member further includes epoxy resin, acryl resin, siloxane resin, polymer resin, or polyimide resin.

7. The flexible OLED display of claim 3, wherein the plurality of touch sensor wirings electrically connect the plurality of touch sensor electrodes and an external device, and transfer a changed capacitance of the touch sensor electrode to the external device or provide a sensing voltage generated from the touch sensor electrode to the external device, and
wherein the external device senses a change in capacitance which is generated in the touch sensor electrodes.

8. A flexible organic light-emitting diode ("OLED") display comprising:
a flexible substrate;
a buffer layer disposed on the flexible substrate;
a plurality of thin film transistors disposed on the flexible substrate, each of the plurality of thin film transistors comprising an active layer, a gate electrode, a source electrode, and a drain electrode;

a plurality of pixels including a plurality of light emitting layers, a plurality of lower electrodes, and an upper electrode disposed on the flexible substrate, the plurality of light emitting layers being disposed between the plurality of lower electrodes and the upper electrode;

an encapsulation substrate disposed on the plurality of pixels;

a pixel defining layer disposed on the flexible substrate, the pixel defining layer having a plurality of openings defined therein for exposing at least part of the plurality lower electrodes;

a touch sensor including a plurality of touch sensor electrodes, a plurality of touch sensor wirings, and a plurality of connection wirings disposed on the flexible substrate, each of the plurality of connection wirings connecting adjacent touch sensor electrodes among the plurality of touch sensor electrodes; and a light blocking member disposed on the pixel defining layer, wherein the flexible substrate comprises:
a first polyimide layer;
a barrier layer disposed on the first polyimide layer; and
a second polyimide layer disposed on the barrier layer, wherein the source electrode, the drain electrode, and the plurality of touch sensor wirings include same materials, wherein the source electrode, the drain electrode, and the plurality of connection wirings include same materials, wherein the plurality of connection wirings are disposed on the pixel defining layer to overlap the pixel defining layer in a plan view, wherein the encapsulation substrate includes at least one inorganic layer and at least one organic layer, wherein each of the plurality of touch sensor electrodes is disposed across at least nine pixel areas, wherein a thickness of the plurality of touch sensor wiring is less than a thickness of the source and drain electrodes, wherein the plurality of touch sensor wirings, the source electrode, the drain electrode, and the plurality of connection wirings include aluminum and titanium, wherein the light blocking member has an opaque color, wherein the pixel defining layer is opaque, and wherein the pixel defining layer includes light blocking materials.

9. The flexible OLED display of claim 8, wherein the light blocking member overlaps the plurality of touch sensor wirings.

10. The flexible OLED display of claim 8, wherein the light blocking member includes light blocking materials, and
wherein The light blocking materials include carbon black, titanium nitride oxide, titanium black, phenylene black, aniline black, cyanine black or nigrosine acid black.

11. The flexible OLED display of claim 10, wherein the light blocking member further includes epoxy resin, acryl resin, siloxane resin, polymer resin, or polyimide resin.

12. The flexible OLED display of claim 8, wherein the plurality of touch sensor wirings electrically connect the plurality of touch sensor electrodes and an external device, and transfer a changed capacitance of the touch sensor electrode to the external device or provide a sensing voltage generated from the touch sensor electrode to the external device, and wherein the external device senses a change in capacitance which is generated in the touch sensor electrodes.

13. A flexible organic light-emitting diode ("OLED") display comprising:
a flexible substrate including a first display region having a first light transmittance and a second display region disposed adjacent to the first display region and having a second light transmittance in a plan view;
a buffer layer disposed on the flexible substrate;
a plurality of thin film transistors disposed on the flexible substrate, each of the plurality of thin film transistors comprising an active layer, a gate electrode, a source electrode, and a drain electrode;
a plurality of pixels including a plurality of light emitting layers, a plurality of lower electrodes, and an upper electrode being disposed on the flexible substrate, the plurality of light emitting layers disposed between the plurality of lower electrodes and the upper electrode;
an encapsulation substrate disposed on the plurality of pixels;
a pixel defining layer disposed on the flexible substrate, the pixel defining layer partially exposing the plurality of lower electrodes;
a light blocking member disposed on the pixel defining layer; and
a touch sensor including a plurality of touch sensor electrodes, a plurality of touch sensor wirings, and a plurality of connection wirings disposed on the flexible substrate,
wherein the source electrode, the drain electrode, and touch sensor wiring include same materials,
wherein the source electrode, the drain electrode, and the plurality of connection wirings include same materials,
wherein the plurality of connection wirings are disposed on the pixel defining layer to overlap the pixel defining layer in a plan view,
wherein the encapsulation substrate includes at least one inorganic layer and at least one organic layer,
wherein the plurality of pixels include first pixels in the first display region and second pixels in the second display region,
wherein each of the first display region and the second display region includes a light emitting area in which the image is displayed and a light transmission area in which light is transmitted therethrough,
wherein a number of the second pixels in the light emitting area in the second display region are less than a number of the first pixels in the light emitting area in the first display region,
wherein the first light transmittance in the light transmission area of the first display region is less than the second light transmittance in the light transmission area of the second display region,
wherein the flexible substrate comprises:
a first polyimide layer;
a barrier layer disposed on the first polyimide layer; and
a second polyimide layer disposed on the barrier layer,
wherein a thickness of the plurality of touch sensor wiring is less than a thickness of the source and drain electrodes,
wherein the plurality of touch sensor wirings, the source electrode, the drain electrode, and the plurality of connection wirings include aluminum and titanium,
wherein the light blocking member has an opaque color,
wherein the pixel defining layer is opaque, and
wherein the pixel defining layer includes light blocking materials.

14. The flexible OLED display of claim 13, wherein the light blocking member overlaps the plurality of touch sensor wirings.

15. The flexible OLED display of claim 13, wherein the light blocking member includes light blocking materials, and
wherein the light blocking materials include carbon black, titanium nitride oxide, titanium black, phenylene black, aniline black, cyanine black or nigrosine acid black.

16. The flexible OLED display of claim 15, wherein the light blocking member further includes epoxy resin, acryl resin, siloxane resin, polymer resin, or polyimide resin.

17. The flexible OLED display of claim 13, wherein the light blocking member overlaps the touch sensor electrodes in a plan view.

18. The flexible OLED display of claim 17, wherein the light blocking member includes light blocking materials, and
wherein the light blocking materials include carbon black, titanium nitride oxide, titanium black, phenylene black, aniline black, cyanine black or nigrosine acid black.

19. The flexible OLED display of claim 18, wherein the light blocking member further includes epoxy resin, acryl resin, siloxane resin, polymer resin, or polyimide resin.

20. The flexible OLED display of claim 13, wherein the plurality of touch sensor wirings electrically connect the plurality of touch sensor electrodes and an external device, and transfer a changed capacitance of the touch sensor electrode to the external device or provide a sensing voltage generated from the touch sensor electrode to the external device, and
wherein the external device senses a change in capacitance which is generated in the touch sensor electrodes.

21. An organic light-emitting diode ("OLED") display comprising:
a substrate;
a plurality of thin film transistors disposed on the substrate, each of the plurality of thin film transistors comprising an active layer, a gate electrode, a source electrode, and a drain electrode;
a plurality of pixels including a plurality of light emitting layers, a plurality of lower electrodes, and an upper electrode disposed on the substrate, the plurality of light emitting layers being disposed between the plurality of lower electrodes and the upper electrode;
an encapsulation substrate disposed on the plurality of pixels;
a pixel defining layer disposed on the substrate, the pixel defining layer having a plurality of openings defined therein for exposing at least part of the plurality lower electrodes; and
a touch sensor including a plurality of touch sensor electrodes, a plurality of touch sensor wirings, and a plurality of connection wirings disposed on the substrate, each of the plurality of connection wirings connecting adjacent touch sensor electrodes among the plurality of touch sensor electrodes,
wherein the source electrode, the drain electrode, and the plurality of touch sensor wirings include same materials,
wherein the source electrode, the drain electrode, and the plurality of connection wirings include same materials, wherein the plurality of connection wirings are disposed on the pixel defining layer to overlap the pixel defining layer in a plan view, wherein the encapsulation substrate includes at least one inorganic layer and at least one organic layer, wherein each of the plurality of touch sensor electrodes is disposed across at least nine pixel areas, wherein a thickness of the plurality of touch sensor wiring is less than a thickness of the source and drain electrodes, and wherein the plurality of touch sensor wirings, the source electrode, the drain electrode, and the plurality of connection wirings include aluminum and titanium.

22. The OLED display of claim 21, wherein the plurality of touch sensor wirings electrically connect the plurality of touch sensor electrodes and an external device, and transfer a changed capacitance of the touch sensor electrode to the external device or provide a sensing voltage generated from the touch sensor electrode to the external device, and wherein the external device senses a change in capacitance which is generated in the touch sensor electrodes.

23. The OLED display of 21, further comprising:
a light blocking member disposed on the pixel defining layer.

24. The OLED display of claim 23, wherein the light blocking member includes light blocking materials, and wherein the light blocking materials include carbon black, titanium nitride oxide, titanium black, phenylene black, aniline black, cyanine black, or nigrosine acid black.

25. The OLED display of claim 24, wherein the light blocking member further includes epoxy resin, acryl resin, siloxane resin, polymer resin, or polyimide resin.

26. The OLED display of claim 23, wherein the light blocking member overlaps the touch sensor electrodes in a plan view.

27. The OLED display of claim 23, wherein the pixel defining layer is opaque, and wherein the pixel defining layer includes light blocking materials.

28. The OLED display of claim 27, wherein the light blocking materials include carbon black, titanium nitride oxide, titanium black, phenylene black, aniline black, cyanine black, or nigrosine acid black.

29. The OLED display of claim 28, wherein the light blocking member further includes epoxy resin, acryl resin, siloxane resin, polymer resin, or polyimide resin.

30. The OLED display of claim 21, wherein the pixel area comprises at least three sub-pixels areas.

* * * * *